United States Patent
Hwang et al.

(10) Patent No.: US 11,296,088 B2
(45) Date of Patent: Apr. 5, 2022

(54) SEMICONDUCTOR DEVICE INCLUDING AIR GAPS AND METHOD FOR FABRICATING THE SAME

(71) Applicant: SK hynix Inc., Gyeonggi-do (KR)

(72) Inventors: Chang-Youn Hwang, Gyeonggi-do (KR); Noh-Jung Kwak, Gyeonggi-do (KR); Hong-Gu Yi, Gyeonggi-do (KR); Yun-Je Choi, Gyeonggi-do (KR); Se-Han Kwon, Gyeonggi-do (KR); Ki-Soo Choi, Gyeonggi-do (KR); Seung-Bum Kim, Gyeonggi-do (KR); Do-Hyung Kim, Gyeonggi-do (KR); Doo-Sung Jung, Gyeonggi-do (KR); Dae-Sik Park, Gyeonggi-do (KR)

(73) Assignee: SK hynix Inc., Gyeonggi-do (KR)

( * ) Notice: Subject to any disclaimer, the term of this patent is extended or adjusted under 35 U.S.C. 154(b) by 0 days.

(21) Appl. No.: 16/521,282

(22) Filed: Jul. 24, 2019

(65) Prior Publication Data
US 2019/0348418 A1    Nov. 14, 2019

Related U.S. Application Data

(63) Continuation of application No. 15/211,938, filed on Jul. 15, 2016, now Pat. No. 10,411,014, which is a
(Continued)

(30) Foreign Application Priority Data

Nov. 7, 2013    (KR) .................... 10-2013-0134664
May 28, 2014    (KR) .................... 10-2014-0064625

(51) Int. Cl.
*H01L 27/108*    (2006.01)
*H01L 21/768*    (2006.01)
(Continued)

(52) U.S. Cl.
CPC .. *H01L 27/10805* (2013.01); *H01L 21/32139* (2013.01); *H01L 21/764* (2013.01);
(Continued)

(58) Field of Classification Search
CPC ............ H01L 21/764; H01L 21/7682; H01L 27/10855; H01L 27/1085; H01L 27/10852;
(Continued)

(56) References Cited

U.S. PATENT DOCUMENTS

2014/0291804 A1* 10/2014 Kim ................. H01L 27/10814
257/532
2014/0327063 A1* 11/2014 Park ................. H01L 21/76897
257/296
(Continued)

FOREIGN PATENT DOCUMENTS

CN          103383935 A       11/2013
KR    10-2002-0051108         6/2002
(Continued)

OTHER PUBLICATIONS

Office Action issued by Korean Intellectual Property Office dated Jan. 28, 2020.
(Continued)

*Primary Examiner* — Aaron J Gray
(74) *Attorney, Agent, or Firm* — IP & T Group LLP

(57) ABSTRACT

Disclosed are a semiconductor device capable of reducing parasitic capacitance between adjacent conductive structures and a method for fabricating the same. The semiconductor device includes a plurality of bit line structures each comprising a first contact plug formed over a substrate and a bit line formed over the first contact plug. A spacer structure having air gaps is formed on sidewalls of the first contact plug and on sidewalls of the bit line. An plug isolation layer
(Continued)

is formed between the plurality of bit line structures. The isolation layer includes an opening. A second contact plug is formed in the opening and a memory element is formed over the second contact plug.

15 Claims, 33 Drawing Sheets

Related U.S. Application Data continuation of application No. 14/516,128, filed on Oct. 16, 2014, now Pat. No. 9,425,200.

(51) Int. Cl.
| | |
|---|---|
| *H01L 21/764* | (2006.01) |
| *H01L 21/3213* | (2006.01) |
| *H01L 27/24* | (2006.01) |
| *H01L 45/00* | (2006.01) |
| *H01L 23/522* | (2006.01) |
| *H01L 23/528* | (2006.01) |
| *H01L 23/535* | (2006.01) |

(52) U.S. Cl.
CPC .... *H01L 21/7682* (2013.01); *H01L 21/76831* (2013.01); *H01L 21/76832* (2013.01); *H01L 21/76897* (2013.01); *H01L 23/528* (2013.01); *H01L 23/5223* (2013.01); *H01L 23/5226* (2013.01); *H01L 23/535* (2013.01); *H01L 27/10814* (2013.01); *H01L 27/10823* (2013.01); *H01L 27/10855* (2013.01); *H01L 27/10876* (2013.01); *H01L 27/10888* (2013.01); *H01L 27/2436* (2013.01); *H01L 27/2463* (2013.01); *H01L 45/06* (2013.01); *H01L 45/16* (2013.01)

(58) Field of Classification Search
CPC ......... H01L 27/10814; H01L 27/10888; H01L 27/10823; H01L 27/10805
See application file for complete search history.

(56) References Cited

U.S. PATENT DOCUMENTS

| | | | | |
|---|---|---|---|---|
| 2015/0262625 A1* | 9/2015 | Han | ........ | H01L 27/105 257/773 |
| 2015/0340281 A1* | 11/2015 | Lee | ........ | H01L 21/76895 438/5 |
| 2016/0027727 A1* | 1/2016 | Kim | ........ | H01L 27/10876 257/774 |

FOREIGN PATENT DOCUMENTS

| | | |
|---|---|---|
| KR | 10-2011-0116357 | 10/2011 |
| KR | 10-2012-0078255 A | 7/2012 |
| KR | 10-2013-0022954 A | 3/2013 |
| KR | 10-2013-0123687 | 11/2013 |
| KR | 102168172 B1 * 10/2020 | ........ H01L 21/764 |

OTHER PUBLICATIONS

Office Action issued by the Korean Patent Office dated Aug. 18, 2020.
Office Action issued by the Korean Patent Office dated Jul. 30, 2020.
Notice of Allowance issued by the Korean Intellectual Property Office dated Apr. 7, 2021.

* cited by examiner

SEMICONDUCTOR DEVICE INCLUDING AIR GAPS AND METHOD FOR FABRICATING THE SAME

CROSS-REFERENCE TO RELATED APPLICATION(S)

This application is a continuation of U.S. patent application Ser. No. 15/211,938 filed on Jul. 15, 2016, which is a continuation application of U.S. patent application Ser. No. 14/516,128 filed on Oct. 16, 2014 and issued on Aug. 23, 2016 as U.S. Pat. No. 9,425,200, which claims priority of Korean Patent Application No. 10-2013-0134664 filed on Nov. 7, 2013 and Korean Patent Application No. 10-2014-0064625 filed on May 28, 2014. The disclosure of each of the foregoing applications is herein incorporated by reference in its entirety.

BACKGROUND

1. Field

Exemplary embodiments of the present invention relate to a semiconductor device, and, more particularly, to a semiconductor device including air gaps and a method of fabricating the same.

2. Description of the Related Art

In general, a semiconductor device includes dielectric materials formed between adjacent conductive structures. As the degree of integration of semiconductor devices is increased, the distance between conductive structures becomes closer. For this reason, parasitic capacitance is increased. An increase in parasitic capacitance may deteriorate the performance of the semiconductor device.

In order to reduce parasitic capacitance, a method for lowering the dielectric constant of dielectric materials may be used. However, even with this method, reduction of parasitic capacitance is limited because the dielectric materials may still have too high of a high dielectric constant.

SUMMARY

Various embodiments are directed to a semiconductor device capable of reducing parasitic capacitance between adjacent conductive structures and a method for fabricating the same.

In an embodiment, a method of fabricating a semiconductor device may include forming, over a substrate, a bit line structure including a first contact plug and a bit line formed over the first contact plug; forming a multi-layer spacer including first spacers, sacrificial spacers, and second spacers on sidewalls of the bit line structure; forming, over the multi-layer spacer, a plug isolation layer defining a contact hole through which sidewalls of the first contact plug and the bit line are exposed; forming a second contact plug including forming a first plug adjacent to the first contact plug, forming a second plug formed over the first plug and adjacent to the bit line, and forming, in the contact hole, a third spacer contacting a corresponding second spacer, of the second spacers, and surrounding sidewalls of the second plug; partially removing the multi-layer spacer to expose the sacrificial spacers; and forming air gaps extending from between the first contact plug and the first plug to between the bit line and the second plug by removing the sacrificial spacers.

In an embodiment, a method of fabricating the semiconductor device may include forming an interlayer dielectric layer having a first opening over a substrate; forming a preliminary first plug filling the first opening; forming a bit line over the preliminary first plug; forming a first plug and gaps formed at both sidewalls of the first plug by etching the preliminary first plug; forming a multi-layer spacer, including a first spacer, a sacrificial spacer, and a second spacer, on both sidewalls of the bit line and the gap; forming a second plug adjacent to the first plug and the bit line with the multi-layer spacer interposed between the second plug and the first plug and the bit line; forming air gaps, including plug-type air gaps formed on both sidewalls of the first plug and line-type air gaps formed on both sidewalls of the bit line, by removing the sacrificial spacer; and forming a capping spacer that caps the upper part of the air gap.

In an embodiment, a semiconductor device may include a plurality of bit line structures each including a first contact plug formed over a substrate and a bit line formed over the first contact plug; a spacer structure having air gaps formed on sidewalls of the first contact plug and on sidewalls of the bit line; a plug isolation layer formed between the plurality of bit line structures, the plug isolation layer including an opening; a second contact plug formed in the opening; and a memory element formed over the second contact plug. The spacer structure may include a first spacer structure formed between the first contact plug and the second contact plug; and a second spacer structure formed between the bit line and the second contact plug. The first spacer structure may include first spacers formed on both sidewalls of the first contact plug, and the air gaps are formed between the first spacers and the second contact plug. The second spacer structure may include first spacers formed on both sidewalls of the bit line and second spacers formed on sidewalls of the first spacers, and the air gaps are formed between the first nitride spacers and the second nitride spacers. A first spacer on one sidewall of the bit line has a different height than a first spacer on another sidewall of the bit line, and a second spacer on the one sidewall of the bit line has a different height than a second spacer on the another sidewall of the bit line. The first spacer and the second spacer on the one sidewall of the bit line define an opening of a first air gap of the air gaps, and the first spacer and the second spacer on the another sidewall of the bit line cap a second air gap of the air gaps. The semiconductor device may further include a third nitride spacer contacting a corresponding second spacer, of the second spacers, and surrounding the second contact plug. The air gap extends in parallel to the sidewalls of the bit line. The second contact plug may include silicon plug adjacent to the first contact plug; a first metal plug adjacent to the bit line and formed over the silicon plug; and an ohmic contact layer formed between the silicon plug and the first metal plug. The semiconductor device may further include a third contact plug between the second contact plug and the memory element, wherein the third contact plug overlaps the second contact plug, the air gap, and the bit line structure.

In an embodiment, a semiconductor device may include a substrate including a recessed first surface and a recessed second surface; an interlayer dielectric layer including a first opening through which the first surface is exposed; a first plug formed in the first opening and isolated by a pair of gaps from sidewalls of the first opening; a bit line configured to cover the first plug and extended in any one direction over the interlayer dielectric layer; a second plug configured to include an upper part adjacent to the first plug and an upper part adjacent to the bit line and coupled to the second surface; and an air gap including a plug-type air gap between the first plug and the lower part of the second plug and a line-type air gap between the bit line and the upper part of the second plug. The line-type air gap extends parallel to the bit line, and the plug-type air gap is separated by the first plug and formed in the first opening. The semiconductor device may further include a plug isolation layer extended in a direction that intersects the bit line and configured to provide a second opening through which the second surface is exposed adjacent to the bit line and the first plug, wherein the second plug is formed in the second opening. The semiconductor device may further include a first spacer formed between the bit line and the second plug and extended and formed on both sidewalls of the first plug; and a second spacer formed between the second plug and the first spacer and extended and formed on both sidewalls of the first plug, wherein the line-type air gap and the plug-type air gap are formed between the first spacer and the second spacer. A capping spacer is formed over the line-type air gap, and a lower part of the plug-type air gap is sealed by the first spacer and the second spacer. The first spacer, the second spacer, and a capping spacer may include silicon nitride. The semiconductor device may further include a third plug over the second plug; and an ohmic contact layer between the second plug and the third plug. The third plug may further include an extension part overlapped with an upper part of the bit line. The semiconductor device may further include a memory element formed over the third plug. The semiconductor device may further include a buried word line buried in the substrate and extended in a direction that intersects the bit line.

DETAILED DESCRIPTION

Figure 1A:
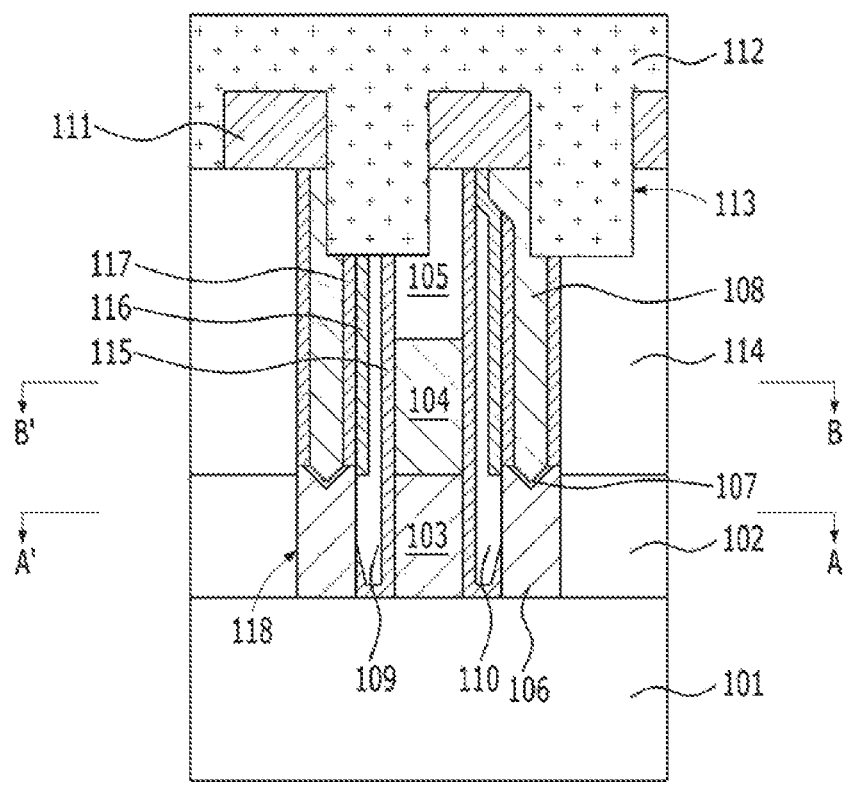
FIG. 1A is a cross-sectional view of a semiconductor device in accordance with a first embodiment of the present invention.

Various embodiments will be described below in more detail with reference to the accompanying drawings. The present invention may, however, be embodied in different forms and should not be construed as limited to the embodiments set forth herein. Rather, these embodiments are provided so that this disclosure will be thorough and complete, and will fully convey the scope of the present invention to those skilled in the art.

Throughout the disclosure, reference numerals correspond directly to the like numbered parts in the various figures and embodiments of the present invention.

The drawings may not necessarily be to scale and, in some instances, proportions may have been exaggerated in order to clearly illustrate features of the embodiments.

It should be readily understood that the meaning of "on" and "over" in the present disclosure should be interpreted in the broadest manner such that "on" means not only "directly on" but also "on" something with an intermediate feature(s) or a layer(s) therebetween, and that "over" means not only directly on top but also on top of something with an intermediate feature(s) or a layer(s) therebetween.

It is also noted that in this specification, "connected/coupled" refers to one component not only directly coupling another component but also indirectly coupling another component through an intermediate component. In addition, a singular form may include a plural form as long as it is not specifically mentioned.

Figure 1B:
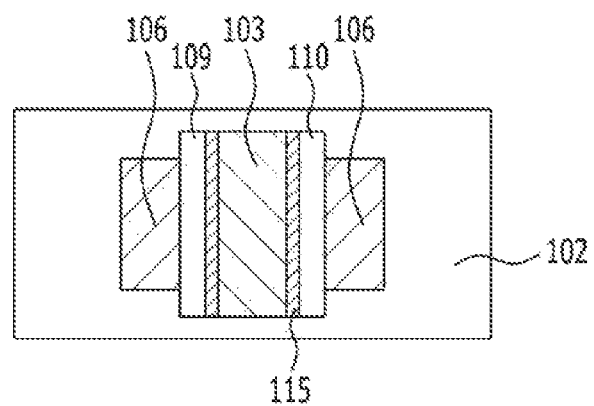
FIG. 1B is a plan view of line A-A' of FIG. 1A illustrating a dielectric structure in accordance with the embodiment of the present invention.
Figure 1C:
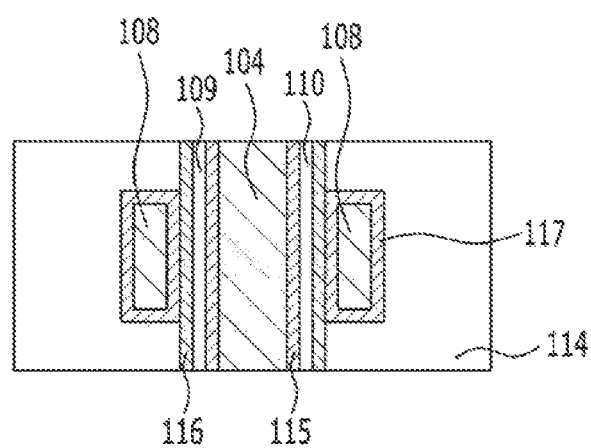
FIG. 1C is a plan view of line B-B' of FIG. 1A illustrating a dielectric structure in accordance with the embodiment of the present invention.

FIG. 1A is a cross-sectional view of a semiconductor device in accordance with a first embodiment of the present invention, FIG. 1B is a plan view of line A-A' of FIG. 1A, and FIG. 1C is a plan view of line B-B' of FIG. 1A.

Referring to FIG. 1A, a plurality of conductive structures may be formed over a substrate 101. The conductive structures include a first conductive structure and a second conductive structure. The first conductive structure includes a first conductive pattern 103, a second conductive pattern 104, and a hard mask pattern 105. The second conductive structure includes a third conductive pattern 106, a fourth conductive pattern 107, and a fifth conductive pattern 108. A dielectric structure having air gaps 109 and 110 may be formed between the first conductive structure and the second conductive structure. The dielectric structure includes a first spacer 115, a second spacer 116, and a third spacer 117. The air gaps 109 and 110 may be formed between the first spacer 115 and the second spacer 116. The second conductive structure may be formed within a dielectric layer that includes a first dielectric layer 102 and a second dielectric layer 114. The second conductive structure may be formed within the opening 118 of the dielectric layer. The air gap 109 is capped with the capping structure 112. Furthermore, the air gap 110 is capped with the second spacer 116. The capping structure 112 fills recess parts 113 and also covers a sixth conductive pattern 111.

Referring to FIG. 1B, a dielectric structure, including the first spacer 115 and the air gaps 109 and 110, may be formed between the first conductive pattern 103 and the third conductive pattern 106.

Referring to FIG. 1C, a dielectric structure, including the first spacer 115, the second spacer 116, the air gaps 109 and 110, and the third spacer 117, may be formed between the second conductive pattern 104 and the fifth conductive pattern 108. The third spacer 117 may surround the sidewalls of the fifth conductive pattern 108.

This is described in detail below with reference to FIG. 1A.

The substrate 101 may include a silicon substrate, a silicon germanium (SiGe) substrate, or a silicon on insulator (SOI) substrate.

In the first conductive structure, the first conductive pattern 103 may include a silicon-containing material or a metal-containing material. For example, the first conductive pattern 103 may include polysilicon. The second conductive pattern 104 may include tungsten.

In the second conductive structure, the third conductive pattern 106 may have the same height as the first conductive pattern 103 or may have a greater height than the first conductive pattern 103. The third conductive pattern 106 may include a silicon-containing material, such as polysilicon. The fifth conductive pattern 108 includes metal-containing materials. The fifth conductive pattern 108 may include tungsten. The fourth conductive pattern 107 may include a silicide. The fourth conductive pattern 107 may include a metal silicide. For example, the fourth conductive pattern 107 may include: titanium silicide, cobalt silicide, nickel silicide, or tungsten silicide. In the present embodiment, the fourth conductive pattern 107 may include a cobalt silicide. The cobalt silicide may include a cobalt silicide having a $CoSi_2$ phase.

The sixth conductive pattern 111 may include a metal-containing material, for example, tungsten. The sixth conductive pattern 111 overlaps with part of the fifth conductive pattern 108 and part of the hard mask pattern 105. The recess parts 113 may be self-aligned with the sixth conductive pattern 111.

The air gaps 109 and 110 may be formed in parallel on both sidewalls of the first conductive structure. That is, each of the air gaps 109 and 110 is a line-type air gap. The air gaps 109 and 110 may be formed on both sidewalls of the first conductive pattern 103 and vertically extended up to both sidewalls of the second conductive pattern 104. A spacer is not present on sidewalls of part of the air gaps 109 and 110 and the third conductive pattern 106. In other embodiments, the air gaps 109 and 110 may be formed on both sidewalls of the first conductive pattern 103 and may surround the sidewall of the second conductive pattern 104.

The air gaps 109 and 110 may have asymmetrical structures having different heights due to the sixth conductive pattern 111 and the recess parts 113.

The first conductive structure may become a bit line structure including a first contact plug. The first conductive pattern 103 may become the first contact plug for connecting a transistor and a bit line, and the second conductive pattern 104 may become the bit line. The second conductive structure may become a second contact plug for connecting the transistor and a memory element. For example, the third conductive pattern 106 may become a first plug, the fifth conductive pattern 108 may become a second plug, and the sixth conductive pattern 111 may become a third plug. The first plug may include a silicon plug, and the second plug and the third plug may include a metal plug. The fourth conductive pattern 107 becomes an ohmic contact layer between the first plug and the second plug.

The first spacer 115, the second spacer 116, and the third spacer 117 may include a nitride. The nitride may include silicon nitride. Accordingly, a spacer structure including a nitride spacer/air spacer may be formed between the first conductive pattern 103 and the third conductive pattern 106. A spacer structure, including a first-nitride-spacer/air/second-nitride-spacer/third-nitride-spacer may be formed between the second conductive pattern 104 and the third conductive pattern 108.

Although not illustrated, another conductive structure may be formed over the sixth conductive pattern 111. The another conductive structure may become a memory element electrically connected to the sixth conductive pattern 111. The memory element may include a capacitor that includes a storage node, a dielectric layer, and a plate node. The another conductive structure may include the storage node. The memory element may be embodied in various forms. For example, the memory element may include a variable resistance material. A first electrode, the variable resistance materials, and a second electrode may be sequentially stacked over the memory element, and the first electrode may be electrically connected to the sixth conductive pattern 111. The memory element may store information using a change of resistance of the variable resistance material in response to voltage applied to the first electrode and the second electrode. The variable resistance material may include a phase change material or a magnetic tunnel junction.

Although not illustrated, a transistor that includes a gate electrode, a source region, and a drain region may be formed. The first conductive pattern 103 and the third conductive pattern 106 may be connected to the source region or the drain region of the transistor. The transistor may include a planar gate type transistor, a trench gate type transistor, a buried gate type transistor, a recess gate type transistor, or a vertical channel transistor. The trench gate type transistor, the buried gate type transistor, or the recess gate type transistor has a structure in which part of the gate electrode is extended or buried within the substrate 101.

FIGS. 2A to 2M illustrate an exemplary method of forming a semiconductor device in accordance with the first embodiment of the present invention.

Figure 2A:
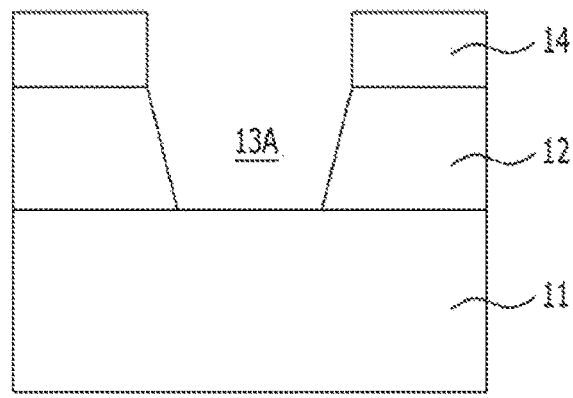
FIGS. 2A to 2M illustrate an exemplary method of forming a semiconductor device in accordance with the first embodiment of the present invention.

As illustrated in FIG. 2A, a first dielectric layer 12 may be formed over a substrate 11. The substrate includes a semiconductor substrate. The substrate 11 may include a silicon substrate, a SiGe substrate, or a silicon on insulator (SOI) substrate. The first dielectric layer 12 may include silicon oxide, silicon nitride, or a stacked structure of silicon oxide and silicon nitride.

A first opening 13A may be formed in the first dielectric layer 12. The first opening 13A may be formed by etching the first dielectric layer 12 using a first mask pattern 14. The first mask pattern 14 may include a photoresist film pattern or a hard mask pattern patterned by the photoresist film pattern. A surface of the substrate 11 may be exposed through the first opening 13A. The first opening 13A has a diameter D controlled to a specific line width.

Figure 2B:
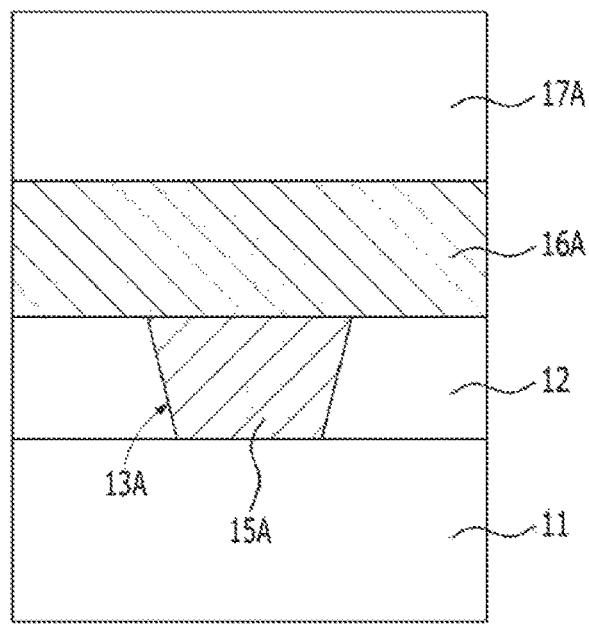

As Illustrated in FIG. 2B, the first mask pattern 14 is removed.

A pre-first conductive pattern 15A may be formed in the first opening 13A. The pre-first conductive pattern 15A may be formed by the etching of a first conductive layer (not illustrated). The pre-first conductive pattern 15A may be formed by, for example, performing chemical mechanical polishing (CMP) on the first conductive layer. The pre-first conductive pattern 15A may be filled in the first opening 13A. The pre-first conductive pattern 15A may include a silicon-containing layer or a metal-containing layer. The pre-first conductive pattern 15A may include a polysilicon layer.

A second conductive layer 16A may be formed over the pre-first conductive pattern 15A. The second conductive layer 16A may include a metal-containing layer. The second conductive layer 16A may include a metal, a metal nitride, a metal silicide, or a combination of them. The second conductive layer 16A may include a tungsten-containing layer. The second conductive layer 16A may include a tungsten layer. A barrier layer may be formed between the pre-first conductive pattern 15A and the second conductive layer 16A. Accordingly, the pre-first conductive pattern 15B and the second conductive layer 16A may include a stack structure of a polysilicon layer, a titanium-containing layer, and a tungsten layer. The titanium-containing layer is a barrier layer, and the titanium-containing layer may have a stack of a titanium (Ti) layer and a titanium nitride (TiN) layer.

A hard mask layer 17A may be formed over the second conductive layer 16A. The hard mask layer 17A may include silicon oxide or silicon nitride.

Figure 2C:
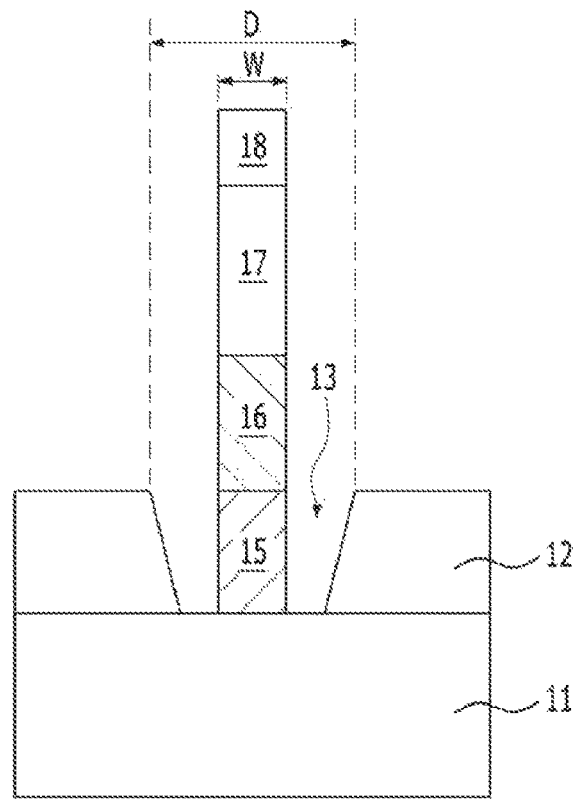

As illustrated in FIG. 2C, a second mask pattern 18 may be formed. The second mask pattern 18 may be a line-type pattern. The second mask pattern 18 may include a photoresist film pattern or a hard mask pattern patterned by the photoresist film pattern.

The second mask pattern 18 has a specific line width W. The line width of the second mask pattern 18 has a width smaller than the diameter D of the first opening 13A.

A first conductive structure may be formed. The hard mask layer 17A, the second conductive layer 16A, and the pre-first conductive pattern 15A may be sequentially etched using the second mask pattern 18. As a result, the first conductive structure, which includes a first conductive pattern 15, a second conductive pattern 16, and a hard mask pattern 17, may be formed. The first conductive pattern 15 may be formed within the first opening 13A. The second conductive pattern 16 and the hard mask pattern 17 may be line-type patterns. The first conductive pattern 15 has a plug-type. Part of the first opening 13A is exposed on the periphery of the first conductive pattern 15. This is called a side opening 13. The reason why the side opening 13 is formed is that the line width of the second mask pattern 18 is smaller than the diameter of the first opening 13A.

Figure 2D:
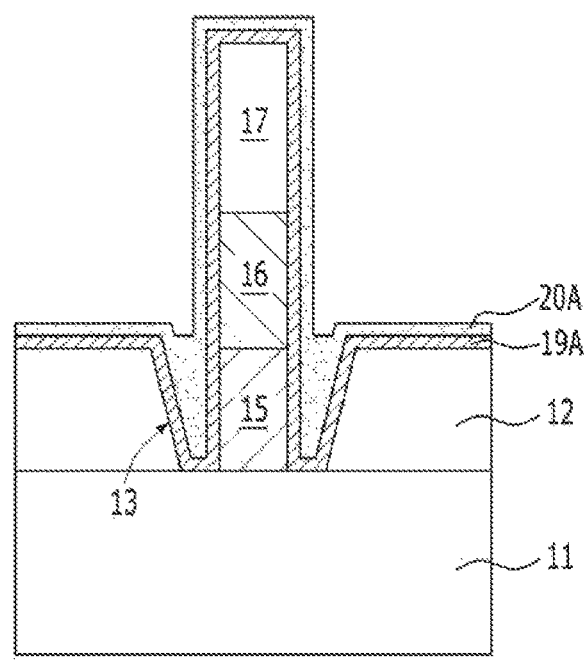

As illustrated in FIG. 2D, the second mask pattern 18 is removed. A first spacer layer 19A may be formed on the entire surface including the first conductive structure. The first spacer layer 19A may include dielectric materials. The first spacer layer 19A may include silicon oxide or silicon nitride. In the following embodiment, the first spacer layer 19A includes silicon nitride. The first spacer layer 19A may be formed on the side opening 13 and the first dielectric layer 12 in conformity with the side opening 13 and the first dielectric layer 12 without filling the side opening 13.

A sacrificial spacer layer 20A may be formed on the first spacer layer 19A. The sacrificial spacer layer 20A includes dielectric materials. The sacrificial spacer layer 20A includes materials having an etch selectivity to the first spacer layer 19A. The sacrificial spacer layer 20A may include silicon oxide or silicon nitride. In the following embodiment, the sacrificial spacer layer 20A includes silicon oxide. The sacrificial spacer layer 20A fills the side opening 13 on the first spacer layer 19A.

Figure 2E:
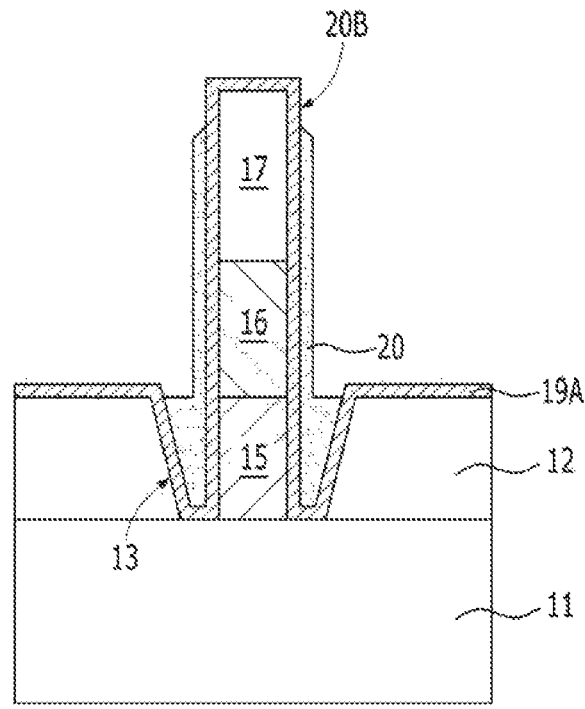

As illustrated in FIG. 2E, a sacrificial spacer 20 may be formed. The sacrificial spacer 20 may be formed by etching the sacrificial spacer layer 20A. The sacrificial spacer layer 20A may be etched by an etch-back process, for example. As a result, the sacrificial spacer 20 may be formed on the sidewalls of the first conductive structure with the first spacer layer 19A interposed between the sacrificial spacer 20 and the first conductive structure. The top height of the sacrificial spacer 20 is controlled so that it is lower than a top surface of the first conductive structure (refer to 20B). The sacrificial spacer layer 20A may be removed from a surface of the first dielectric layer 12.

Figure 2F:
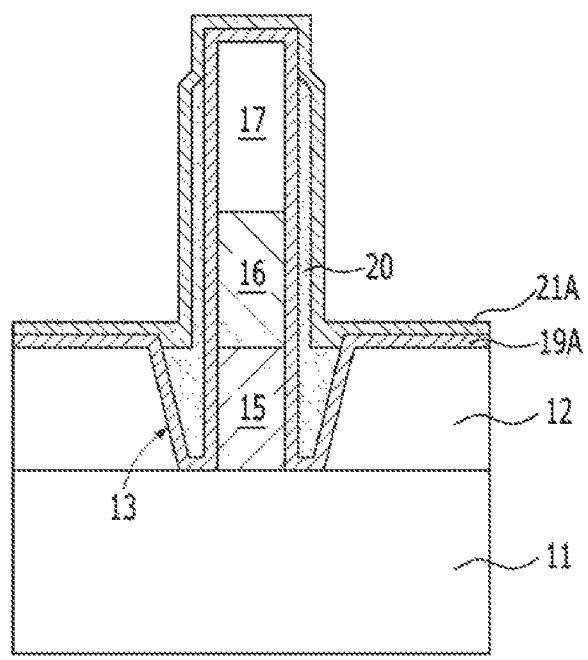

As illustrated in FIG. 2F, a second spacer layer 21A may be formed on the sacrificial spacer 20. The second spacer layer 21A may be formed on the entire surface including the sacrificial spacer 20. The second spacer layer 21A may include a dielectric material, such as silicon oxide or silicon nitride. In the following embodiment, the second spacer layer 21A may include silicon nitride. The sacrificial spacer 20 may be sealed from the outside by the second spacer layer 21A. That is, a multi-layered spacer, in which the sacrificial spacer 20 is formed between the first spacer layer 19A and the second spacer layer 21A, may be formed. The first spacer layer 19A and the second spacer layer 21A may include silicon nitride, and the sacrificial spacer 20 may include silicon oxide, thereby forming the multi-layered spacer having a nitride-oxide-nitride structure.

Figure 2G:
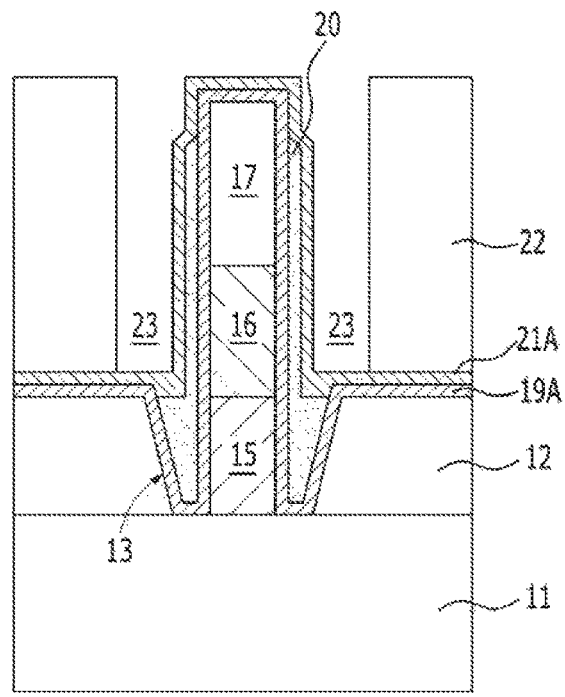

As illustrated in FIG. 2G, a second dielectric layer 22 including a second opening 23 may be formed. The second dielectric layer 22 includes dielectric materials. The second dielectric layer 22 includes silicon oxide or silicon nitride. In the following embodiment, the second dielectric layer 22 includes silicon nitride.

The second opening 23 may be formed by etching the second dielectric layer 22. In other embodiments, after forming a sacrificial pattern corresponding to the second opening 23, the second dielectric layer 22 may be formed. After polishing the second dielectric layer 22, the second opening 23 may be formed by removing the sacrificial pattern. The second opening 23 may have a hole type.

Figure 2H:
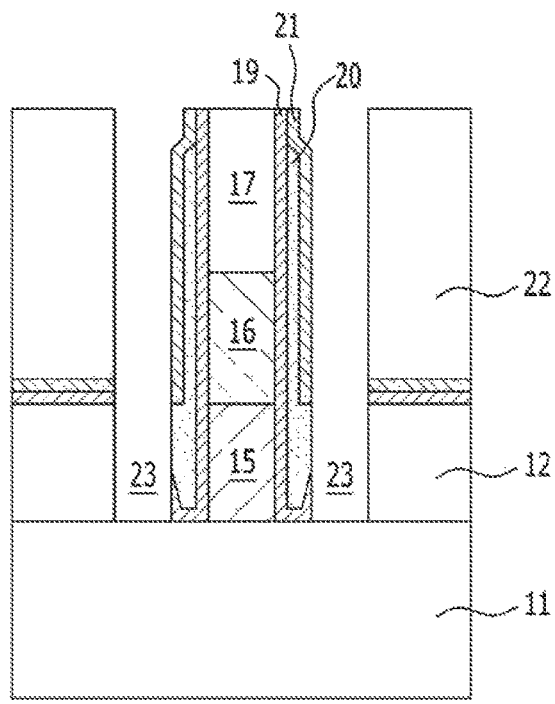

As illustrated in FIG. 2H, a surface of the substrate 11, under the second opening 23, may be exposed. To this end, the second spacer layer 21A and the first spacer layer 19A may be selectively removed. Furthermore, part of the sacrificial spacer 20 and part of the first dielectric layer 12 may be etched. As a result, the second opening 23 is extended so that a surface of the substrate 11 is exposed. The sacrificial spacer 20 may be aligned with the edge of the second spacer layer 21A and etched.

Since a surface of the substrate 11 is exposed as described above, a dielectric structure, including a first spacer 19 and the sacrificial spacer 20, may be formed on the sidewalls of the first conductive pattern 15. A dielectric structure including the first spacer 19, the sacrificial spacer 20, and a second spacer 21 may be formed on the sidewalls of the second conductive pattern 16. A top part of the sacrificial spacer 20 between the first spacer 19 and the second spacer 21 is sealed from the outside. A bottom part of the sacrificial spacer 20 is exposed to the second opening 23.

Figure 2I:
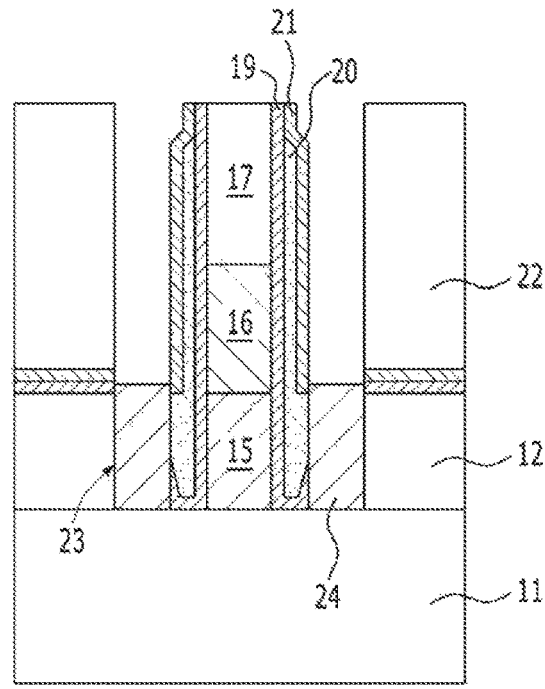

As illustrated in FIG. 2I, a third conductive pattern 24 may be formed. The third conductive pattern 24 may be recessed into and formed within the second opening 23. A third conductive layer (not illustrated) that fills the second opening 23 may be formed over the second dielectric layer 22. The third conductive pattern 24 may be formed within the second opening 23 selectively removing the third conductive layer. In order to form the third conductive pattern 24, an etch-back process may be performed on the third conductive layer. The third conductive pattern 24 may include a silicon-containing layer. The third conductive pattern 24 may include a polysilicon layer. The polysilicon layer may be doped with an impurity. The third conductive pattern 24 comes in contact with a surface of the substrate 11. The height of the third conductive pattern 24 may be controlled to be as low as possible. In such a case, the volume occupied by the third conductive pattern 24, in the second conductive structure, may be minimized. Accordingly, resistance of the second conductive structure may be reduced.

Figure 2J:
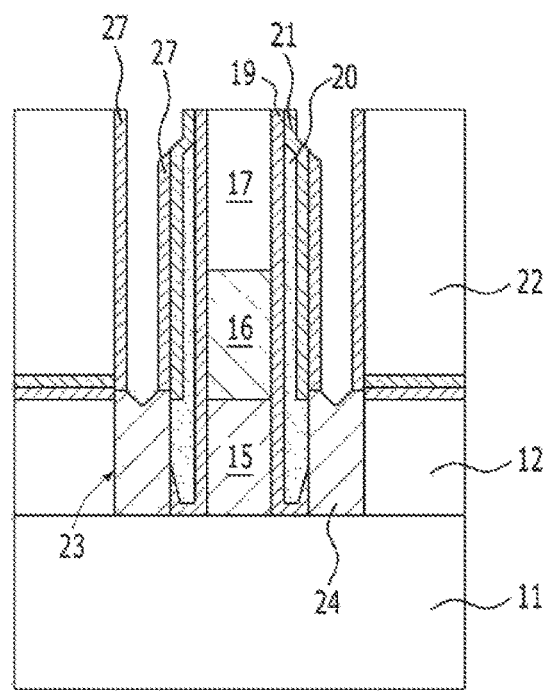

As illustrated in FIG. 2J, a third spacer 27 may be formed. The third spacer 27 may be formed by depositing and etching a dielectric layer (not illustrated). The third spacer 27 may be formed on the entire surface including the third conductive pattern 24 in conformity with the surface. The third spacer 27 may include the same materials as the first spacer 19 and the second spacer 21. For example, the third spacer 27 may include silicon nitride. The third spacer 27 may be formed on the sidewalls of the second opening 23 over the third conductive pattern 24. The third spacers 27 may surround the sidewalls of the second opening 23.

When forming the third spacer 27 or after forming the third spacer 27, a surface of the third conductive pattern 24 may be recessed to a specific depth. The recessed surface of the third conductive pattern 24 may have a V shape. In such a case, the reaction area in which a subsequent silicide layer is to be formed may be increased.

A multi-spacer structure, including the first spacers 19, the sacrificial spacers 20, the second spacers 21, and the third spacers 27, may be formed. The first spacer 19, the sacrificial spacer 20 and the second spacer 21 may be line-type spacers formed in parallel on both sidewalls of the first conductive structure. The third spacer 27 surrounds the sidewalls of the second opening 23.

Figure 2K:
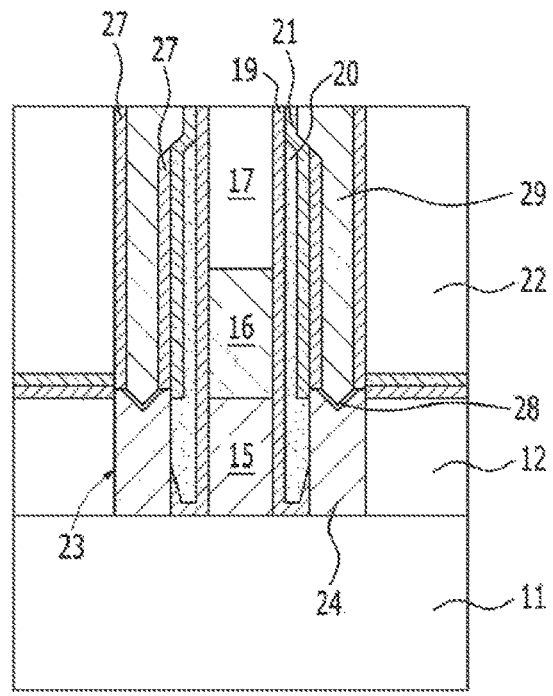

As illustrated in FIG. 2K, a fourth conductive pattern 28 may be formed on a surface of the third conductive pattern 24. The fourth conductive pattern 28 may be formed by a silicidation process. The fourth conductive pattern 28 may include a silicide layer. The fourth conductive pattern 28 may include a metal silicide layer. The fourth conductive pattern 28 may include, for example, a cobalt silicide. In the present exemplary embodiment, the fourth conductive pattern 28 may include a cobalt silicide having a $CoSi_2$ phase.

If a cobalt silicide having a $CoSi_2$ phase is formed as the fourth conductive pattern 28 as described above, contact resistance may be improved. The cobalt silicide has a low resistance, even in a small area of the second opening 23. The fourth conductive pattern 28 becomes an ohmic contact layer between the third conductive pattern 24 and a fifth conductive pattern.

A fifth conductive pattern 29 may be formed on the fourth conductive pattern 28. In order to form the fifth conductive pattern 29, a fifth conductive layer (not illustrated) may be filled and polished. The fifth conductive pattern 29 may be formed while filling the remainder of the second opening 23 on the fourth conductive pattern 28. The fifth conductive pattern 29 may include a metal-containing layer. The fifth conductive pattern 29 may include a tungsten-containing material. The fifth conductive pattern 29 may include a tungsten layer or a tungsten compound. The fifth conductive pattern 29 may have the same height as a surface of the second dielectric layer 22. The height of the fifth conductive pattern 29 may be higher than that of the third conductive pattern 24. Accordingly, in a conductive structure formed in the second opening 23, the fifth conductive pattern 29 may have a greater volume than the third conductive pattern 24.

As described above, a second conductive structure, including the third conductive pattern 24, the fourth conductive pattern 28, and the fifth conductive pattern 29, may be formed within the second opening 23. The third spacers 27 surround the sidewalls of the fifth conductive pattern 29.

The first spacer 19, the sacrificial spacer 20, the second spacer 21, and the third spacer 27 may be formed between the second conductive pattern 16 and the fifth conductive pattern 29. The first spacer 19 and the sacrificial spacer 20 may be formed between the first conductive pattern 15 and the third conductive pattern 24.

Figure 2L:
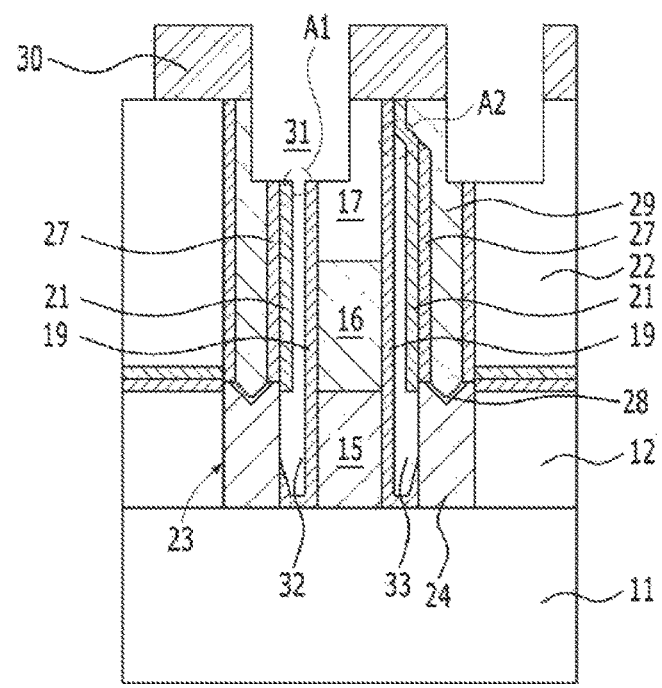

As illustrated in FIG. 2L, a sixth conductive pattern 30 may be formed. The sixth conductive pattern 30 may be formed by depositing and etching a sixth conductive layer (not illustrated). The sixth conductive pattern 30 may include a metal-containing layer. The sixth conductive pattern 30 may include a tungsten-containing material. The sixth conductive pattern 30 may include a tungsten layer or a tungsten compound. The sixth conductive pattern 30 may include a stacked structure of metal-containing layers.

The sixth conductive pattern 30 partially overlaps with the fifth conductive pattern 29. Accordingly, part of the fifth conductive pattern 29 and peripheral structures thereof may be exposed through the sixth conductive pattern 30. That is, part of the multi-layered spacer is exposed. Part of the first spacer 19, the sacrificial spacer 20, the second spacer 21, and the third spacer 27 is exposed through the sixth conductive pattern 30.

The fifth conductive pattern 29 may be etched to a specific depth to be self-aligned with the edge of the sixth conductive pattern 30. The first spacers 19, the sacrificial spacers 20, the second spacers 21, and the third spacers 27 may be etched in the state in which they have been self-aligned with the edge of the sixth conductive pattern 30. Furthermore, part of the second dielectric layer 22 and the hard mask pattern 17 may also be etched to a specific depth. Accordingly, recess parts 31 may be formed. When seen on a plane, part of the fifth conductive pattern 29 is covered with the sixth conductive pattern 30, and another part of the fifth conductive pattern 29 is exposed through the recess parts 31.

The sacrificial spacers 20 may be removed. In order to remove the sacrificial spacers 20, a strip process may be performed. The strip process may include a cleaning process. The cleaning process may be performed using wet chemicals capable of removing the sacrificial spacers 20. The sacrificial spacers 20 under the sixth conductive pattern 30 may also be removed by the wet chemicals. The strip process may include cleaning after etching the sixth conductive pattern 30. As a result, an additional process for removing the sacrificial spacers 20 may not be necessary.

The sacrificial spacers 20 may be removed by the strip process, and spaces occupied by the sacrificial spacers 20 remain as air gaps 32 and 33. Each of the air gaps 32 and 33 may have a line structure that extends in parallel to the sidewall of the second conductive pattern 16.

As described above, the air gaps 32 and 33 may be formed on the periphery of the second conductive pattern 16, in addition to the periphery of the first conductive pattern 15. Accordingly, a dielectric structure, including the first spacer 19 and air gaps 32 and 33, may be formed between the first conductive pattern 15 and the third conductive pattern 24. Since the first spacer 19 may include silicon nitride, the dielectric structure having a nitride/air structure may be formed. A dielectric structure including the first spacer 19, the air gaps 32 and 33, the second spacer 21, and the third spacer 27 may be formed between the second conductive pattern 16 and the fifth conductive pattern 29. Since the first spacer 19, the second spacer 21, and the third spacer 27 may include silicon nitride, a dielectric structure having a nitride/air/nitride/nitride structure may be formed.

The first spacer 19 and the second spacer 21 may have asymmetrical heights on the sidewall of the first conductive structure. For example, a part (indicated by A1) through which the top part of the air gap 32 is exposed and a part (indicated by A2) through which the top part of the air gap 33 is exposed have different heights. Referring to A2, the second spacer 21 the part may be extended to cap the top part of the air gap 33.

Figure 2M:
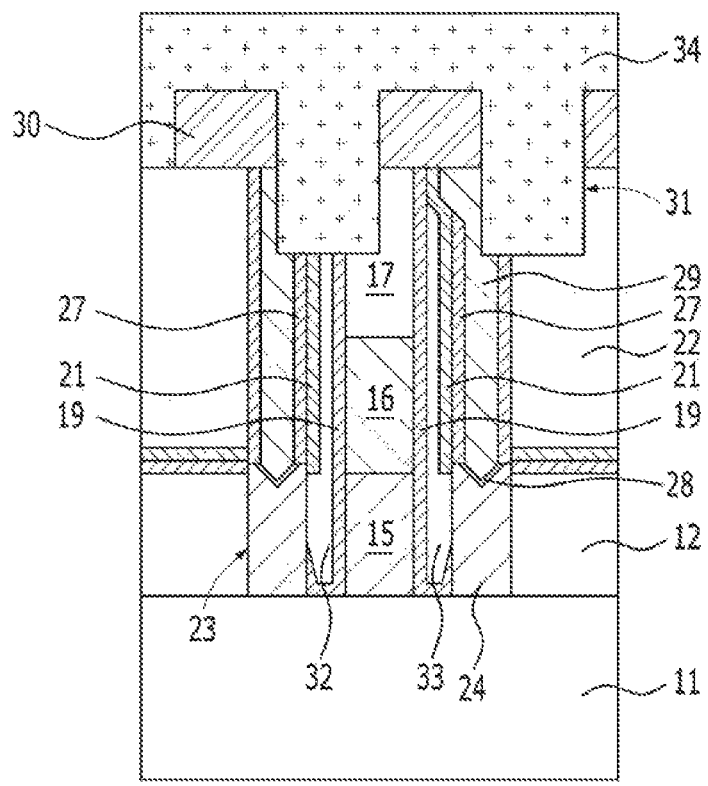

As illustrated in FIG. 2M, a capping structure 34 may be formed. The capping structure 34 may include a dielectric material. The capping structure 34 may include poor step coverage materials. The capping structure 34 may be formed, for example, by a plasma-enhanced chemical vapor deposition (PECVD) method. As a result, the top part of the air gap 32 may be capped. The capping structure 34 may include silicon oxide or silicon nitride. The capping structure 34 may include silicon nitride formed via a plasma-enhanced chemical vapor deposition (PECVD) method. The capping structure 34 caps the air gap 32 while filling the recess parts 31. Furthermore, the capping structure 34 also covers the top of the sixth conductive pattern 30. In other embodiments, the capping structure 34 may be formed by filling a second capping layer after lining a first capping layer in conformity. If the sixth conductive pattern 30 is a plug-type, then the capping structure 34 may cap the air gap 33. For example, part of the air gap 33 may be capped with the second spacer 21 under the sixth conductive pattern 30, and the remainder of the air gap 33 may be capped with the capping structure 34 outside the sixth conductive pattern 30.

As described above, the top part of the air gap 33 is capped with the second spacer 21, and the air gap 32 is capped with the capping structure 34.

The first conductive structure may include the first conductive pattern 15 and the second conductive pattern 16. The second conductive structure may include the third conductive pattern 24, the fourth conductive pattern 28, and the fifth conductive pattern 29. The air gaps 32 and 33 may be formed between the first conductive structure and the second conductive structure.

In accordance with the present embodiment, the first conductive structure and the second conductive structure have improved electrical insulating characteristics because the air gaps 32 and 33 may be formed. For example, parasitic capacitance between the first conductive pattern 15 and the third conductive pattern 24 may be reduced. Furthermore, parasitic capacitance between the second conductive pattern 16 and the fifth conductive pattern 29 may be reduced.

Furthermore, an area in which the fourth conductive pattern 28 is formed may be increased because of the air gaps 32 and 33 area is formed after forming the fourth conductive pattern 28. As a result, interface resistance may be improved.

Furthermore, resistance of the first conductive structure may be improved because the fifth conductive pattern 29, which may be made of a metal-containing material, has a greater volume than the third conductive pattern 24, which may be made of a silicon-containing material.

Figure 3:
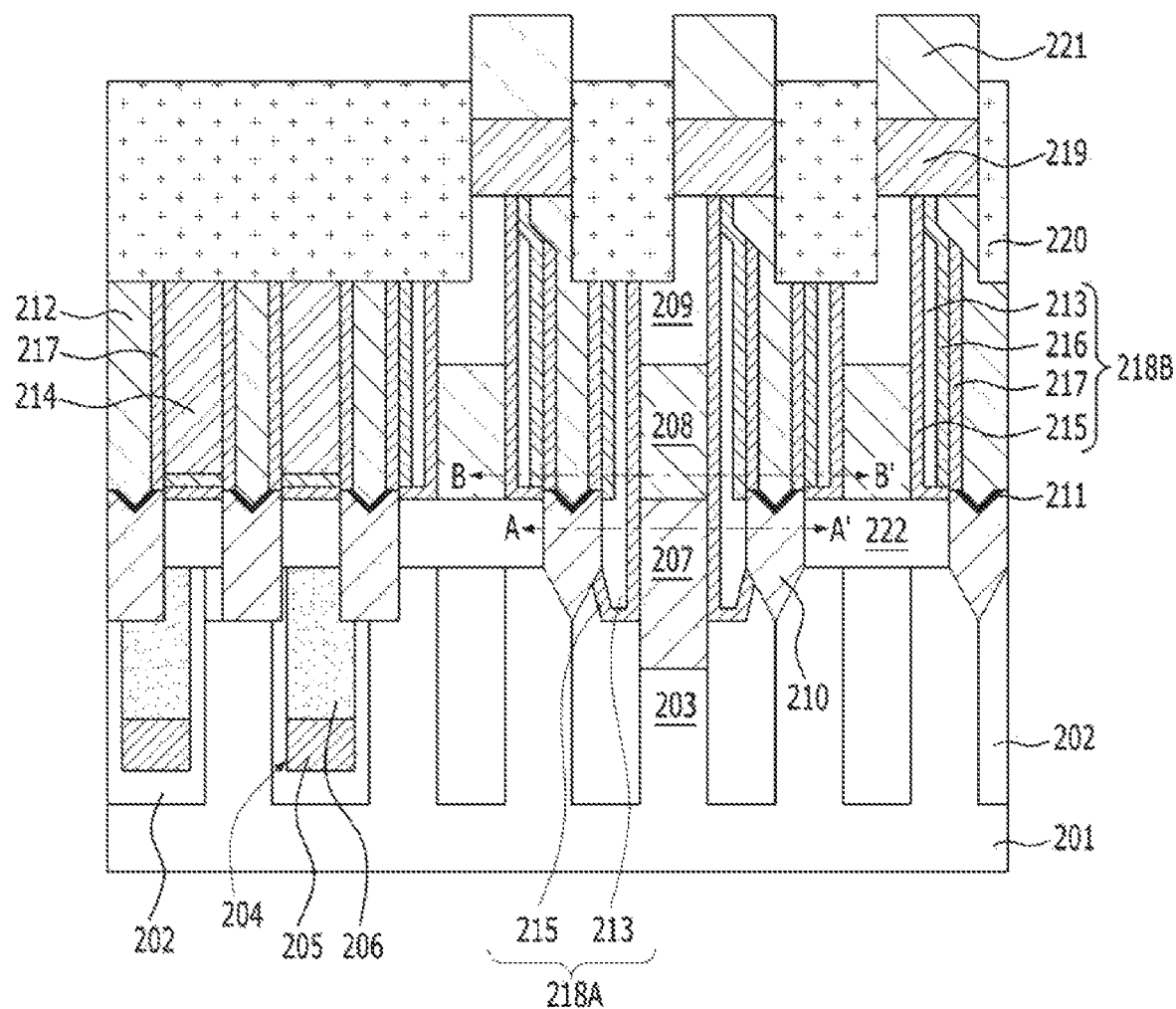
FIG. 3 is a diagram illustrating a semiconductor device in accordance with a second embodiment of the present invention.

FIG. 3 is a diagram illustrating a semiconductor device in accordance with a second embodiment of the present invention.

Referring to FIG. 3, a plurality of active regions 203 may be defined in a substrate 201 by isolation layers 202. Gate trenches 204 that cross the active regions 203 may be formed. A gate dielectric layer (not illustrated) may be formed on a surface of the gate trenches 204. Buried gate electrodes 205, which partially bury the gate trenches 204, may be formed on the gate dielectric layer. Although not illustrated, a source region and a drain region may be formed in the substrate 201. Sealing layers 206 may be formed on the buried gate electrodes 205. A bit line structure, including a bit line 208 extending in a direction crossing the buried gate electrodes 205, may be formed.

The bit line structure may include a first contact plug 207, a bit line 208, and a bit line hard mask 209. The bit line 208 may be connected to the active region 203 through the first contact plug 207. The first contact plug 207 may be connected to the active region 203 through an interlayer dielectric layer 222. A first contact hole (refer to 207A of FIG. 4A) may be formed in the interlayer dielectric layer 222, and the first contact plug 207 may be formed in the first contact hole 207A. The first contact plug 207 is also called a bit line contact plug.

A second contact plug and a third contact plug 219, connected to another active region 203, may be formed. The second contact plug and the third contact plug 219 are referred to as a storage node contact (SNC) plug. The second contact plug may be formed within a second contact hole formed in each plug isolation layer 214. The second contact plug may include a first plug 210, an ohmic contact layer 211, and a second plug 212. The first plug 210 may be a silicon plug including, for example, polysilicon. The second plug 212 and the third contact plug 219 may be metal plugs including, for example, tungsten. The ohmic contact layer 211 may be formed between the first plug 210 and the second plug 212. The ohmic contact layer 211 may include a metal silicide layer. In the second contact plug, a volume occupied by the first plug 210 is smaller than that occupied by the second plug 212. As a result, resistance of the second contact plug is reduced by the second plug 212, which is a metal plug. Contact resistance may be reduced because the ohmic contact layer 211 may be formed between the first plug 210 and the second plug 212. An overlap margin of the storage node 221 may be secured by the third contact plug 219.

An air gap 213 may be formed between the bit line structure and the second contact plug. The air gap 213 is vertically extended so that it may be formed on the sidewalls of the first contact plug 207 and the sidewalls of the bit line 208. The air gap 213 may extend parallel to the sidewalls of the bit line 208 on the sidewalls of the bit line 208.

The air gap 213 is capped with a capping layer 220 and a second spacer 216. Part of the air gap 213 may be capped with the second spacer 216, and the remainder of the air gap 213 may be capped with the capping layer 220.

A capacitor including a storage node 221 may be formed over the third contact plug 219. The storage node 221 may have a pillar shape. Although not illustrated, a dielectric layer and a plate node may be formed over the storage node 221. The storage node 221 may have be a cylinder type in addition to a pillar type. In other embodiments, a memory element embodied in various ways may be connected on the third contact plug 219.

As described above, the semiconductor device may include a buried gate type transistor including the buried gate electrodes 205, the bit line 208, and the capacitor. The transistor and the bit line 208 may be electrically connected by the first contact plug 207. The transistor and the capacitor may be electrically connected by the second contact plug and the third contact plug 219. The second contact plug has a structure in which the first plug 210, the ohmic contact layer 211, and the second plug 212 may be stacked.

The air gap 213 may be formed between the second plug 212 of the second contact plug and the bit line 208. Accordingly, parasitic capacitance between the bit line 208 and the second contact plug may be reduced. Furthermore, the air gap 213 may be formed between the first plug 210 of the second contact plug and the first contact plug 207. Accordingly, the parasitic capacitance between the first contact plug 207 and the second contact plug may be reduced.

Figure 4A:
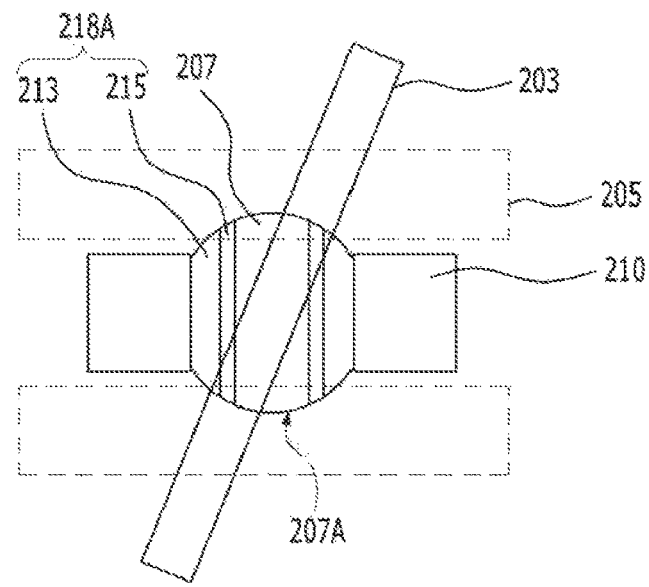
FIG. 4A is a plan view of line A-A' of FIG. 3.

FIG. 4A is a plan view of line A-A' of FIG. 3. Referring to FIG. 4A, the diameter of a first contact hole 207A is greater than the line width of the first contact plug 207. Accordingly, a gap may be formed on the sidewall of the first contact plug 207, and the air gap 213 and the first spacer 215 may be formed in the gap. As a result, a dielectric structure, including the first spacer 215 and the air gap 213, may be formed between the first contact plug 207 and the first plug 210.

Figure 4B:
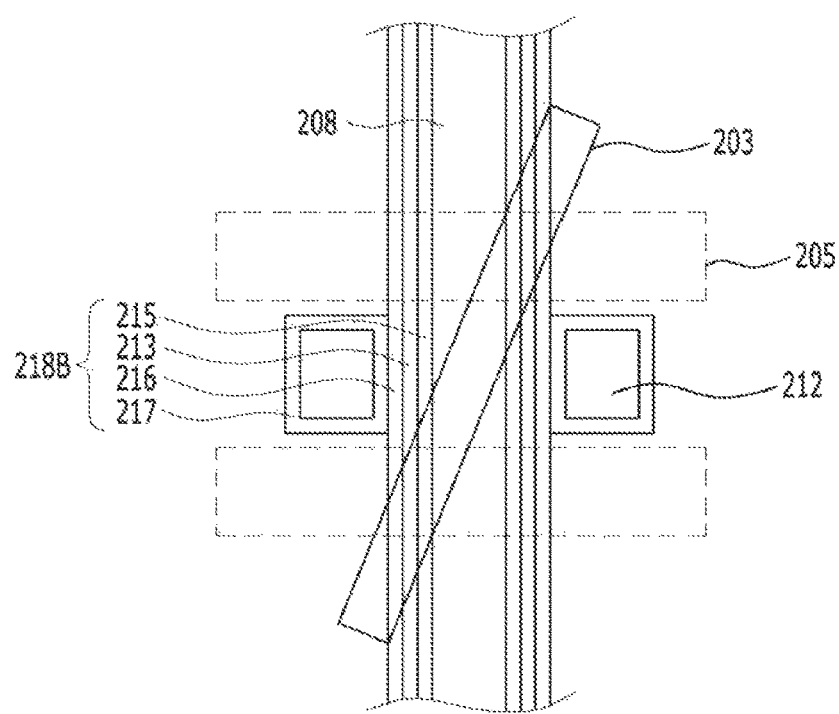
FIG. 4B is a plan view of line B-B' of FIG. 3.

FIG. 4B is a plan view of line B-B' of FIG. 3. Referring to FIG. 4B, a dielectric structure, including a first spacer 215, the air gap 213, the second spacer 216, and a third spacer 217, may be formed between the bit line 208 and the second plug 212. The third spacers 217 surround the sidewalls of the second plug 212. The air gap 213 has a line-shape in which the air gap 213 extends in parallel to the sidewall of the bit line 208.

As described above, the air gap 213 may be formed between the first contact plug 207 and the first plug 210. Furthermore, the air gap 213 may also formed between the bit line 208 and the second plug 212. A first spacer structure 218A having the first spacer 215/the air gap 213 may be formed between the first contact plug 207 and the first plug 210. If the first spacer 215 includes silicon nitride, then the first spacer structure 218A, which has a nitride/air structure, may be formed. A second spacer structure 218B, including the first spacer 215, the air gap 213, the second spacer 216, and the third spacer 217, may be formed between the bit line 208 and the second plug 212. If the first spacer 215, the second spacer 216, and the third spacer 217 include silicon nitride, then the second spacer structure 218B having a nitride/air/nitride/nitride structure may be formed. A portion of each of the first spacer 215 may be extended to cover the isolation region 202 and the interlayer dielectric layer 222. As a result, the isolation region 202 and the interlayer dielectric layer 222 may be protected from being lost during a dip-out process for forming air gaps 213.

The air gap 213 may have a different height on both sidewalls of the bit line 208. Such height asymmetry of the air gap 213 is created by the capping layer 220. The top part of the air gap 213 may be capped with different structures. Part of the air gap 213 may be capped with the second spacer 216. The remainder of the air gap 213 may be capped with the capping layer 220. If the first spacer 215, the second spacer 216, and the capping layer 220 include silicon nitride, then the air gap 213 may be capped with silicon nitride.

In accordance with the present exemplary embodiment, parasitic capacitance may be reduced because the air gap 213 may be formed between the bit line 208 and the SNC plug, and the air gap 213 is formed between the bit line contact plug 207 and the SNC plug. As a result, the operating speed of the semiconductor device may be improved.

Meanwhile, in a comparative example, an air gap may be formed only between the bit line and the SNC plug. Furthermore, in another comparative example, the air gap may be formed only between the bit line contact plug and the SNC plug. However, the comparative examples have limited ability to improve the operating speed of semiconductor devices because they have a lower parasitic capacitance reduction effect than the present embodiment.

Figure 5A:
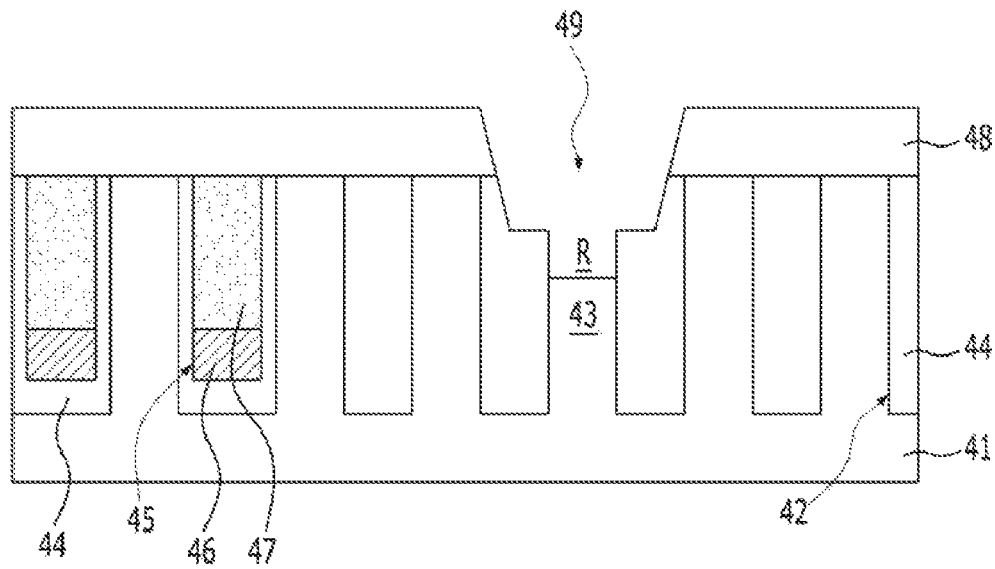
FIGS. 5A to 5O illustrate a method of fabricating the semiconductor device in accordance with the second embodiment of the present invention.
Figure 5B:
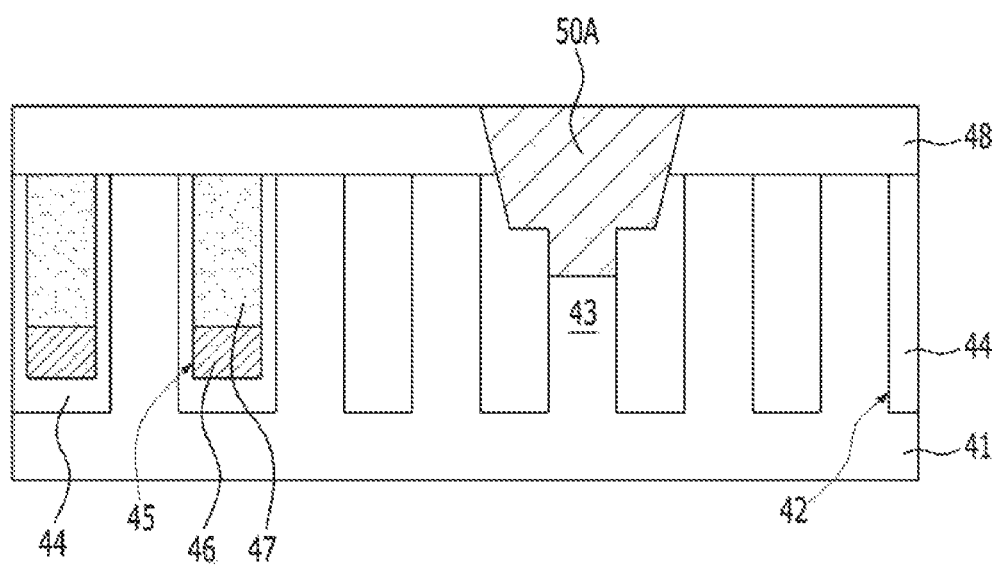
Figure 5C:
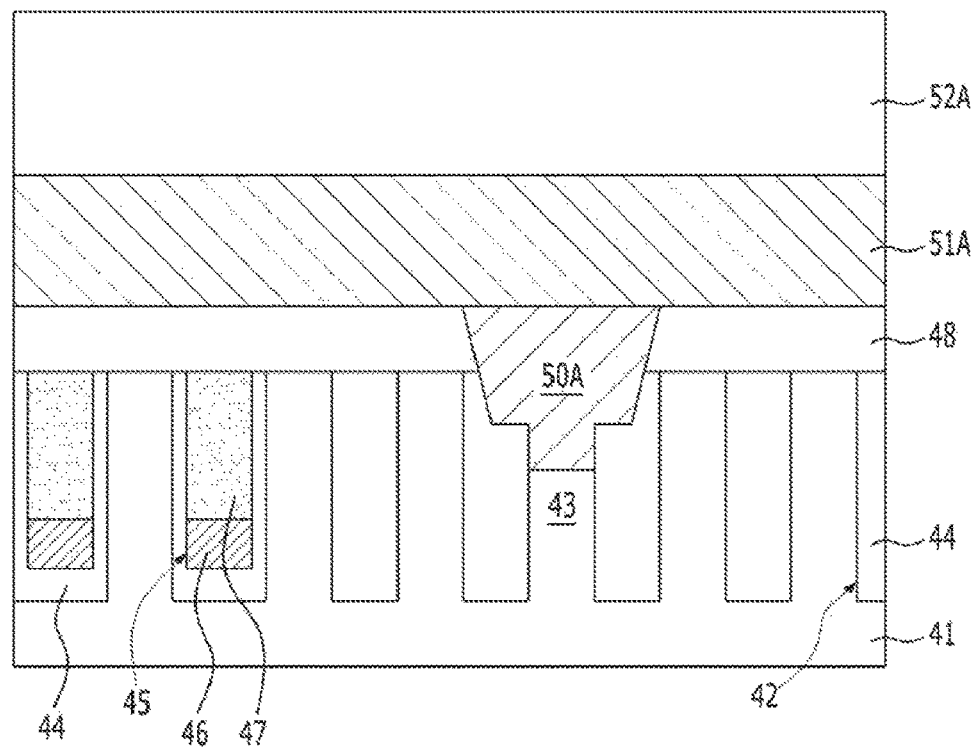
Figure 5D:
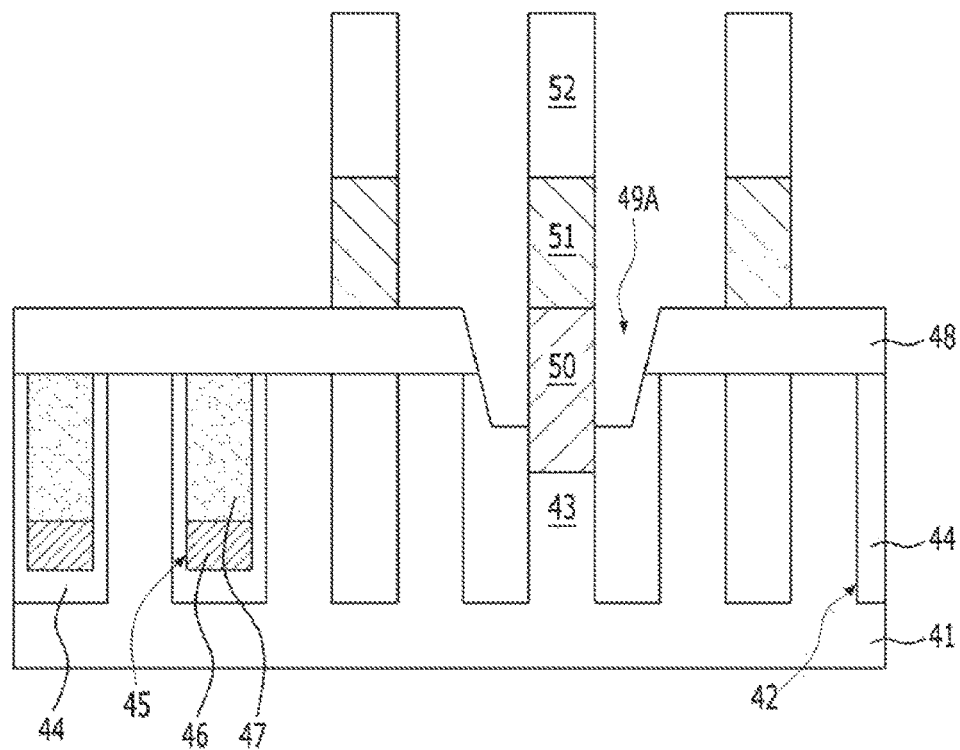
Figure 5E:
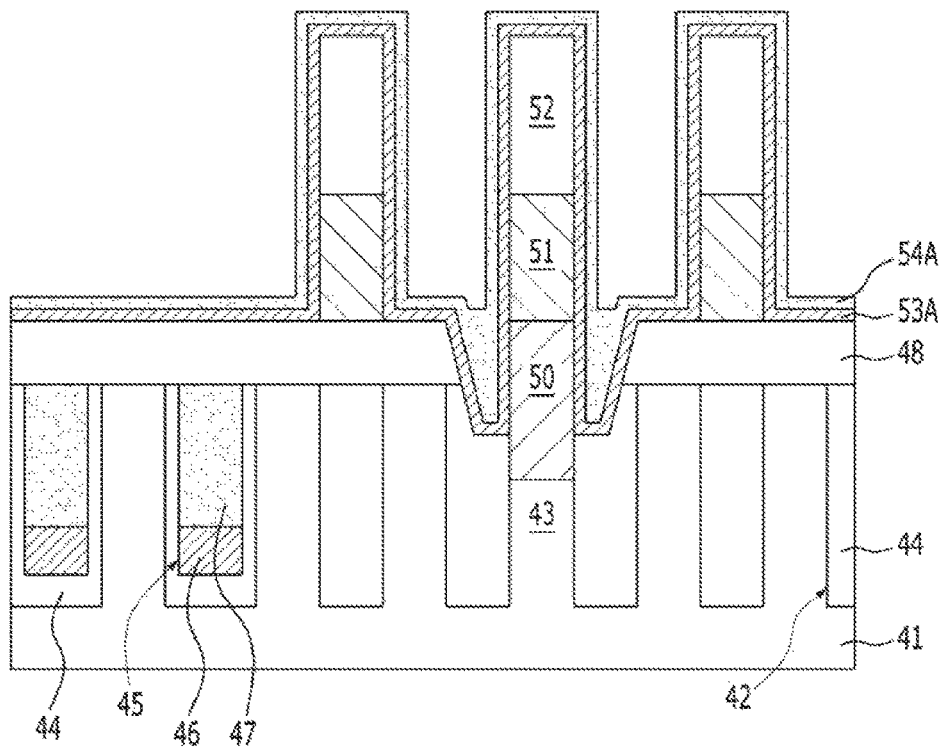
Figure 5F:
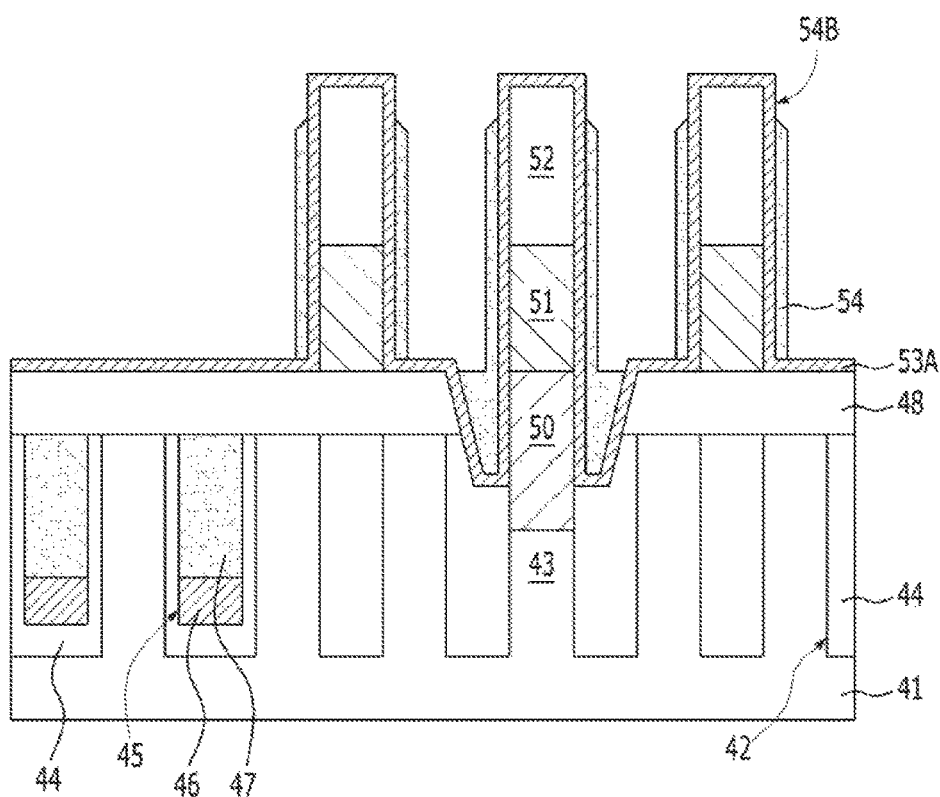
Figure 5G:
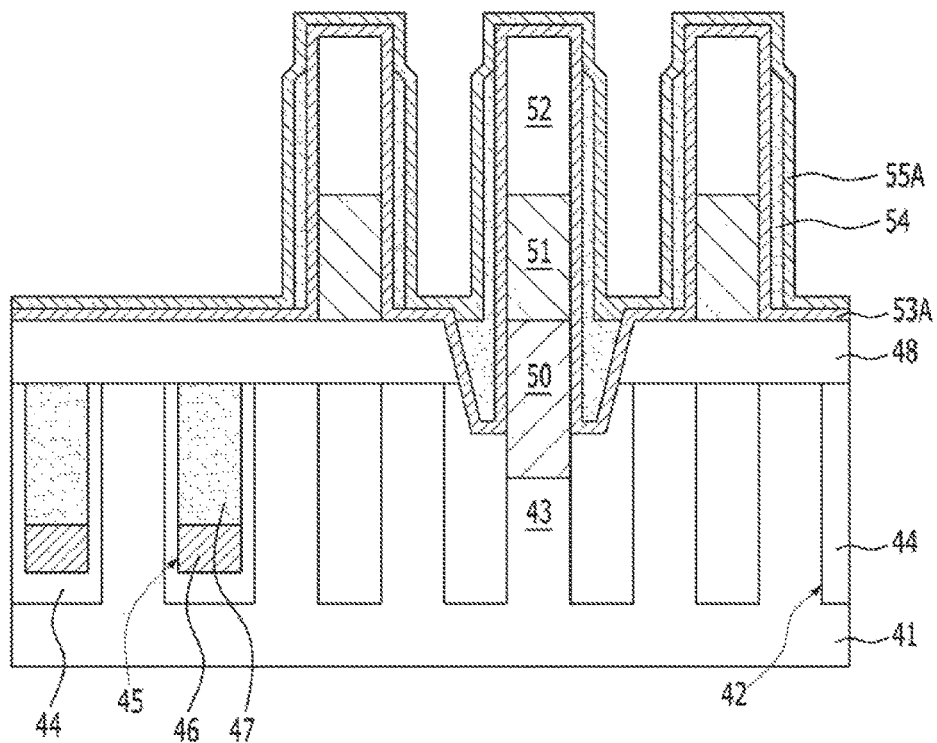
Figure 5H:
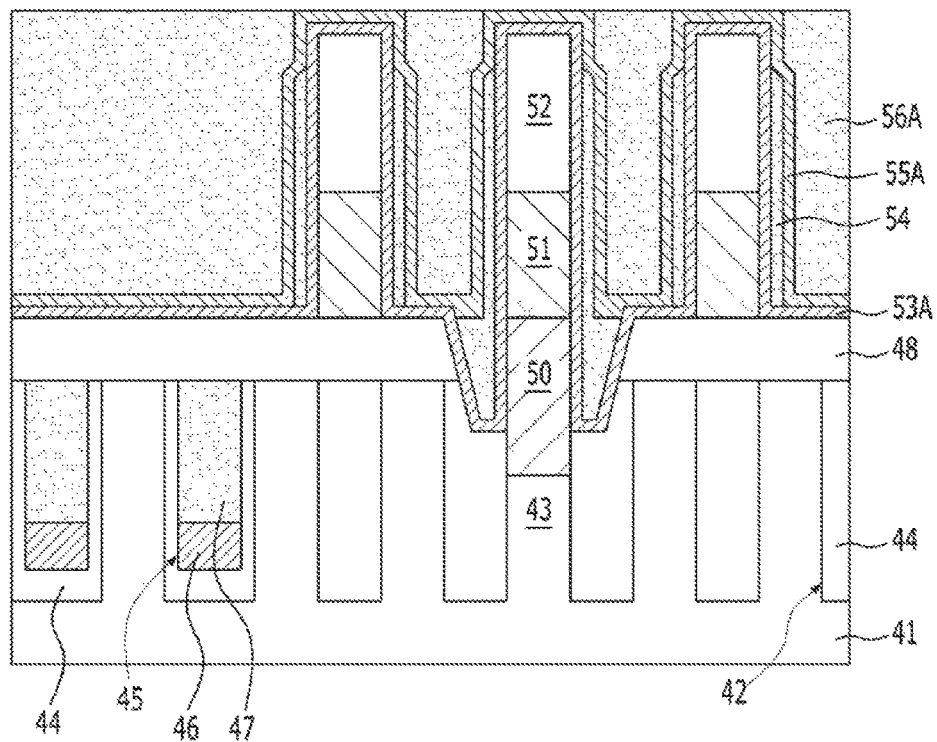
Figure 5I:
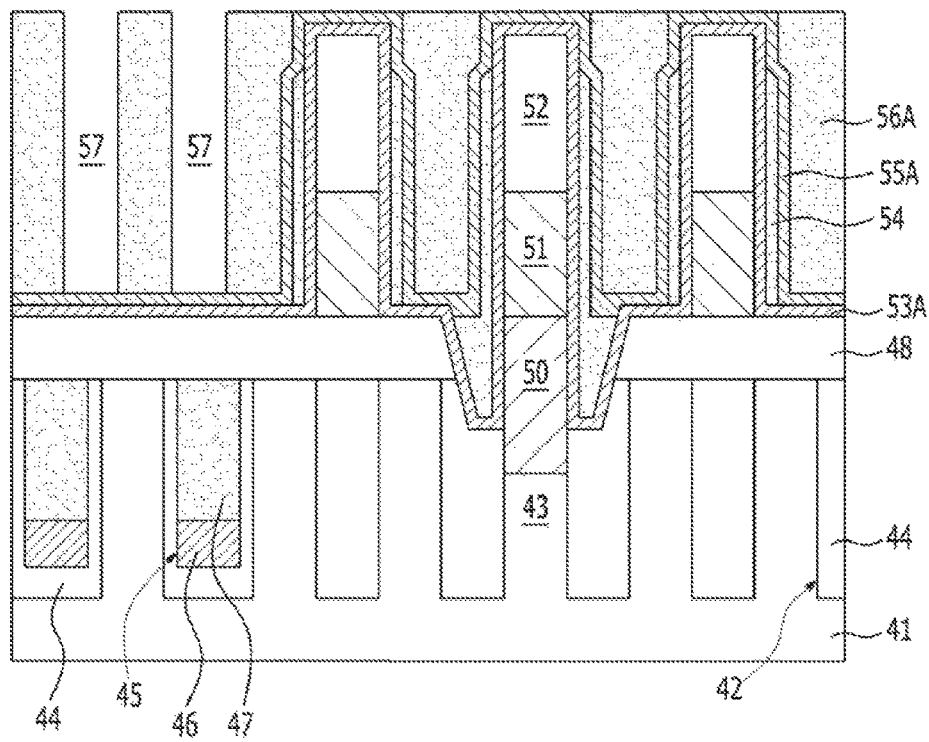
Figure 5J:
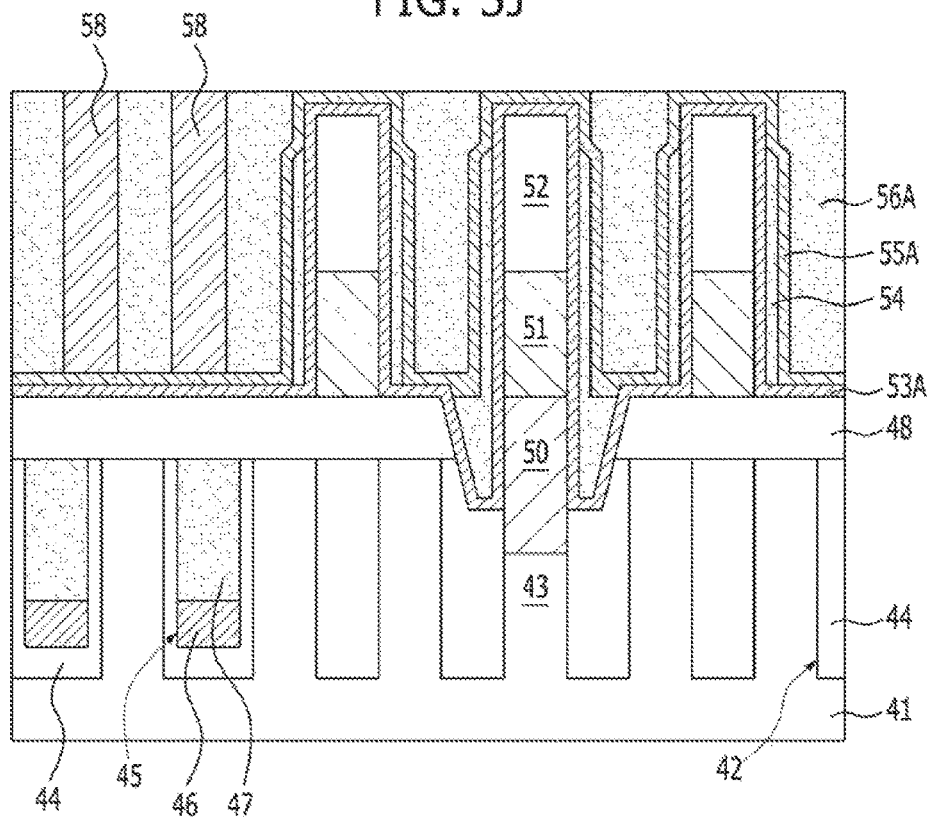
Figure 5K:
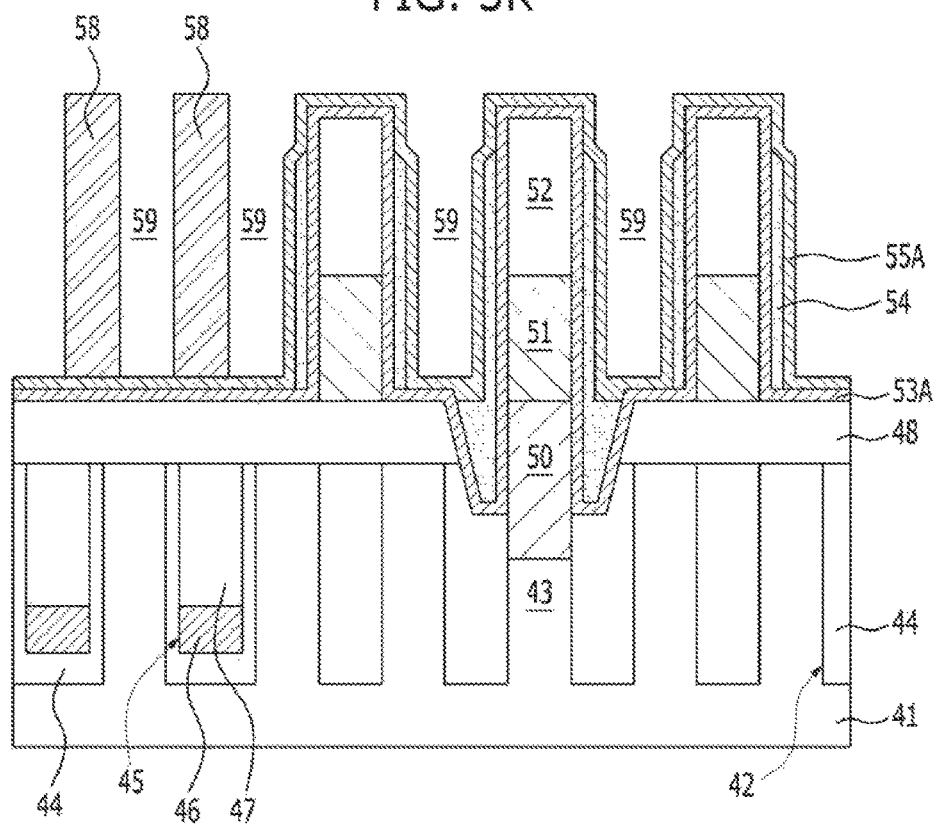
Figure 5L:
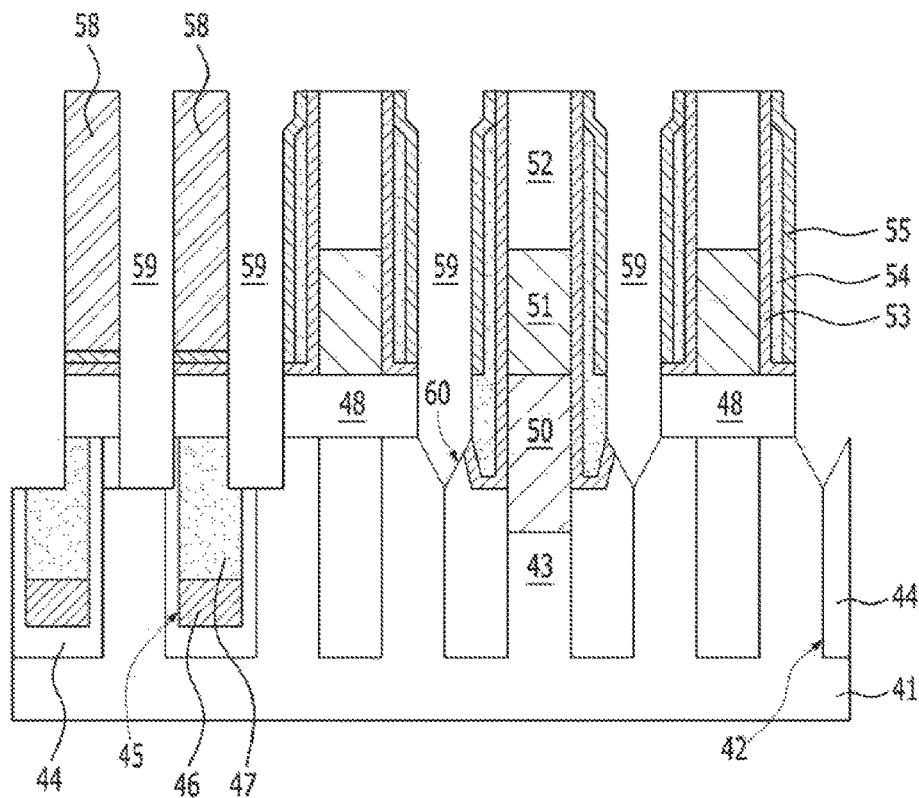
Figure 5M:
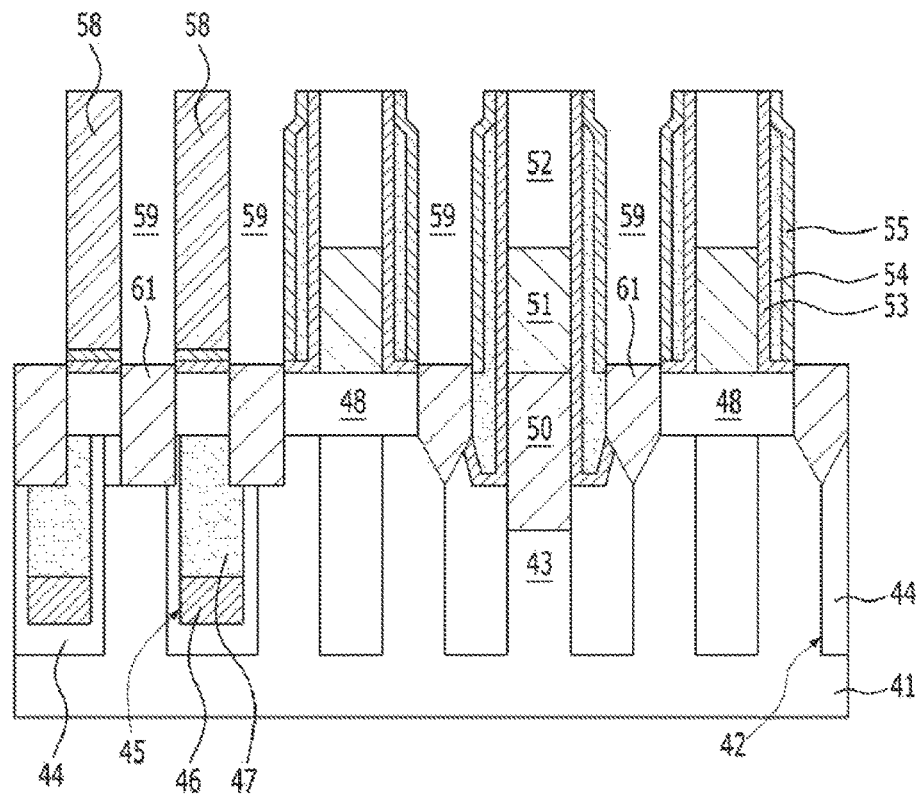
Figure 5N:
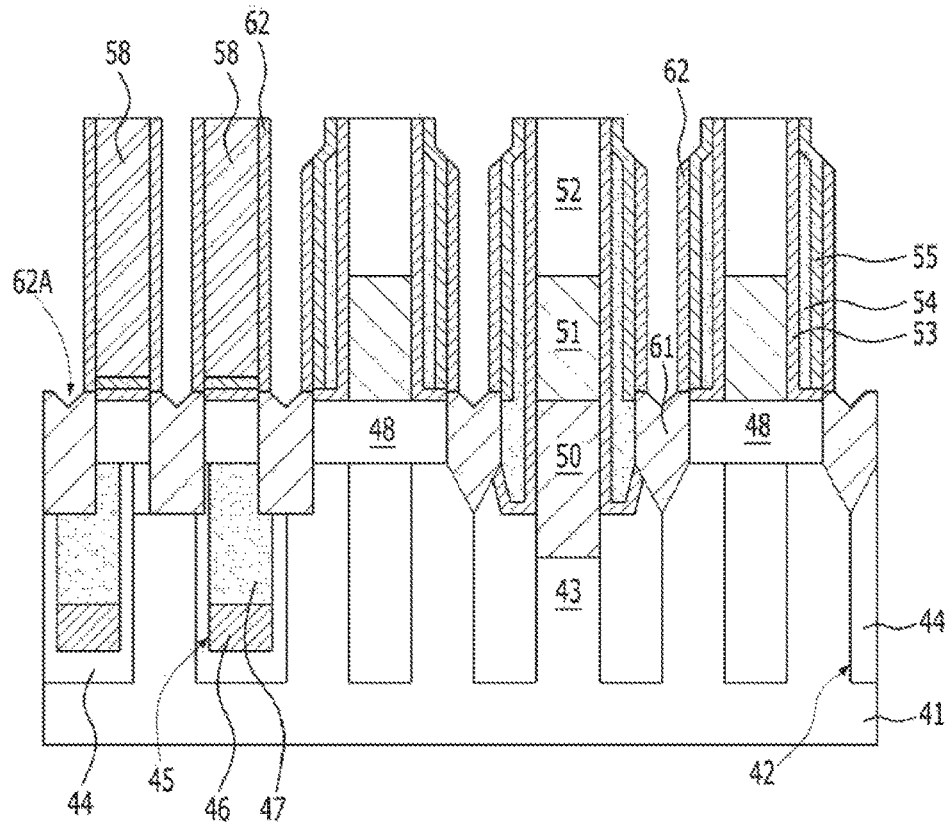
Figure 5O:
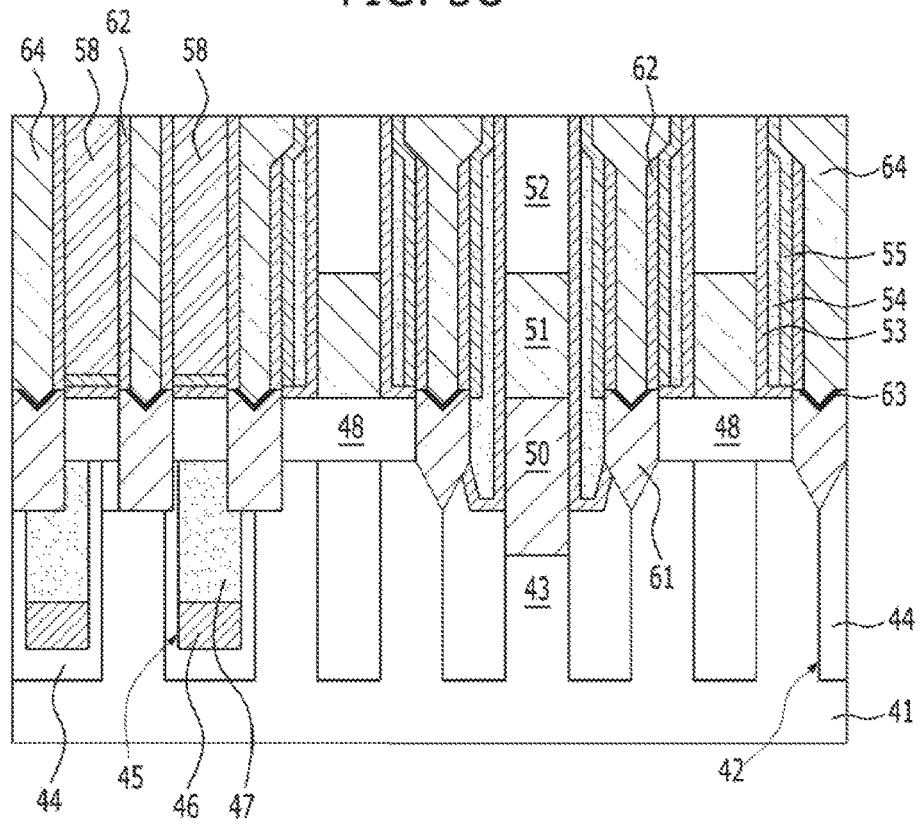

FIGS. 5A to 5O illustrate a method of fabricating the semiconductor device in accordance with the second embodiment of the present invention.

As illustrated in FIG. 5A, isolation layers 44 may be formed in a substrate 41. The substrate 41 may include a silicon substrate, an SiGe substrate, or an SOI substrate. The substrate 41 may include semiconductor device regions and non-memory cell regions. The non-memory cell region may include a peripheral circuit region. Components, such as logic transistors, may be formed in the peripheral circuit region. In the following embodiment, a method of fabricating a semiconductor device region will be described. The isolation layers 44 may be formed by a shallow trench isolation (STI) process. The isolation layers 44 may be formed in isolation trenches 42. An active region 43 may be defined by the isolation layers 44. The active region 43 may have an island shape having a short axis and a long axis. A plurality of the active regions 43 may be isolated by the isolation layers 44. The isolation layers 44 may be formed by sequentially forming a wall oxide, a liner, and a fill material. The liner may include silicon nitride and silicon oxide. The silicon nitride may include $Si_3N_4$, and the silicon oxide may include $SiO_2$. The fill material may include silicon oxide, such as a spin-on dielectric material. Furthermore, the fill material may include silicon nitride. The silicon nitride may be filled using the silicon nitride that is used as a liner.

A transistor including a buried gate electrode 46 may be formed. The buried gate electrode 46 may be buried in the substrate 41. The buried gate electrode 46 may be formed in a gate trench 45. The gate trench 45 may be formed by etching the active region 43 and the isolation layers 44. The gate trench 45 has a shallower depth than the isolation layers 44.

A gate dielectric layer (not illustrated) may be formed on a surface of the gate trench 45. The gate dielectric layer may be formed by thermal oxidation. The buried gate electrode 46 may be recessed into and formed in the gate dielectric layer. A sealing layer 47 may be formed on the buried gate electrode 46. The buried gate electrode 46 may be formed by forming a metal-containing layer so that the metal-containing layer fills the gate trench 45 and then etching back the metal-containing layer. The metal-containing layer may include, for example, a metal, such as titanium, tantalum, or tungsten. The metal-containing layer may include, for example, tantalum nitride (TaN), titanium nitride (TiN), tungsten nitride (WN), or tungsten (W). For example, the buried gate electrode 46 may include TiN, TaN, or tungsten solely or may have a two-layered structure, such as TiN/W or TaN/W, in which W has been formed on TIN or TaN. Furthermore, the buried gate electrode 46 may include a two-layered structure, such as WN/W, in which W has been stacked on WN. Furthermore, the buried gate electrode 46 may include a tungsten layer and may include a metal material having a low resistance. The sealing layer 47 may fill the gate trench 45 on the buried gate electrode 46. The sealing layer 47 may protect the buried gate electrode 46 during a subsequent process. The sealing layer 47 may include a dielectric material. The sealing layer 47 may include silicon nitride. After forming the sealing layer 47, a source region (not illustrated) and a drain region (not illustrated) may be formed in the active region 43. As a result, a buried gate type transistor, including the buried gate electrode 46, may be formed.

Next, an interlayer dielectric layer 48 may be formed. A first contact hole 49 may be formed by etching the interlayer dielectric layer 48. Part of the active region 43 is exposed through the first contact hole 49. The first contact hole 49 may expose a central part of the active region 43. The first contact hole 49 has a diameter greater than the width of the active region 43. Accordingly, in an etching process for forming the first contact hole 49, part of the isolation layers 44 may also be etched. The active region 43 exposed through the first contact hole 49 includes the source region or the drain region of the buried gate type transistor. The first contact hole 49 may also be called a bit line contact hole.

The active region 43 exposed under the first contact hole 49 is recessed (refer to R). As a result, a surface of the active region 43 to which the bit line contact plug is connected has a lower height than a surface of the active region 43 to which an SNC plug will be connected.

As illustrated in FIG. 5B, a pre-first contact plug 50A may be formed. A method of forming the pre-first contact plug 50A is described below. First, the first contact hole 49 may be filled with a polysilicon layer. The polysilicon layer may be polished so that a surface of the interlayer dielectric layer 48 is exposed.

As illustrated in FIG. 5C, a first conductive layer 51A and a hard mask layer 52A may be stacked over the pre-first contact plug 50A. The first conductive layer 51A may include a layer containing metal, such as tungsten. The hard mask layer 52A may include silicon nitride.

As illustrated in FIG. 5D, bit line structures may be formed. For example, the hard mask layer 52A, the first conductive layer 51A, and the pre-first contact plug 50A may be etched using a bit line mask (not illustrated). As a result, a first contact plug 50, a bit line 51, and a bit line hard mask layer 52 may be formed.

The first contact plug 50 may be formed on the recessed active region 43. That is, the first contact plug 50 may be formed within the first contact hole 49. The first contact plug 50 has a line width smaller than the diameter of the first contact hole 49. Accordingly, a sidewall contact hole 49A may be formed on the periphery of the first contact plug 50. The sidewall contact hole 49A provides a gap between the first contact plug 50 and the interlayer dielectric layer 48. The bit line 51 may include a tungsten-containing material, such as a tungsten layer. The bit line hard mask layer 52 functions to protect the bit line 51. The bit line hard mask layer 52 may include a dielectric material. The bit line hard mask layer 52 may include silicon nitride. The first contact plug 50 may also be called a bit line contact plug.

Although not illustrated, a gate structure may be formed over the substrate 41 of the non-memory cell region when forming the bit line structure.

As illustrated in FIG. 5E, a first spacer layer 53A may be formed on the entire structure, including the bit line structures. The first spacer layer 53A may include a dielectric material, such as silicon nitride. The first spacer layer 53A may be formed on the sidewall contact hole 49A and the interlayer dielectric layer 48 in conformity with the sidewall contact hole 49A and the interlayer dielectric layer 48.

A sacrificial spacer layer 54A may be formed on the first spacer layer 53A. The sacrificial spacer layer 54A may be formed while filling the sidewall contact hole 49A. The sacrificial spacer layer 54A may include silicon oxide.

As described above, a dual spacer layer, including the first spacer layer 53A and the sacrificial spacer layer 54A, may be formed in the sidewall contact hole 49A between the first contact plug 50 and the interlayer dielectric layer 48.

As illustrated in FIG. 5F, a sacrificial spacer 54 may be formed. The sacrificial spacer 54 may be formed by etching the sacrificial spacer layer 54A. The sacrificial spacer layer 54A may be etched by an etch-back process. As a result, the sacrificial spacer 54 may be formed on the sidewalls of the bit line structure with the first spacer layer 53A interposed between the sacrificial spacer 54 and the bit line structure. The top height of the sacrificial spacer 54 is controlled so that it is lower than a top surface of the bit line conductive structure (refer to 54B). The sacrificial spacer layer 54A is removed from a surface of the interlayer dielectric layer 48.

As illustrated in FIG. 5G, second spacer layers 55A may be formed on the sacrificial spacer 54. The second spacer layer 55A may be formed on the entire surface including the sacrificial spacer 54. The second spacer layer 55A may include a dielectric material. The second spacer layer 55A may include silicon oxide or silicon nitride. In the following embodiment, the second spacer layer 55A may include silicon nitride. The sacrificial spacer 54 is sealed from the outside by means of the second spacer layer 55A. That is, a multi-layered spacer, in which the sacrificial spacer 54 formed between the first spacer layer 53A and the second spacer layer 55A, may be formed. A multi-layered spacer having a nitride/oxide/nitride (NON) structure may be formed because the first spacer layer 53A and the second spacer layer 55A may include silicon nitride and the sacrificial spacer 54 may include silicon oxide.

The thicknesses of the first spacer layer 53A, the sacrificial spacer layer 54, and the second spacer layer 55A may be minimized in order to secure an open margin of a subsequent second contact hole.

As illustrated in FIG. 5H, a sacrificial layer 56A may be formed. The sacrificial layer 56A may be filled between the bit line structures. The sacrificial layer 56A may include silicon oxide. The sacrificial layer 56A may include a spin-on dielectric (SOD) layer. The sacrificial layer 56A may be polished so that a surface of the second spacer layer 55A is exposed over the bit line structures.

As illustrated in FIG. 5I, pre-isolation parts 57 may be formed in the sacrificial layer 56A. The pre-isolation parts 57 may be formed by etching using a mask pattern (not illustrated) in a direction to cross the bit line structures.

As illustrated in FIG. 5J, plug isolation layers 58 may be formed in the pre-isolation parts 57. The plug isolation layers 58 may be formed by filling the pre-isolation parts 57 with silicon nitride and then polishing the silicon nitride.

As illustrated in FIG. 5K, the sacrificial layer 56A may be removed. As a result, second contact holes 59 may be formed. The second contact hole 59 may be formed between the plug isolation layers 58. The plug isolation layer 58 may be formed between the bit line structures. Accordingly, the second contact hole 59 and the plug isolation layer 58 may be formed between the bit line structures. The second contact hole 59 may also be called a storage node contact hole.

As illustrated in FIG. 5L, the bottom part of the second contact hole 59 may extend through the interlayer dielectric layer 48. To this end, the second spacer layer 55A and the first spacer layer 53A may be selectively removed. Furthermore, the bottom part of the sacrificial spacer 54 and the interlayer dielectric layer 48 may be partially etched. Accordingly, the substrate 41 under the second contact holes 59 may be exposed. The second spacer layer 55A and the first spacer layer 53A may be removed from the top of the bit line structures. The bottom part of the second contact hole 59 may have a V-shaped profile (refer to 60) due to a difference between etch selectivities.

A dielectric structure, including a first spacer 53, a sacrificial spacer 54, and a second spacer 55, may be formed on the sidewalls of the bit lines 51. A dielectric structure, including the first spacer 53 and the sacrificial spacer 54, may be formed on the sidewalls of the first contact plug 50. The bottom part of the sacrificial spacer 54 may be exposed through the second contact hole 59. The middle part and top part of the sacrificial spacer 54 may be covered with the second spacer 55. A portion of each of the first spacer 53 may be extended to cover the isolation region 44 and the interlayer dielectric layer 48. As a result, the isolation region 44 and the interlayer dielectric layer 48 may be protected from being lost during a dip-out process for forming air gaps.

Thereafter, a second contact plug including a first plug, an ohmic contact layer, and a second plug may be formed.

The second contact plug is described below.

As illustrated in FIG. 5M, first plugs 61 may be formed. The first plugs 61 may be formed in the second contact holes 59. A first plug 61 may include a silicon-containing layer, such as a polysilicon layer. The polysilicon layer may be doped with an impurity. The first plug 61 may contact a surface of the substrate 41. The first plug 61 may have a height that is in proximity to a bottom surface of the bit line 51. The height of the first plug 61 may be controlled to be as low as possible. In such a case, the volume occupied by the first plug 61 in the second contact plug may be minimized. Accordingly, a resistance of the second contact plug may be reduced. Furthermore, prior to the formation of the first plug 61, a dip-out process for additionally extending the bottom part of the second contact hole 59 does not need to be performed. As a result, a void can be prevented from being formed in the first plug 61, and the volume of the first plug 61 may be minimized. Furthermore, since a dip-out process is omitted, a failure of the first plug 61 can be prevented. The first plug 61 has a thickness of about 100 Å to 500 Å.

As illustrated in FIG. 5N, third spacers 62 may be formed. A third spacer 62 may be formed by depositing and etching a dielectric layer (not illustrated). A dielectric layer used as the third spacer 62 may be formed on the entire surface including the first plugs 61 in a conformable way. The third spacer 62 may include the same materials as the first spacer 53 and the second spacer 55. The third spacer 62 may include silicon nitride. Parasitic capacitance may be further reduced by the third spacer 62. That is, parasitic capacitance may be increased because the thickness of the first spacer layer 53A, the sacrificial spacer layer 54, and the second spacer layer 55A is reduced, but an increase of parasitic capacitance is prohibited by the third spacers 62.

When forming the third spacer 62 or after forming the third spacer 62, a surface of the first plug 61 may be recessed to a specific depth (refer to 62A). The recessed surface of the first plug 61 may have a V shape. In such a case, a reaction area in which a subsequent silicide layer may be formed may be increased.

A multi-spacer structure including the first spacers 53, the sacrificial spacers 54, the second spacers 55, and the third spacers 62 may be formed on the sidewalls of the bit line structure because the third spacers 62 may be formed as described above.

As illustrated in FIG. 5O, an ohmic contact layer 63 may be formed on a surface of each of the first plugs 61. The ohmic contact layer 63 may include a silicide layer. The ohmic contact layer 63 may include cobalt silicide having a $CoSi_2$ phase. In order to form the ohmic contact layer 63, a cobalt layer may be deposited and annealing may be performed on the cobalt layer at least twice. Thereafter, any un-reacted cobalt layer may be removed.

Second plugs 64 may be formed on the ohmic contact layer 63 in such a way as to fill the remainder of the second contact holes 59. A second plug 64 may include a metal-containing layer, such as a tungsten-containing materials. The second plug 64 may include a tungsten layer or a tungsten compound. The second plug 64 may have the same height as a surface of the plug isolation layer 58.

As described above, a second contact plug, including the first plug 61, the ohmic contact layer 63, and the second plug 64, may be formed within the second contact hole 59. A third spacer 62 surrounds the sidewalls of the second plug 64.

The first spacer 53, the sacrificial spacer 54, the second spacer 55, and the third spacer 52 may be formed between the bit line 51 and the second plug 64. The first spacer 53 and the sacrificial spacer 54 may be formed between the first contact plug 50 and the first plug 61. As already described, the third spacer surrounds the sidewalls of the second plug 64. The second contact plug, including the first plug 61, the ohmic contact layer 63, and the second plug 64, is also called a first storage node contact (SNC) plug.

Thereafter, air gaps may be formed.

FIGS. 6A to 6D illustrate a method of forming the air gaps of the semiconductor device in accordance with the second embodiment of the present invention.

Figure 6A:
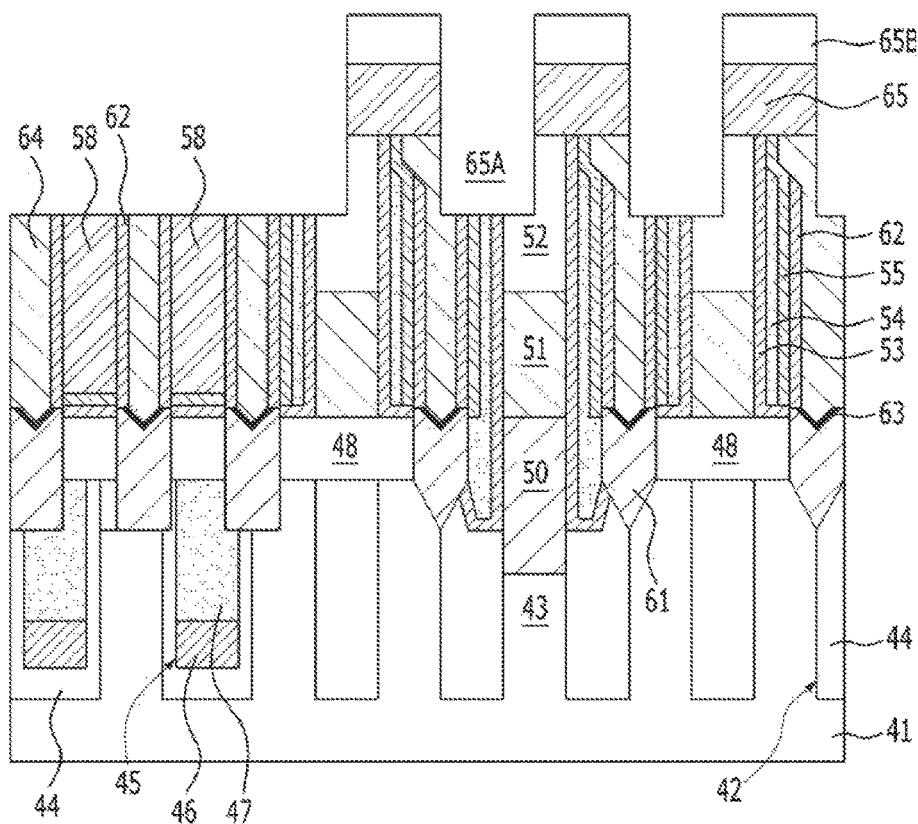
FIGS. 6A to 6D illustrate a method of forming the air gaps of the semiconductor device in accordance with the second embodiment of the present invention.

As illustrated in FIG. 6A, third contact plugs 65 may be formed. A third contact plug 65 may include a metal-containing layer, such as a tungsten-containing material. The third contact plug 65 may include a tungsten layer or a tungsten compound. The third contact plug 65 may have a stack structure of metal-containing layers. In order to form the third contact plug 65, a tungsten layer may be deposited and then etched using a mask pattern 65B.

The third contact plug 65 is also called an SNC plug. Accordingly, the SNC plug in accordance with the present embodiment has a stack structure of the second contact plug and the third contact plug 65.

The third contact plug 65 partially overlaps the second plug 64. Accordingly, part of the second plug 64 and peripheral structures thereof may be exposed to the third plug 65. That is, the top part of the multi-layered spacer is partially exposed. The first spacer 53, the sacrificial spacer 54, the second spacer 55, and the third spacer 52 may be partially exposed through the third plug 65.

The second plugs 64 may be etched to a specific depth to be self-aligned with the edge of the third contact plugs 65. At this time, the first spacers 53, the sacrificial spacers 54, the second spacers 55, and the third spacer 62 may be etched to be self-aligned with the edges of the third plugs 64. Furthermore, the plug isolation layer 58 and the bit line hard mask layer 52 may also be partially etched to a specific depth. Accordingly, recess parts 65A may be formed. When seen from a plane, part of the second plug 64 is covered with the third plug 65, and another part of the second plug 64 is exposed through a recess part 65A. An etching process for forming the recess parts 65A may be performed using the mask pattern 65B as an etch barrier. The top parts of the sacrificial spacers 54 may be exposed to the recess parts 65A.

Figure 6B:
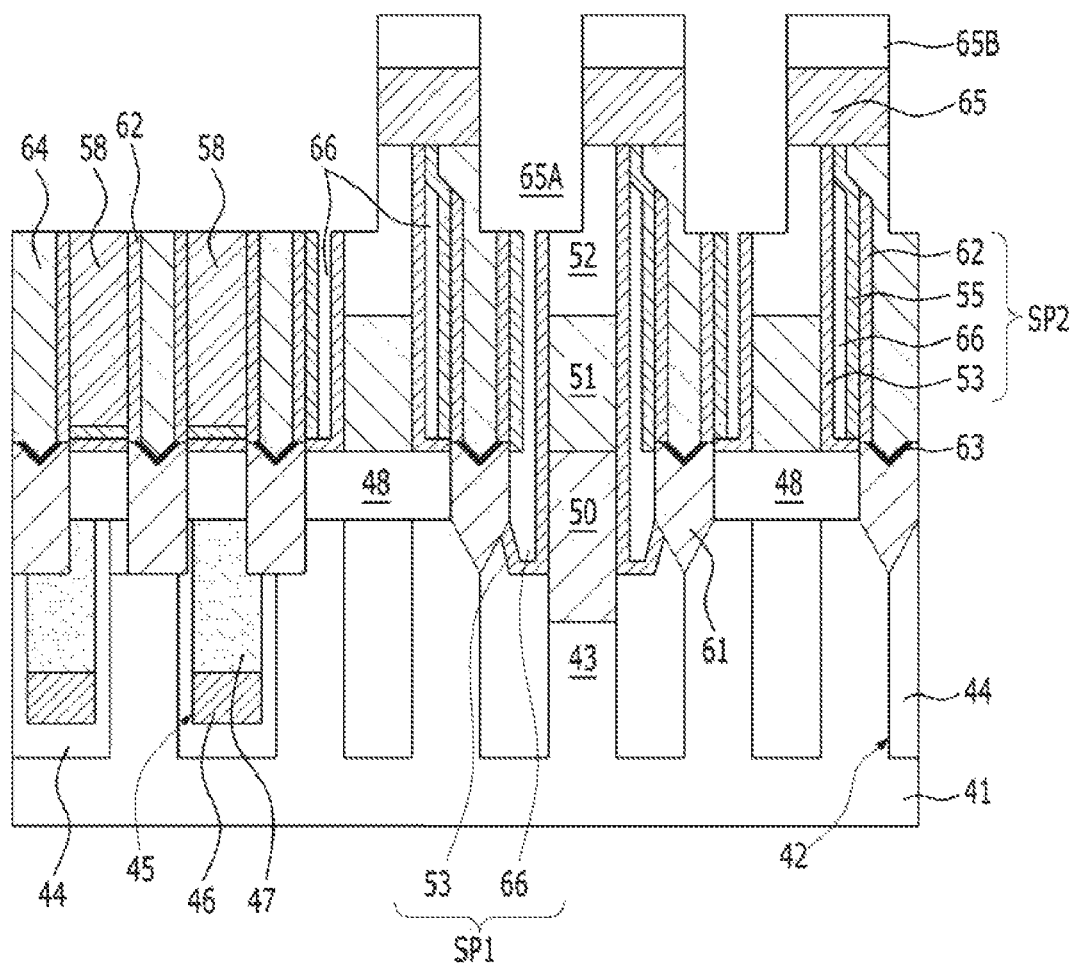

As illustrated in FIG. 6B, the sacrificial spacers 54 exposed under the recess parts 65A may be removed. A dip-out process may be performed to remove the sacrificial spacers 54. The dip-out process may include a cleaning process. The cleaning process may be performed using wet chemicals capable of removing the sacrificial spacers 54. The sacrificial spacers 54 under the third contact plugs 65 may be also removed by a strip process using the wet chemicals. The strip process may include cleaning after etching the third contact plug 65. As a result, an additional process for removing the sacrificial spacers 54 is not necessary.

The sacrificial spacers 54 may be removed by the dip-out process, and spaces occupied by the sacrificial spacers 54 remain as air gaps 66. The air gaps 66 may be formed on the periphery of the first contact plug 50 and also formed in parallel to the sidewalls of the bit line 51. The first spacer 53 protect the isolation region 44 and the interlayer dielectric layer 48 from being lost during the dip-out process.

As described above, the air gaps 66 may be formed on the periphery of the bit line 51 in addition to the periphery of the first contact plug 50. Accordingly, a first spacer structure SP1 having the first spacer 53 and the air gap 66 may be formed between the first contact plug 50 and the first plug 61. Since the first spacer 53 may include silicon nitride, the first spacer structure SP1 may have a nitride/air structure. A second spacer structure SP2, including the first spacers 53, the air gap 66, the second spacers 55, and the third spacers 62, may be formed between the bit line 51 and the second plug 64. The second spacer structure SP2 may have a nitride/air/nitride/nitride structure and may be formed because the first spacer 53, the second spacer 55, and the third spacer 62 may include silicon nitride. In the second spacer structure SP2, part of the air gap 66 is capped with the first spacer 53 and the second spacer 55.

Figure 6C:
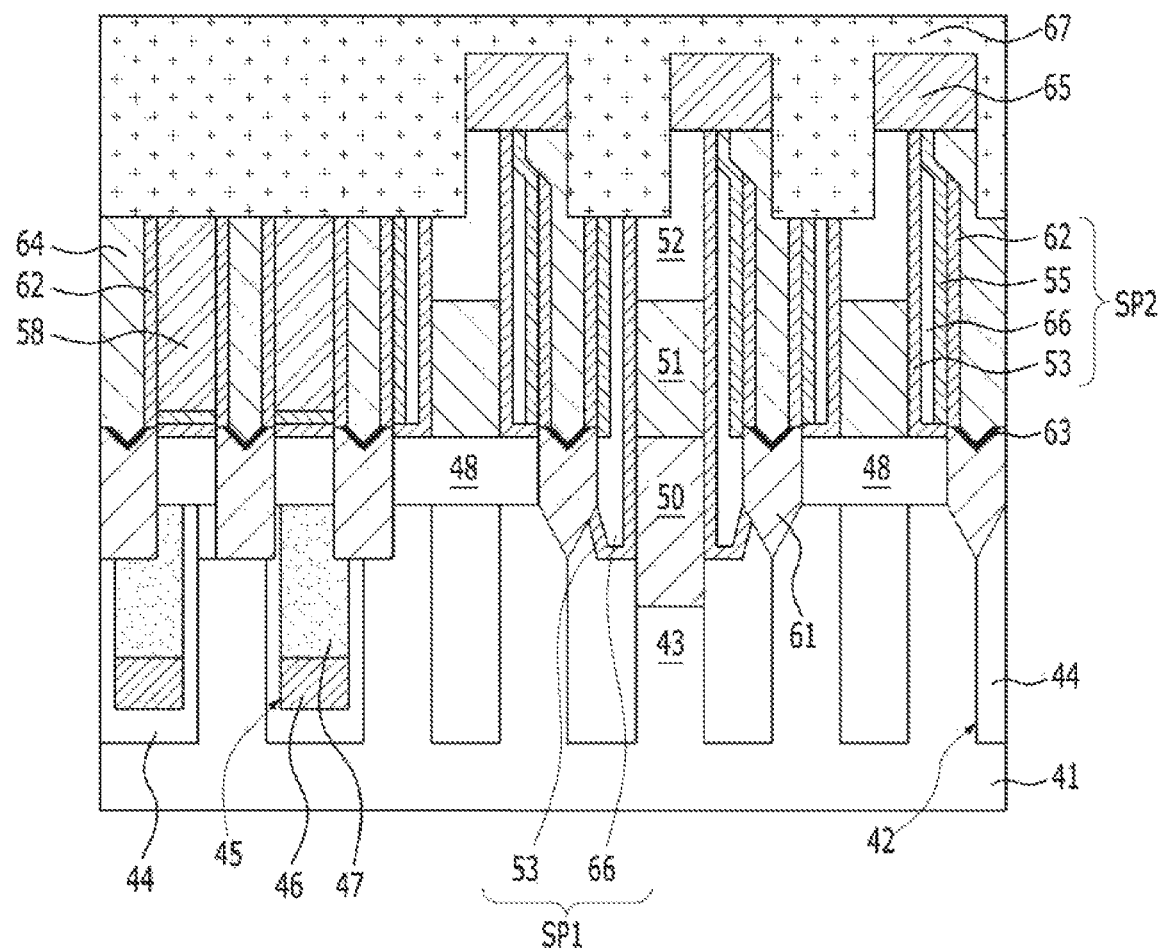

As illustrated in FIG. 6C, after removing the mask pattern 65B, a capping layer 67 may be formed. The capping layer 67 includes dielectric materials. The capping layer 67 may include a material having poor step coverage. The capping layer 67 may be formed by a plasma-enhanced chemical vapor deposition (PECVD). As a result, the top parts of the air gaps 66 may be capped. The capping layer 67 may include silicon oxide or silicon nitride. The capping layer 67 may include silicon nitride formed via PECVD. The capping layer 67 fills the recess parts 65A and also caps the top parts of the air gaps 66. Furthermore, the capping layer 67 covers the top parts of the third contact plugs 65. The capping layer 67 may be used as an etch-stop layer in a subsequent etching process.

As described above, part of the air gap 66 is capped with the second spacer 55, and the remainder of the air gap 66 is capped with the capping layer 67.

Figure 6D:
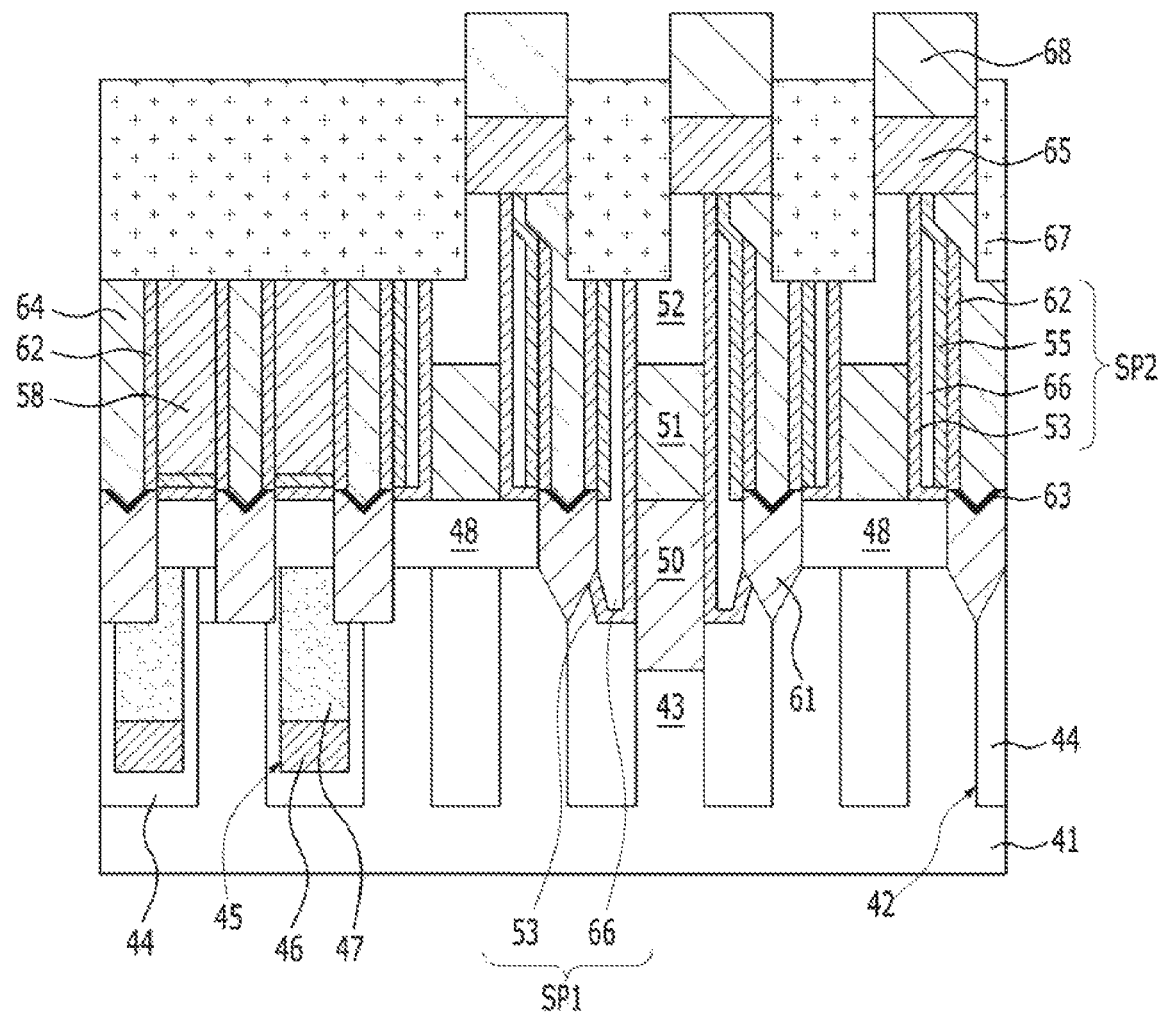

As illustrated in FIG. 6D, a memory element may be formed over the third contact plug 65. The memory element may include a storage node 68. For example, in order to form the storage node 68, a mold layer (not illustrated) may be formed on the capping layer 67, and an opening through which the third contact plug 65 is exposed may be formed by etching the mold layer and the capping layer 67. The storage node 68 may be formed in the opening, and the mold layer is then stripped out. Although not illustrated, a dielectric layer and a plate node may be formed over the storage node 68. The storage node 68 has a pillar shape. In other exemplary embodiments, the storage node 68 may have a cylindrical shape. An overlap margin can be secured because the storage node 68 may be formed over the third plug 65.

As described above, an SNC plug formed between the substrate 51 and the storage node 68 may include the second contact plug and the third contact plug 65. The second contact plug may include the first plug 61 and the second plug 64. The ohmic contact layer 63 may be formed between the first plug 61 and the second plug 64.

In accordance with the aforementioned embodiment, parasitic capacitance may be reduced between the air gap 66, which may be formed between the SNC plug and the bit line 51 and between the first contact plug 50 and the SNC plug. Furthermore, a sensing margin may be reduced because the parasitic capacitance is reduced.

An area of the SNC plug may be increased because the air gaps 66 may be formed in parallel to the sidewalls of the bit line 51. That is, contact resistance may be reduced because the air gaps surround the sidewalls of the SNC plug.

The ohmic contact layer 63 may reduce contact resistance between the first plug 61 and the second plug 64. As a result, operating speed of the semiconductor device can be enhanced because the write recovery time tWR is improved.

Figure 7:
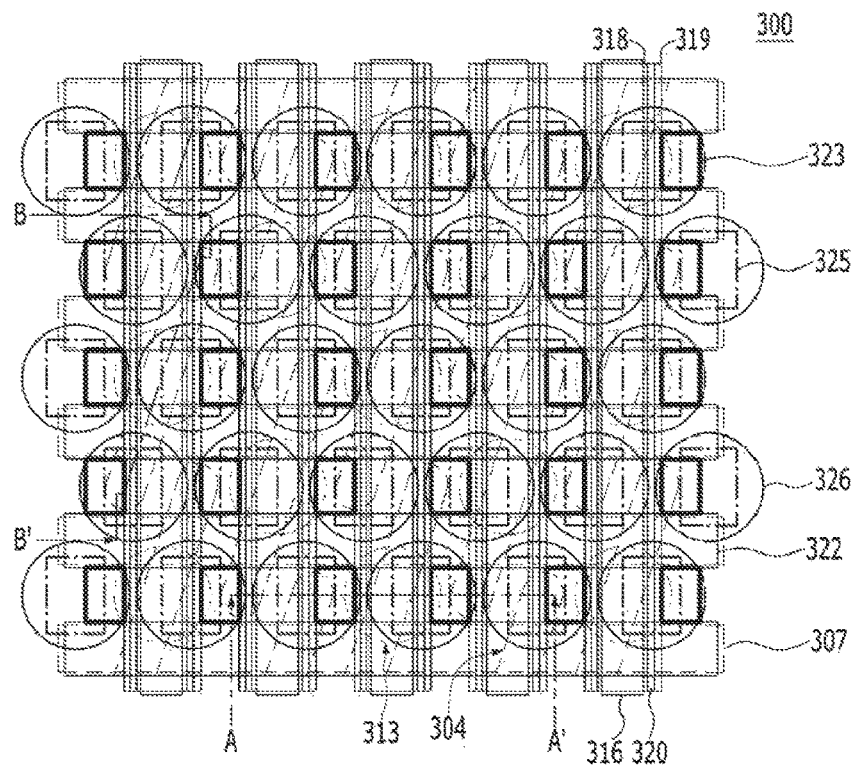
FIG. 7 is a plan view illustrating a semiconductor device in accordance with a third embodiment of the present invention.
Figure 8A:
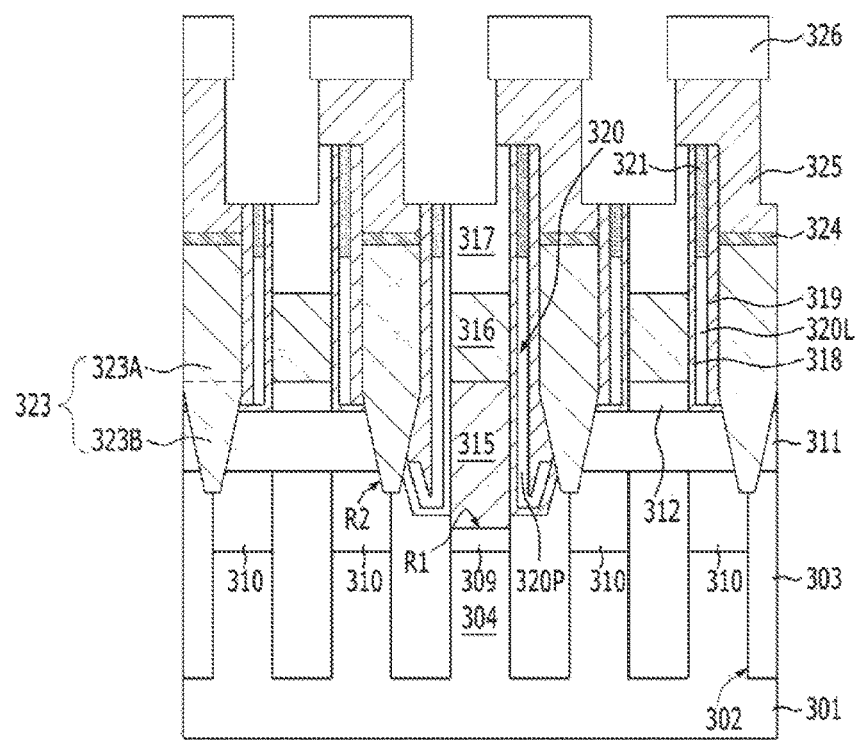
FIG. 8A is a cross-sectional view taken along line A-A' of FIG. 7.
Figure 8B:
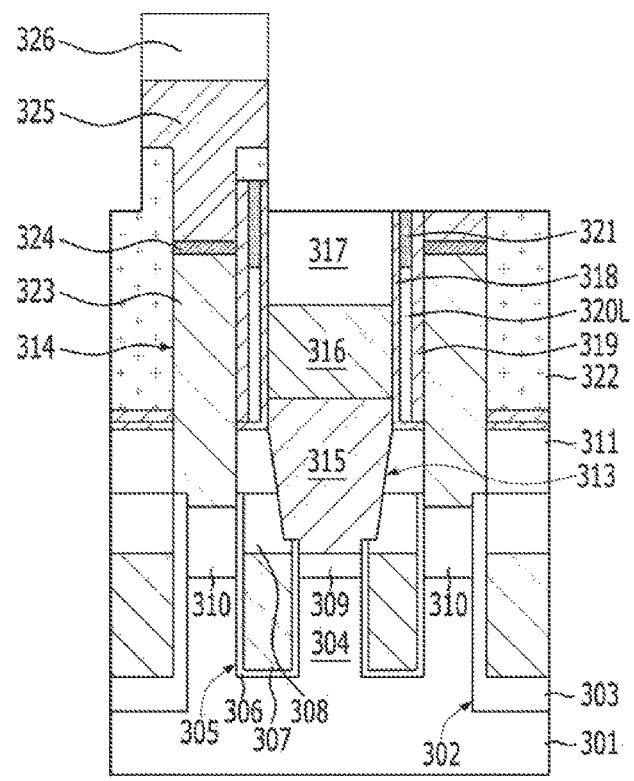
FIG. 8B is a cross-sectional view taken along line B-B' of FIG. 7.
Figure 8C:
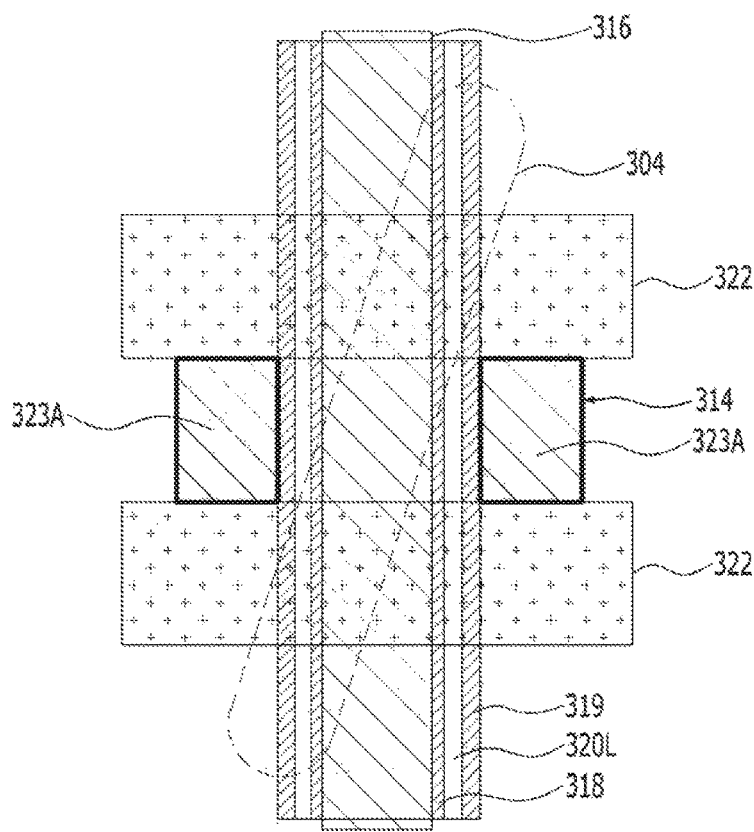
FIG. 8C is a detailed diagram illustrating a line-type air gap.
Figure 8D:
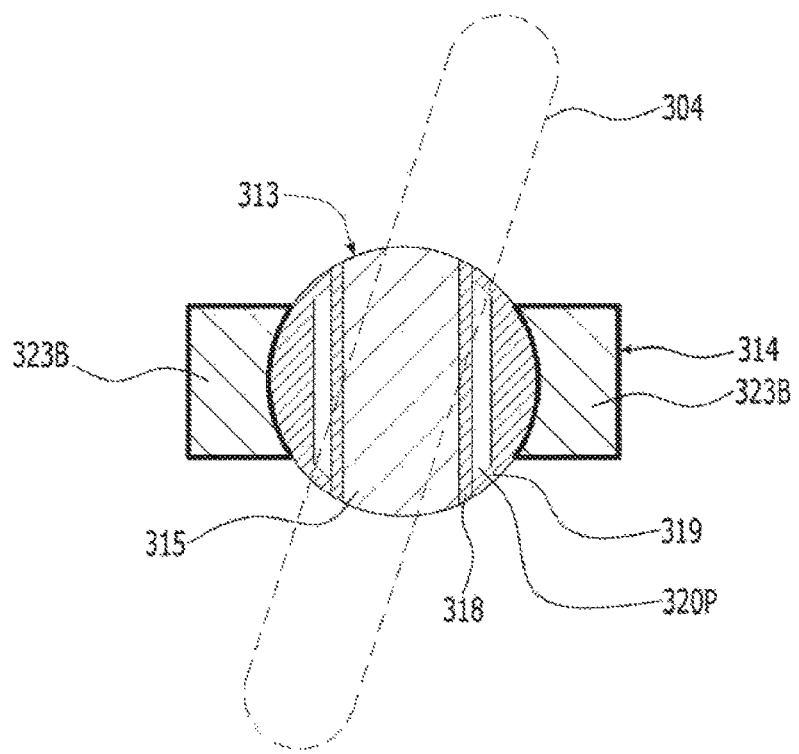
FIG. 8D is a detailed diagram illustrating a plug-type air gap.

FIG. 7 is a plan view illustrating a semiconductor device in accordance with a third embodiment of the present invention. FIG. 8A is a cross-sectional view taken along line A-A' of FIG. 7. FIG. 8B is a cross-sectional view taken along line B-B' of FIG. 7. FIG. 8C is a detailed diagram illustrating a line-type air gap. FIG. 8D is a detailed diagram illustrating a plug-type air gap.

The semiconductor device 300 includes a plurality of buried word lines 307, a plurality of bit lines 316, and memory elements 326. The buried word lines 307 are formed within a substrate 301. The bit lines 316 are formed over the substrate 301. The buried word lines 307 and the bit lines 316 are arranged to cross each other. First plugs 315 are formed between the bit lines 316 and the substrate 301.

A stack structure of a second plug 323, an ohmic contact layer 324, and a third plug 325 is formed between each of the memory elements 326 and the substrate 301. The second plug 323 is formed between adjacent bit lines 316. A spacer having an air gap 320 is formed between the bit line 316 and the second plug 323. The spacer includes a first spacer 318 and a second spacer 319. The air gap 320 is formed between the first spacer 318 and the second spacer 319. The air gap 320 includes a line-type air gap 320L and a plug-type air gap 320P. The line-type air gap 320L is formed between the bit line 316 and the upper part 323A of the second plug 323. The plug-type air gap 320P is formed between the first plug 315 and the lower part 323B of the second plug 323. The plug-type air gaps 320P are formed at both sidewalls of the first plug 315. The first spacer 318 and the second spacer 319 are formed on both sidewalls of the bit line 316, and are extended up to both sidewalls of the first plug 315. A portion of each of the first spacer 318 may be extended to cover the isolation region 303 and the interlayer dielectric layer 311. As a result, the isolation region 303 and an interlayer dielectric layer 311 may be protected from being lost during a dip-out process for forming air gaps 320.

The semiconductor device 300 is described in detail below.

Isolation layers 303 are formed in the substrate 301. Each of the isolation layers 303 is formed in an isolation trench 302. The isolation layers 303 define a plurality of active regions 304.

Gate trenches 305 that cross the active regions 304 and the isolation layers 303 are formed.

A gate dielectric layer 306 is formed on a surface of the gate trench 305.

The buried word line 307 that partially buries the gate trench 305 is formed on the gate dielectric layer 306.

A sealing layer 308 is formed over the buried word line 307.

A first impurity region 309 and a second impurity region 310 are formed in the active region 304.

The first plugs 315 are formed over the substrate 301. The substrate 301 includes recessed first surfaces R1. A first plug 315 is formed on the first surface R1. The first plug 315 contacts the first impurity region 309. The first plug 315 is formed within a first opening 313. The first opening 313 is formed in the interlayer dielectric layer 311. The interlayer dielectric layer 311 is formed over the substrate 301. The first opening 313 is a contact hole through which the first impurity region 309 is exposed. The first plug 315 may be called a bit line contact plug.

A bit line structure is formed over each of the first plugs 315. The bit line structure includes the bit line 316 and a bit line hard mask 317 formed on the bit line 316. The bit line structure has a line-type extending in a direction that crosses the buried word line 307. Part of the bit line 316 is coupled to the first plug 315. The bit line 316 and the first plug 315 have the same line width. Accordingly, the bit line 316 extends in any one direction while covering the first plug 315. The bit line 316 may be formed over the etch stop layer 312 and extend further. The etch stop layer 312 is formed over the interlayer dielectric layer 311, and has a line-type having the same line width as the bit line 316.

A storage node contact plug is formed between the bit line structures. The storage node contact plug is coupled to the second impurity region 310. The storage node contact plug includes the second plug 323, the ohmic contact layer 324, and the third plug 325. The second plug 323 may be formed within a second opening 314. The substrate 301 has recessed second surfaces R2. The second plug 323 is formed on each of the second surfaces R2. The second opening 314 is a contact hole through which the second impurity region 310 is exposed. The second plug 323 is a silicon plug including, for example, polysilicon. The third plug 325 is a metal plug including, for example, tungsten. The ohmic contact layer 324 is formed between the second plug 323 and the third plug 325. The ohmic contact layer 324 includes a metal silicide layer. Contact resistance can be reduced between the ohmic contact layer 324, which is formed between the second plug 323, and the second plug 325. The third plug 325 has an extension part that overlaps with the upper part of the bit line structure. Accordingly, the overlap margin of the memory element 326 can be secured. When viewed in the direction along which the bit lines 316 are extended, the plug isolation layer 322 may separate storage node contact plugs.

The air gaps 320 are formed at both sidewalls of the bit line structure. Each of the air gaps 320 includes the plug-type air gap 320P and the line-type air gap 320L. The plug-type air gaps 320P are formed at both sidewalls of the first plug 315. The line-type air gaps 320L are formed at both sidewalls of the bit line 316. The line-type air gap 320L and the plug-type air gap 320P are coupled together. The plug-type air gap 320P is formed between the first plug 315 and the lower part 323B of the second plug 323. The line-type air gap 320L is formed between the bit line 316 and the upper part 323A of the second plug 323.

The upper part of each of the air gaps 320 is capped by a capping spacer 321. The memory element 326 is formed over the third plug 325. The memory element 326 may include a capacitor including a storage node. In another embodiment, a memory element may be coupled to the top of the third plug 325.

As described above, the semiconductor device 300 includes transistors including the buried word lines 307 and the bit lines 316. The substrate 301 and the bit lines 316 are electrically coupled together by the first plugs 315. The first plug 315 and the bit line 316 are adjacent to the stack structure of the second plug 323, the ohmic contact layer 324, and the third plug 325.

The line-type air gap 320L is formed between the second plug 323 and the bit line 316. Accordingly, parasitic capacitance between the bit line 316 and the second plug 323 may be reduced. Furthermore, the plug-type air gap 320P is formed between the first plug 315 and the second plug 323. Accordingly, parasitic capacitance between the first plug 315 and the second plug 323 may be reduced.

If the first spacer 318 and the second spacer 319 include silicon nitride, a spacer structure having a "nitride-air-nitride" is formed.

In accordance with the present embodiment, parasitic capacitance may be reduced between the line-type air gap 320L, which is formed between the bit line 316 and the second plug 323, and the plug-type air gap 320P, which is formed between the first plug 315 and the second plug 323. Accordingly, the operating speed of a memory cell may be improved.

In a comparative example, the air gap may be formed only between the bit line and the storage node contact plug. Furthermore, in another comparative example, the air gap may be formed only between the bit line contact plug and the storage node contact plug. However, the comparative examples have limited ability to improve the operating speed of memory cells because they have a lower parasitic capacitance reduction effect than the present embodiment.

Figure 9A:
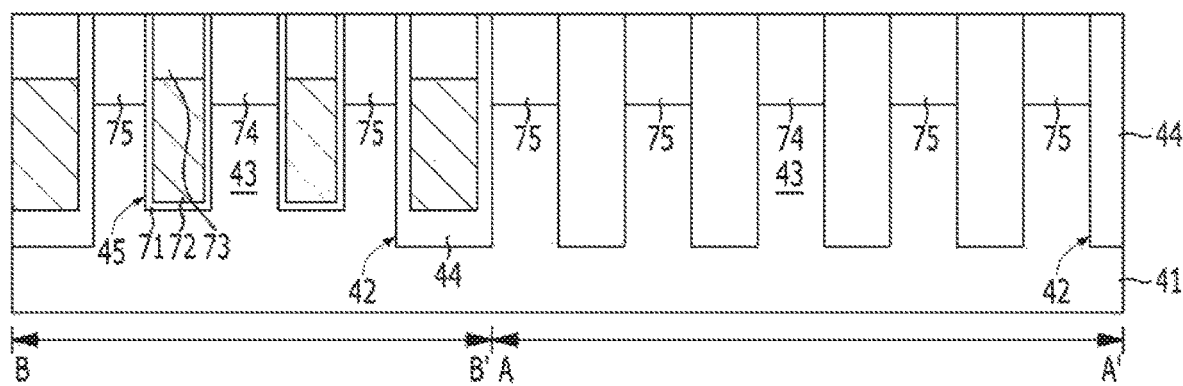
FIGS. 9A to 9P are diagrams illustrating an example of a method of fabricating the semiconductor device according to line A-A' and line B-B' of FIG. 7.
Figure 9B:
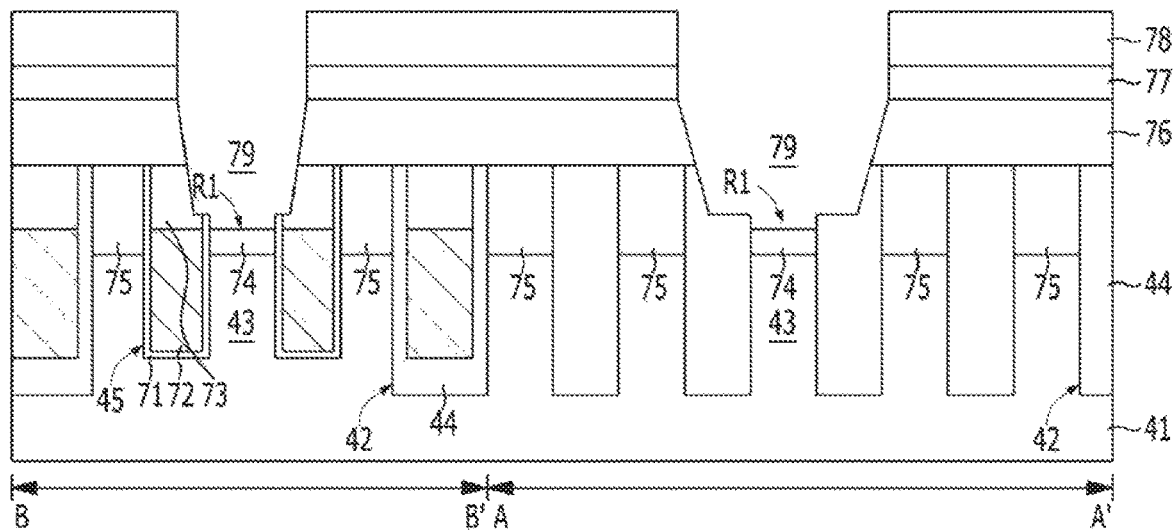
Figure 9C:
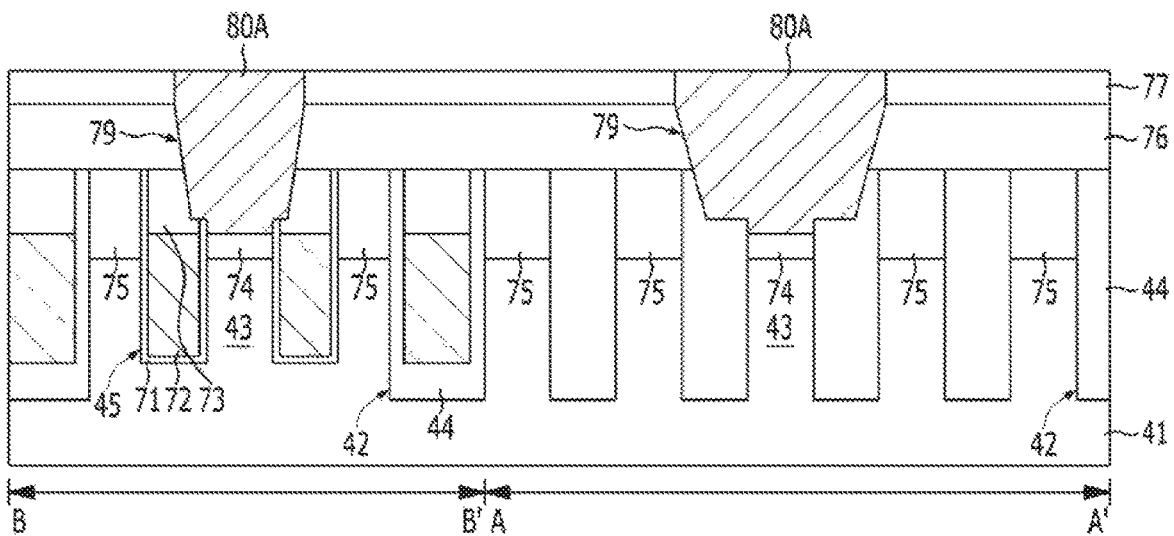
Figure 9D:
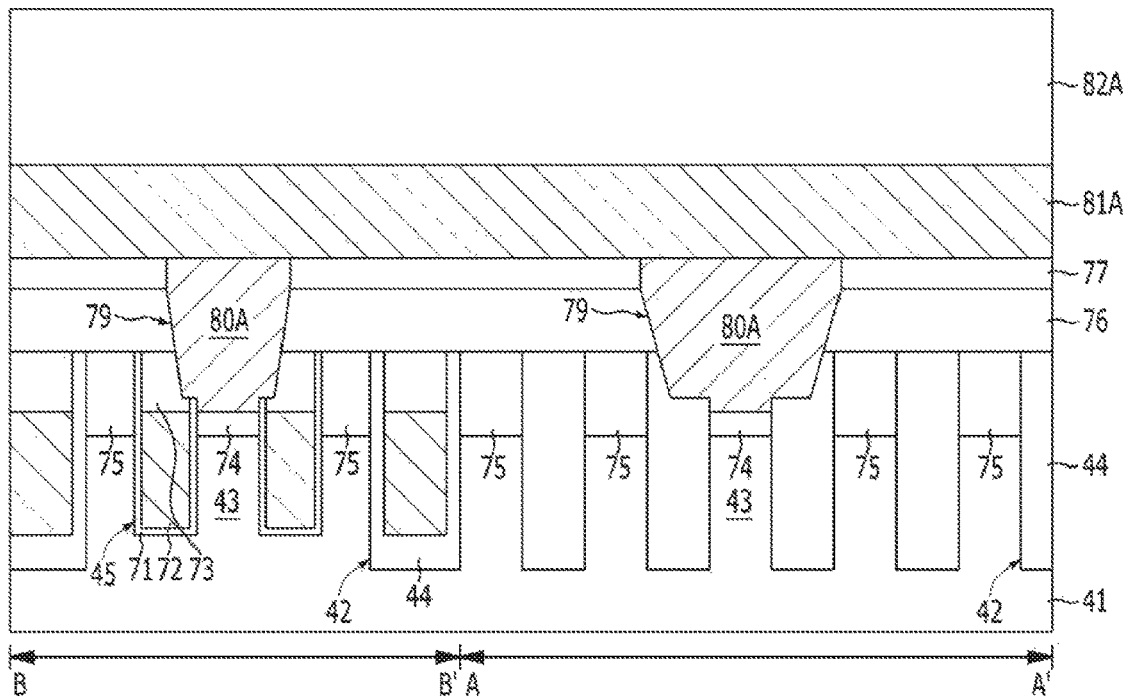
Figure 9E:
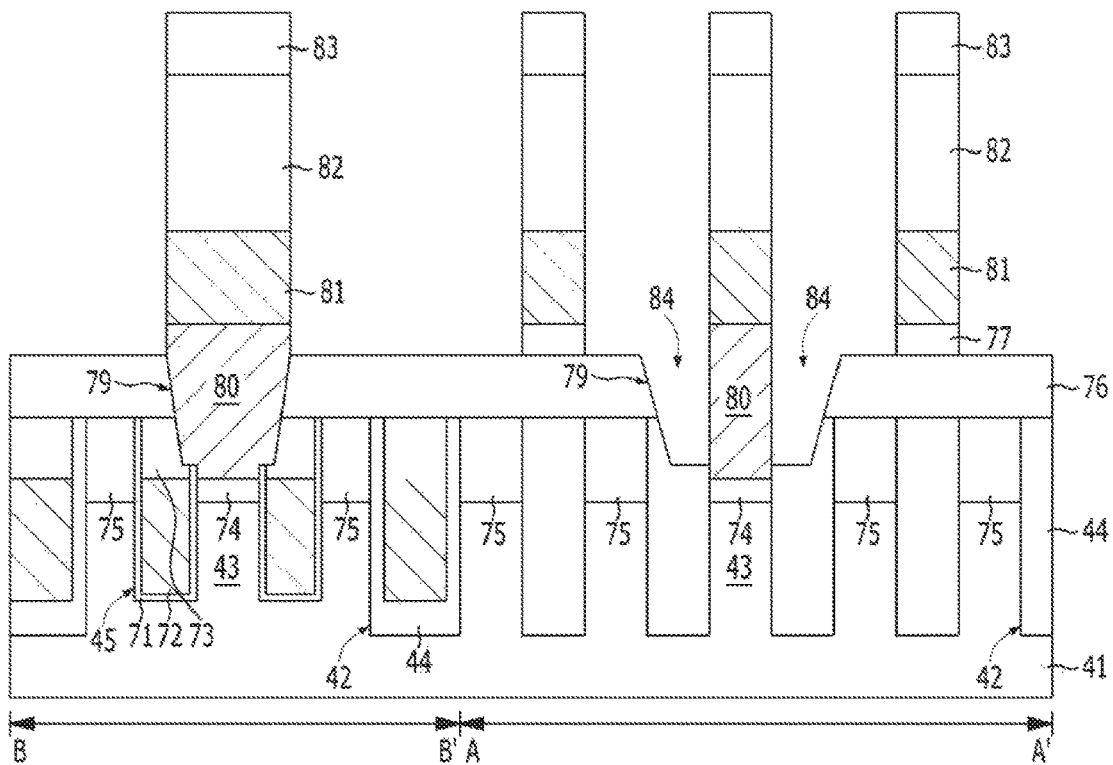
Figure 9F:
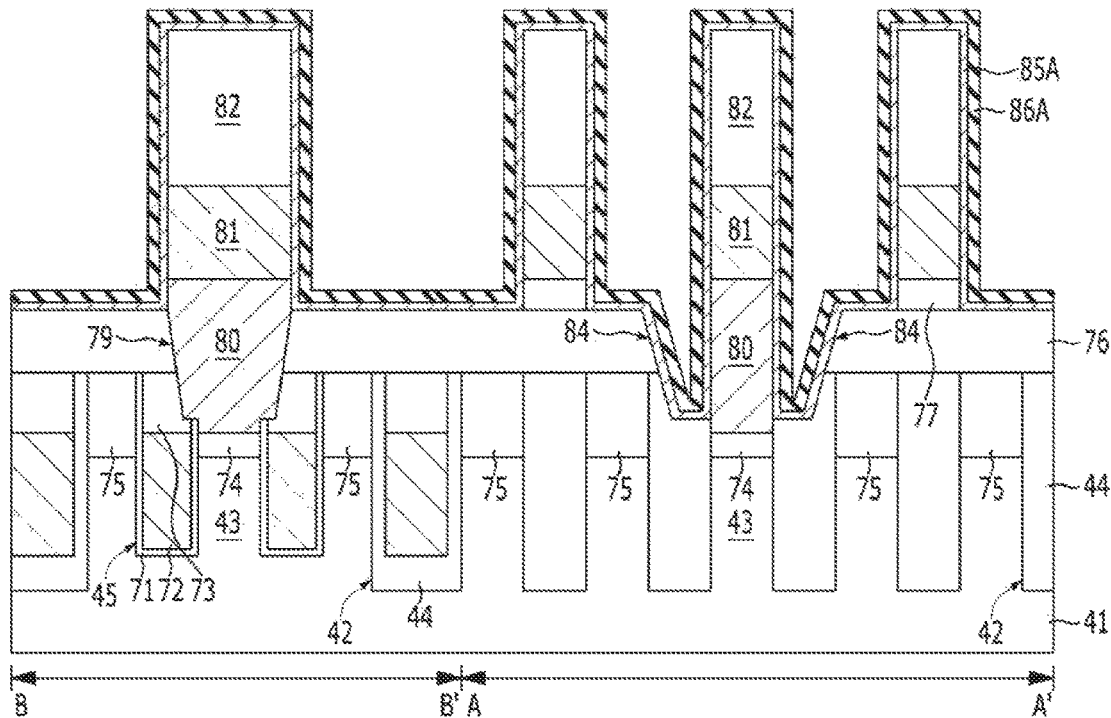
Figure 9G:
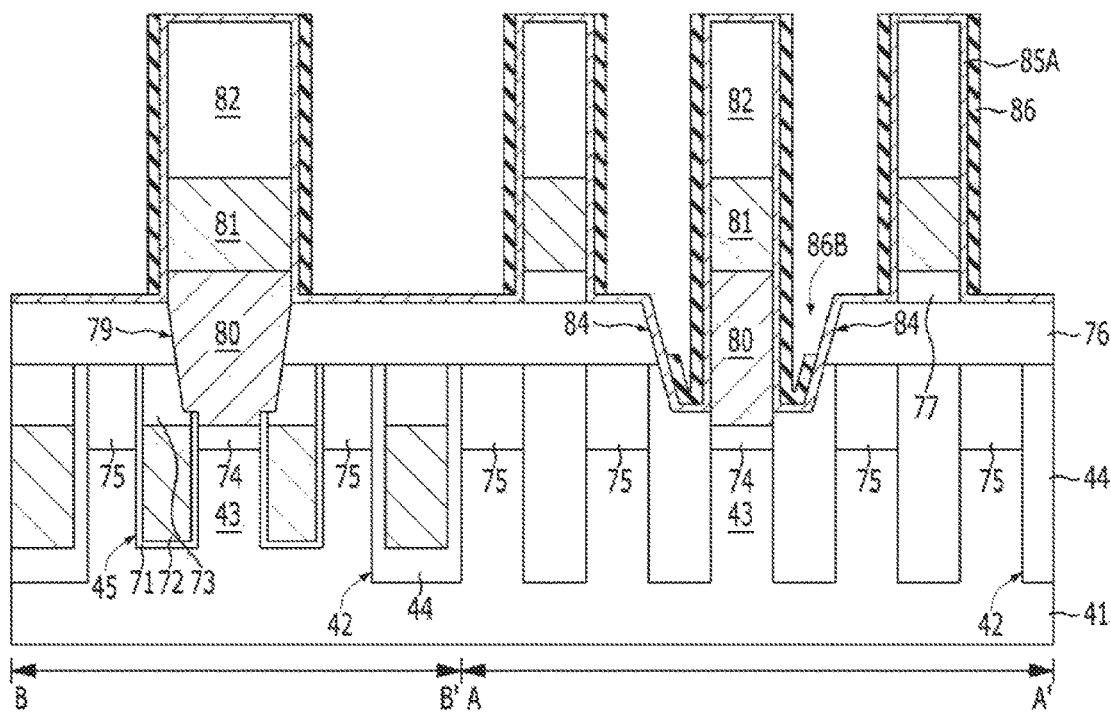
Figure 9H:
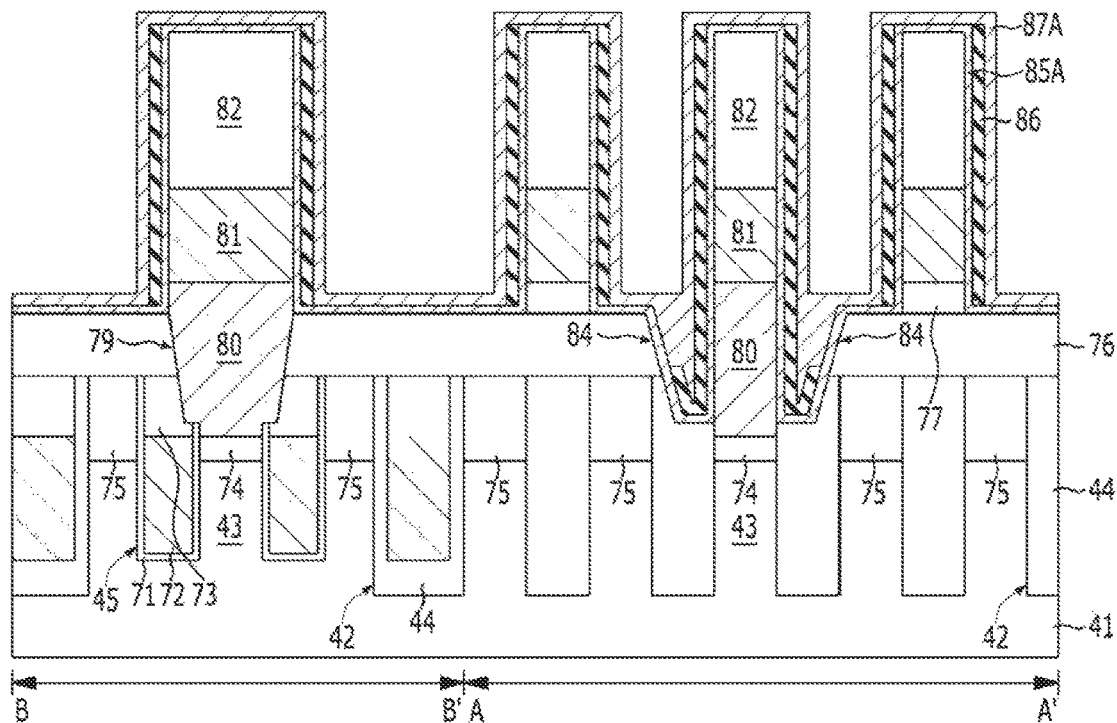
Figure 9I:
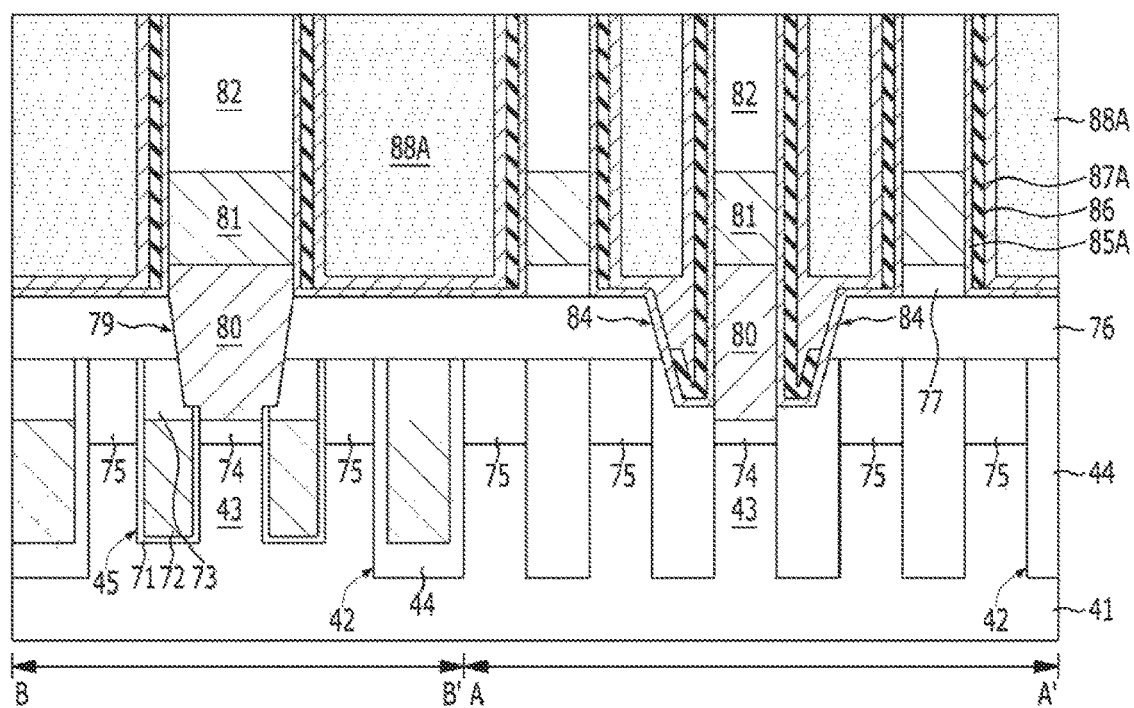
Figure 9J:
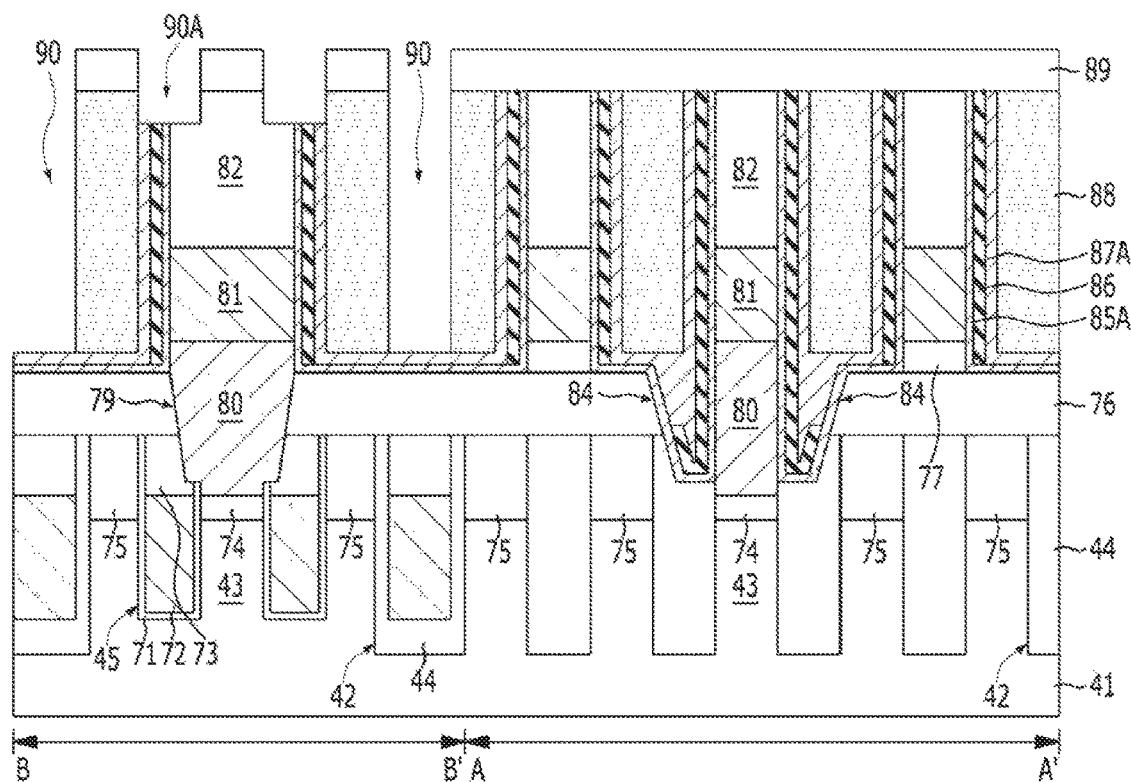
Figure 9K:
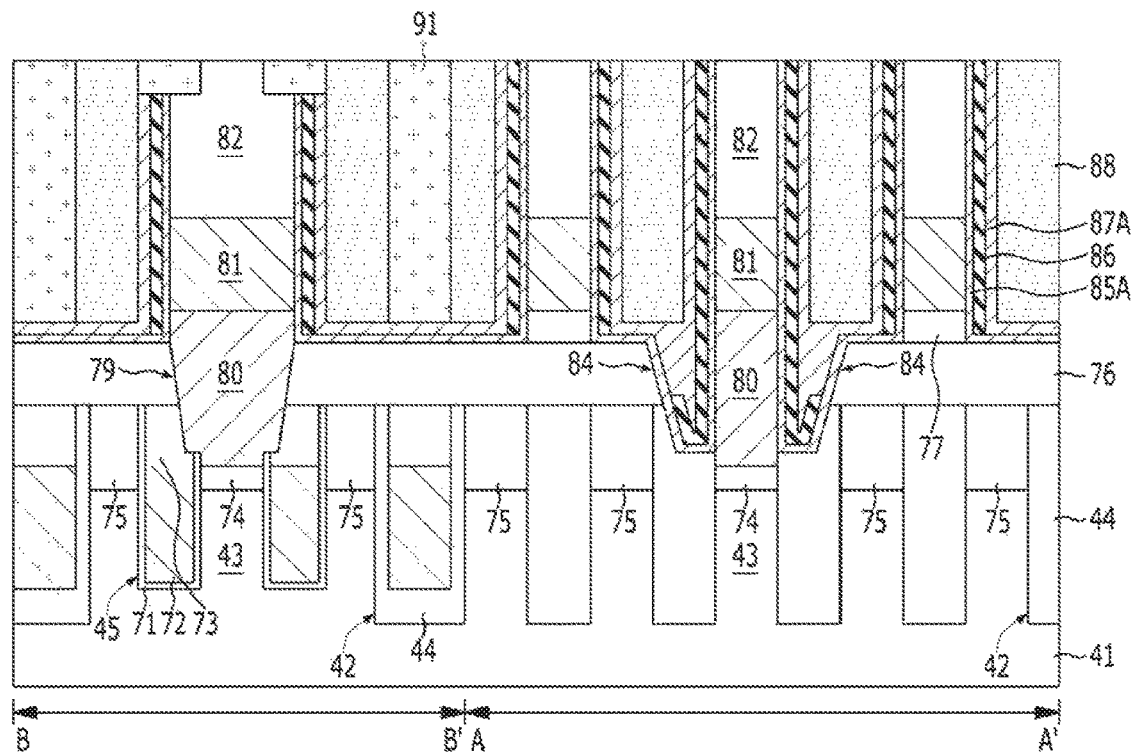
Figure 9L:
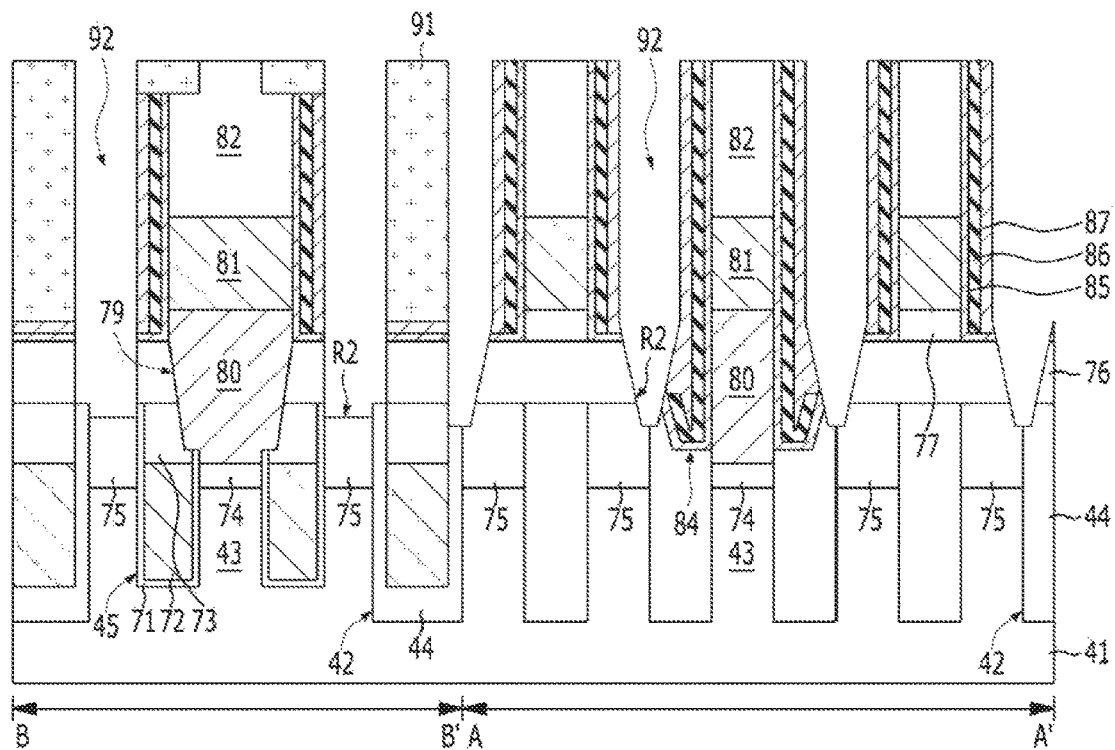
Figure 9M:
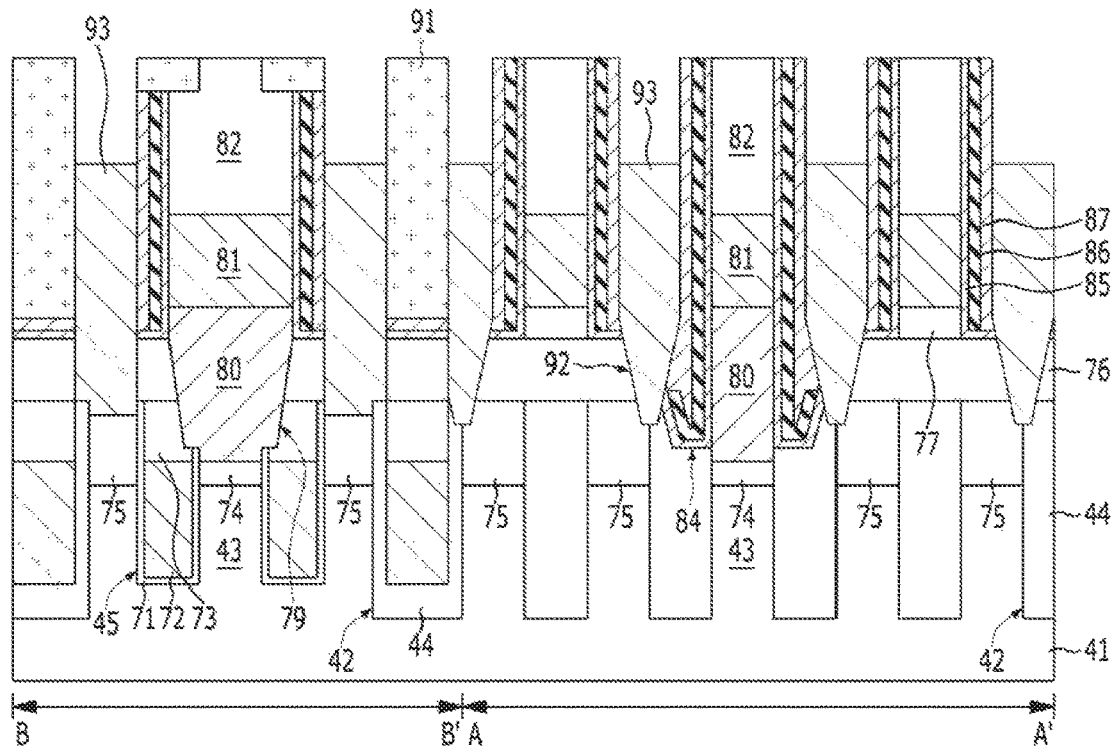
Figure 9N:
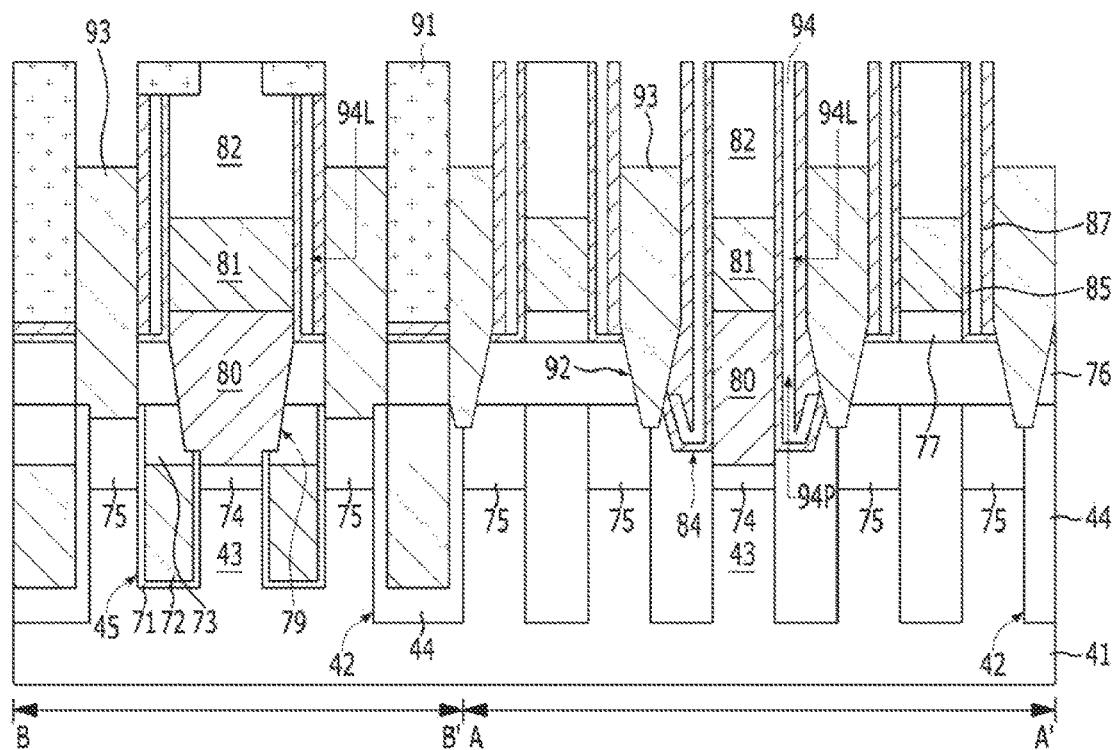
Figure 9O:
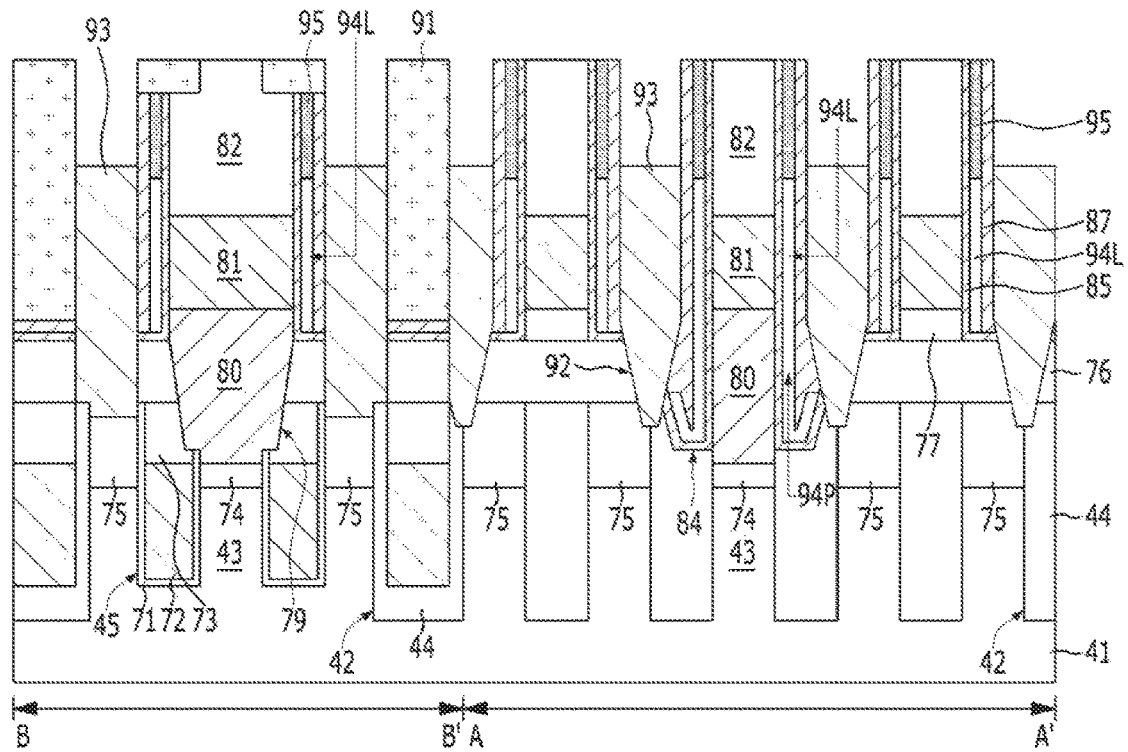
Figure 9P:
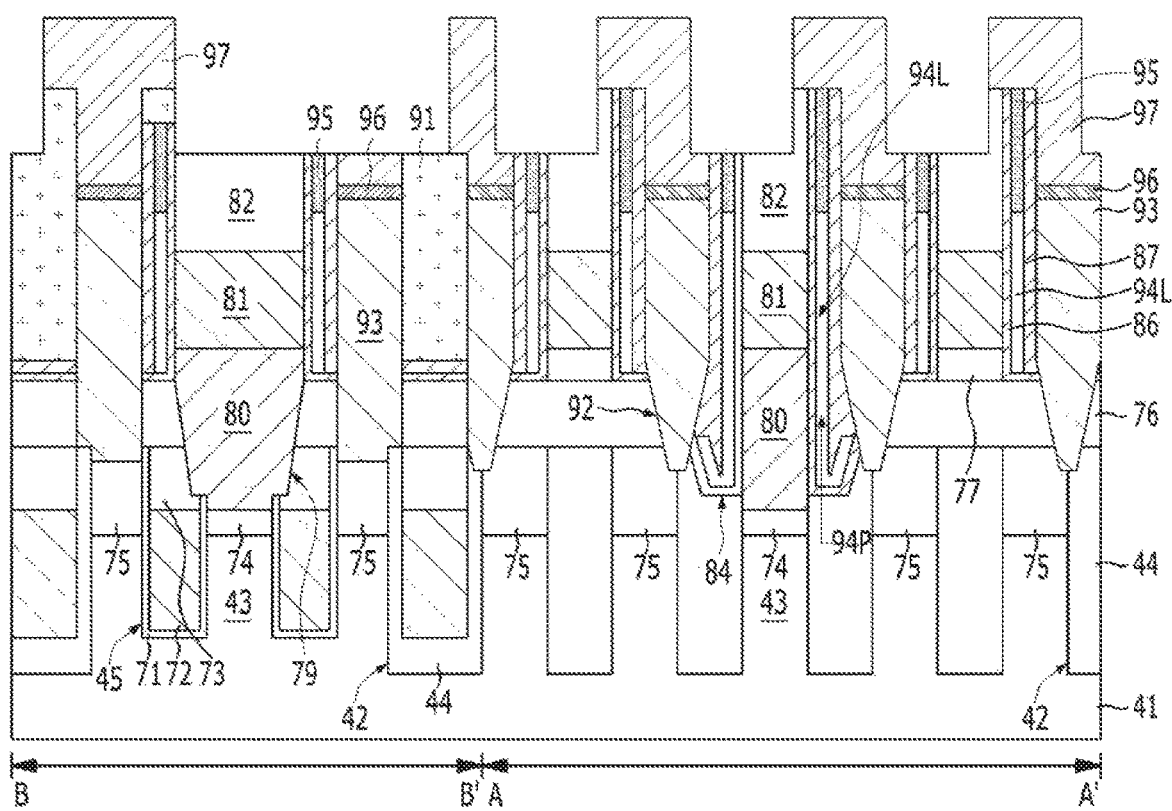

FIGS. 9A to 9P are diagrams illustrating an example of a method of fabricating the semiconductor device according to line A-A' and line B-B' of FIG. 7. Some elements of the semiconductor device are described with reference to the fabrication method in accordance with the second embodiment of the present invention.

As illustrated in FIG. 9A, the isolation layers 44 are formed in the substrate 41. The substrate 41 includes semiconductor materials. The substrate 41 may include a silicon substrate, a silicon germanium substrate, or a silicon on insulator (SOI) substrate. The substrate 41 may include memory cell regions and peripheral circuit regions. The isolation layer 44 may be formed by a shallow trench isolation (STI) process. The isolation layer 44 is formed in an isolation trench 42. The isolation layers 44 define active regions 43. The active region 43 may be in the shape of an island having a short axis and a long axis. The isolation layers 44 separate the plurality of active regions 43. The isolation layer 44 may include silicon nitride or silicon oxide.

A transistor including a buried word line 72 is formed in each of the memory cell regions of the substrate 41. The buried word lines 72 are buried in the substrate 41. The buried word line 72 is formed within a gate trench 45. The gate trench 45 having a specific depth is formed in the substrate 41. The gate trench 45 has a shallower depth than the isolation trench 42. The gate trenches 45 may have a line-type extended in any one direction. The gate trenches 45 may be formed by etching the active regions 43 and the isolation layers 44. The gate trenches 45 are formed to intersect the active regions 43 and the isolation layers 44. Part of the gate trench 45 is formed within the active region 43, and the remainder of the gate trench 45 is formed within the isolation layer 44. In another embodiment, part of the gate trench 45, that is, a part formed within the isolation layer 44, may have a deeper depth than part formed within the active region 43. Accordingly, a fin channel region (not illustrated) may be formed.

A gate dielectric layer 71 may be formed on a surface of the gate trench 45. The gate dielectric layer 71 may be formed by thermal oxidation. In another embodiment, the gate dielectric layer 71 may be formed by chemical vapor deposition (CVD) or atomic layer deposition (ALD). The gate dielectric layer 71 may include at least one selected from high-k materials, oxide, nitride, or oxide nitride. The high-k materials may be insulating materials having a higher dielectric constant than oxide and nitride. For example, the high-k materials may be at least one selected from metal oxides, such as hafnium oxide or aluminum oxide.

The buried word line 72 is formed on the gate dielectric layer 71. A sealing layer 73 is formed over the buried word line 72. The buried word line 72 may be applied by forming a metal-containing layer so that the gate trenches 45 are filled and then performing etch-back. The metal-containing layer may include metal, such as titanium, tantalum, or tungsten, as a main component. The metal-containing layer may include at least any one of tantalum nitride (TaN), titanium nitride (TIN), tungsten nitride (WN), or tungsten (W). For example, the buried word line 72 may have a two-layer structure, such as TiN/W in which tungsten (W) is stacked on titanium nitride (TiN). In another embodiment, the buried word line 72 may include a work function metal layer. The sealing layer 73 fills the gate trench 45 over the buried word line 72. The sealing layer 73 may function to protect the buried word line 72 from subsequent processes. The sealing layer 73 may include insulating materials. The sealing layer 73 may include silicon nitride. After forming the sealing layers 73, first impurity regions 74 and second impurity regions 75 may be formed in the active regions 43. The first impurity region 74 and the second impurity region 75 may be called a source region and a drain region. As a result, a buried gate type transistor including the buried word line 72 is formed in the memory cell region.

As illustrated in FIG. 9B, an interlayer dielectric layer 76 is formed over the substrate 41. An etch stop layer 77 is formed over the interlayer dielectric layer 76. The interlayer dielectric layer 76 may include a stack structure of silicon oxide, silicon nitride, or silicon oxide and silicon nitride. The etch stop layer 77 may include silicon nitride.

First openings 79 are formed. The first openings 79 are formed by etching the etch stop layer 77 and the first interlayer dielectric layer 76 using a first mask pattern 78 as an etch mask. The first mask pattern 78 may include a photoresist pattern. The first opening 79 may have a hole-type when viewed from a plane. Part of the substrate 41 is exposed by the first openings 79. Each of the first openings 79 may have a diameter controlled to a specific line width. The first opening 79 may have a circular or oval shape. The first opening 79 may be configured to expose part of the active region 43 between the buried word lines 72. For example, the first opening 79 exposes the first impurity region 74. The first opening 79 may be called a contact hole. In a subsequent process, a first plug is formed in the first opening 79. The first opening 79 has a diameter greater than the width of the short axis of the active region 43. Accordingly, in the etch process for forming the first openings 79, part of the isolation layer 44 and the sealing layer 73, which are close to the first impurity region 74, may also be etched.

The first impurity regions 74, exposed under the first openings 79, are recessed to a specific depth (refer to reference numeral R1). The recessed surface R1 of the first impurity region 74 is lower than a surface of the second impurity region 75. Accordingly, contact resistance between the first impurity region 74 and the first plug can be improved.

As illustrated in FIG. 9C, the first mask pattern 78 is removed. Next, preliminary first plugs 80A are formed. A method of forming the preliminary first plugs 80A is described below. First, a first conductive layer (not illustrated) that fills the first openings 79 is formed on the entire surface including the first openings 79. The first conductive layer is polished so that the surface of the etch stop layer 77 is exposed. Accordingly, the preliminary first plugs 80A, filling the respective first openings 79, are formed. The surface of the preliminary first plug 80A may have a height equal to or higher than the height of the surface of the etch stop layer 77. Thereafter, impurities may be doped into the preliminary first plugs 80A using a doping process, such as implantation. In the present embodiment, the preliminary first plug 80A may include polysilicon. In another embodiment, the preliminary first plug 80A may be made of a metal-containing material.

As illustrated in FIG. 9D, a second conductive layer 81A and a hard mask layer 82A are stacked over the preliminary first plugs 80A and the etch stop layer 77. The second conductive layer 81A includes a metal-containing material. The second conductive layer 81A may include metal, metal nitride, or metal silicide or a combination of them. In the present embodiment, the second conductive layer 81A may include tungsten (W) or a stack structure (TiN/W) of titanium nitride (TiN) and tungsten (W). The hard mask layer 82A is made of insulating materials. The hard mask layer 82A may include silicon oxide or silicon nitride. In the present embodiment, the hard mask layer 82A is made of silicon nitride.

As illustrated in FIG. 9E, bit line structures and first plugs 80 are formed.

A second mask pattern 83 is formed on the hard mask layer 82A. The second mask pattern 83 includes a photoresist pattern. The second mask patterns 83 have a line-type extended in any one direction. The second mask pattern 83 may have a line width smaller than the diameter of the first opening 79. The hard mask layer 82A and the second conductive layer 81A are etched using the second mask pattern 83 as an etch mask. Accordingly, the bit line structures, each including a bit line 81 and a bit line hard mask 82, are formed. The etch process of the second conductive layer 81A for forming the bit lines 81 are stopped at the etch stop layer 77. The bit line hard masks 82 are formed by etching the hard mask layer 82A.

The etch stop layer 77 is etched using the second mask pattern 83 as an etch mask. The etch stop layer 77 may be etched with the same line width as the bit line 81.

The preliminary first plugs 80A are etched using the second mask pattern 83 as an etch mask. Accordingly, first plugs 80 are formed. The preliminary first plugs 80A may be etched to the same line width as the bit line 81. First plugs 80 are formed over the first impurity regions 74. Each of the first plugs 80 couple the first impurity region 74 and the bit line 81. The first plug 80 is formed within the first opening 79. The line width of the first plug 80 is smaller than the diameter of the first opening 79. Accordingly, gaps 84 are formed in the periphery of the first plugs 80. The gap 84 is not formed in the periphery of the first plug 80 in the direction along which the bit lines 81 extend. That is, the gap 84 is formed in the periphery of the first plugs 80 in the direction that crosses the bit lines 81.

The gap 84 is formed within the first opening 79 because the first plug 80 is formed as described above. The reason for this is that the first plug 80 is etched to be smaller than the diameter of the first opening 79. The gap 84 is not formed in a surrounding type that surrounds the first plug 80, but is independently formed on both sidewalls of the first plug 80. As a result, a single first plug 80 and a pair of the gaps 84 are formed in the first opening 79, and the first plug 80 separates the pair of gaps 84.

The bit line structures extend in any one direction while covering the first plugs 80. For example, the bit line structures may be extended in a direction that intersects the buried word lines 72. The bit lines 81 are extended in a line type over the etch stop layer 77, and part of the bit line 81 is coupled to the first plug 80.

Although not illustrated, after forming the bit line structures and the first plugs 80, or when forming the bit line structures and the first plugs 80, non-buried gate type transistors, each including a planar gate structure, may be formed in peripheral circuit regions. The planar gate structure may include a first electrode, a second electrode, and a gate hard mask layer. The first electrode is formed by etching the first conductive layer, used as the preliminary first conductive plug, and the second electrode is formed by etching the second conductive layer used as the bit line. The gate hard mask layer is formed by etching the hard mask layer. After forming the planar gate structures, a source region and a drain region may be formed in the substrate 41 of the peripheral circuit region. As described above, the non-buried gate type transistors are formed in the peripheral circuit regions.

As illustrated in FIG. 9F, the second mask pattern 83 is removed.

A first spacer layer 85A is formed on each of the bit line structures. The first spacer layer 85A is formed on the entire surface of the substrate 41, including the bit line structure. The first spacer layer 85A is made of dielectric materials. The first spacer layer 85A may include silicon oxide or silicon nitride. Hereinafter, in the present embodiment, the first spacer layer 85A will, for purposes of this example, be considered to include silicon nitride. The first spacer layer 85A is formed conformally over the surface of the gap 84 without filling the gap 84. The first spacer layer 85A protects the bit line 81 and the first plug 80 from subsequent processes.

A sacrificial spacer layer 86A is formed on the first spacer layer 85A. The sacrificial spacer layer 86A may be made of materials having an etch selectivity greater than the etch selectivity of the first spacer layer 85A. The sacrificial spacer layer 86A may include a metal nitride. Hereinafter, in the present embodiment, the sacrificial spacer layer 86A will, as an example, include titanium nitride. The sacrificial spacer layer 86A is formed conformally on the first spacer layer 85A without filling the gap 84.

As illustrated in FIG. 9G, sacrificial spacers 86 are formed. The sacrificial spacers 86 are formed by etching the sacrificial spacer layers 86A. The sacrificial spacer layers 86A may be etched by an etch-back process. The sacrificial spacers 86 are formed on the first spacer layer 85A at both sidewalls of the first plug 80. The height of the lower part of the sacrificial spacer 86 may be controlled so that the lower part of the sacrificial spacer 86 is formed in the gap 84. That is, the sacrificial spacer layer 86A is removed from a surface of the interlayer dielectric layer 76 other than the gap 84. The sacrificial spacers 86 may be extended so that they are formed at both sidewalls of the bit line structure. As a result, the sacrificial spacers 86 form spacers at both sidewalls of the bit line structure in addition to the first plug 80. The first spacer layer 85A may be exposed without being covered with the sacrificial spacers 86 at both sidewalls of part of the gap 84. This is called recessed gaps 86B.

As illustrated in FIG. 9H, a second spacer layer 87A is formed on the sacrificial spacers 86 and the first spacer layer 85A. The second spacer layer 87A is formed on the entire surface including the sacrificial spacers 86. In particular, the second spacer layer 87A may be formed on the entire surface while filling the recessed gaps 86B. The second spacer layer 87A includes dielectric materials. The second spacer layer 87A may include silicon oxide or silicon nitride. Hereinafter, in the present embodiment, the second spacer layer 87A will, as an example, be assumed to include silicon nitride.

As illustrated in FIG. 9I, a sacrificial layer 88A is formed. The sacrificial layer 88A is gap-filled between the bit line structures. The sacrificial layer 88A may include a silicon oxide. The sacrificial layer 88A may include a spin-on dielectric (SOD) material. Thereafter, the sacrificial layer 88A may be polished so that the tops of the bit line structures are exposed. Accordingly, the sacrificial layer 88A having a line-type is formed between the bit line structures. The sacrificial layers 88A are extended in parallel to the bit line structures. In the process of polishing the sacrificial layer 88A, the first spacer layers 85A, the sacrificial spacers 86, and the second spacer layers 87A may be polished so that the top surfaces of the bit line hard masks 82 are exposed.

As Illustrated in FIG. 9J, a third mask pattern 89 is formed. The third mask pattern 89 is patterned in a direction that intersects the bit line structures. The third mask pattern 89 has a line-type. The third mask pattern 89 may include a photoresist pattern.

A pre-isolation part 90 is formed in each of the sacrificial layers 88A. The sacrificial layers 88A are etched using the third mask pattern 89 as an etch mask. Accordingly, the pre-isolation parts 90 are formed. A sacrificial layer pattern 88 remains between adjacent pre-isolation parts 90.

When etching the sacrificial layers 88A, the tops of the bit line structures may be etched to a specific depth. That is, the bit line hard masks 82 may be etched to a specific depth. Accordingly, the sacrificial layers 88A exposed to the third mask pattern 89 are fully etched, and the bit line hard masks 82 of the bit line structures are partially etched. As a result, the pre-isolation parts 90 may have a line-type that intersects the bit line structure. Part 90A of the pre-isolation part 90 has a specific depth, and may formed in the bit line structure. The depth of the part 90A of the pre-isolation part 90 may be controlled so that the bit line 81 is not exposed through the part 90A of the pre-isolation part 90. The pre-isolation part 90 may be formed to overlap with the buried word line 72. In another embodiment, the pre-isolation part 90 may have a line width smaller than a line width of the buried word line 72.

As illustrated in FIG. 9K, the third mask pattern 89 is removed.

A plug isolation layer 91 is formed in each of the pre-isolation parts 90. The plug isolation layers 91 may be formed by forming silicon nitride, so that the pre-isolation parts 90 are gap-filled, followed by polishing. The plug isolation layers 91 have a line-type extended in a direction that intersects the bit line structures. The sacrificial layer pattern 88 remains in a space provided by the intersection of the plug isolation layer 91 and the bit line structure. The plug isolation layer 91 fills the pre-isolation part 90.

As illustrated in FIG. 9L, the sacrificial layer patterns 88 are removed. Spaces from which the sacrificial layer patterns 88 have been removed become second openings 92. The second opening 92 is formed between the plug isolation layers 91. The second openings 92 are isolated by the bit line structures and the plug isolation layers 91 and arranged. A dip-out process may be used to remove the sacrificial layer patterns 88. The dip-out process may selectively remove the sacrificial layer patterns 88 without removing the first spacer layers 85A, the sacrificial spacers 86, and the second spacer layers 87A. When viewed from a plane, the second opening 92 may have a quadrilateral shape.

Next, the lower parts of the second openings 92 are extended. To this end, the lower parts of the second spacer layers 87A and the lower parts of the first spacer layers 85A are selectively removed. Accordingly, second spacers 87 and first spacers 85 are formed. Thereafter, the interlayer dielectric layer 76 is self-aligned with the second spacers 87 and etched. Accordingly, the second impurity regions 75 under the second openings 92 are exposed. Thereafter, part of the second impurity regions 75 and part of the isolation layers 44 may be recessed to a specific depth (refer to reference numeral R2). The lower part of the second opening 92, that is, the recessed surface R2, may have a V-shaped profile attributable to a difference in the etch selectivity.

As the second openings 92 are extended as described above, spacer structures, each including the first spacer 85, the sacrificial spacer 86, and the second spacer 87, are formed on both sidewalls of the bit line 81 and the first plug 80. The first spacer 85 may seal the lower part of the sacrificial spacer 86 and the second spacer 87. The top of the sacrificial spacer 86 is externally exposed.

As illustrated in FIG. 9M, second plugs 93 are formed. Each of the second plugs 93 is recessed into the second opening 92. The second plug 93 may include a silicon-containing layer. The second plug 93 may include a polysilicon layer. The polysilicon layer may be doped with an impurity. The second plug 93 is coupled to the second impurity region 75. The second plug 93 may have a recessed height higher than a top surface of the bit line 81. In order to form the second plugs 93, an etch-back process may be performed after depositing a polysilicon layer.

As illustrated in FIG. 9N, the sacrificial spacers 86 are removed. Accordingly, spaces from which the sacrificial spacers 86 have been removed remain as air gaps 94. Wet etching may be used to remove the sacrificial spacers 86. For example, chemicals capable of selectively removing titanium nitride may be used. The chemicals may flow into the peripheries of the first plugs 80, thereby being capable of fully removing the sacrificial spacers 86. The chemicals do not damage the isolation layers 44 because the line-type first spacers 85 and the second spacers 87 block the isolation layers 44.

Each of the air gaps 94 includes a line-type air gap 94L and a plug-type air gap 94P. The line-type air gap 94L is formed between the first spacer 85 and the second spacer 87. The line-type air gaps 94L extend in parallel to the bit lines 81. The plug-type air gaps 94P are formed at the sidewalls of the first plug 80. The line-type air gap 94L and the plug-type air gap 94P are coupled together. The plug-type air gaps 94P are independently formed at both sidewalls of the first plug 80.

As described above, the air gaps 94, each including the line-type air gap 94L and the plug-type air gap 94P, are formed. Spacer structures including the first spacers 85, the line-type air gaps 94L, and the second spacers 87 are formed on both sidewalls of the bit line structure. Spacer structures including the first spacers 85, the plug-type air gaps 94P, and the second spacers 87 are formed on both sidewalls of the first plug 80. As a result, the spacer structures have an "N-Air-N(NAN)" structure because the first spacer 85 and the second spacer 87 include silicon nitride. The lower parts of the plug-type air gaps 94P are sealed by the first spacers 85 and the second spacers 87. The upper parts of the line-type air gaps 94L are externally exposed.

As illustrated in FIG. 9O, a capping layer 95 is formed. The capping layer 95 fills the upper parts of the air gaps 94. The capping layer 95 caps the upper parts of the line-type air gaps 94L. The capping layer 95 may include silicon oxide or silicon nitride or a combination of them. The lower part of the capping layer 95 may have a depth so that the height of the air gap 94 is sufficiently secured between the bit line 81 and the second plug 93. In order to form the capping layer 95, silicon nitride may be deposited on the entire surface so that the upper parts of the air gaps 94 are filled, and an etch-back process may then be performed. Although not illustrated, while forming the capping layer 95, the capping layer may be formed on the sidewalls of the second spacers 87 over the second plugs 93. In order to selectively fill only the upper parts of the air gaps 94, silicon nitride may be deposited by a method using poor step coverage. For example, silicon nitride may be deposited by a plasma chemical vapor deposition method. The capping layer 95 is not formed between the bit line 81 and the second plug 93 because the air gap 94 has a very narrow width.

In another embodiment, the following process may be performed in order to form the capping layer 95.

First, silicon oxide that covers the top surfaces and corners of the second plugs 93 is formed using an oxidation process, and first silicon nitride is then formed in a conformable way. The top surfaces of the second plugs 93 may be exposed by etching back the first silicon nitride and the silicon oxide. Next, second silicon nitride is formed, and an etch-back is then performed. Accordingly, a triple structure of the silicon oxide, the first silicon nitride, and the second silicon nitride of the capping layer 95 may be formed. The thickness of the capping layer 95 may be controlled in order to maximize an area in which the top surfaces of the second plugs 93 are exposed.

As illustrated in FIG. 9P, ohmic contact layers 96 are formed on the second plugs 93. The ohmic contact layer 96 may include metal silicide. The ohmic contact layer 96 is formed by a silicidation process. The ohmic contact layer 96 may include cobalt silicide. In the present embodiment, the ohmic contact layer 96 may include cobalt silicide of a "$CoSi_2$ phase".

If cobalt silicide of the $CoSi_2$ phase is formed as the ohmic contact layer 96, contact resistance may be improved and cobalt silicide of low resistance may be formed.

Third plugs 97 are formed on the ohmic contact layers 96. In order to form the third plugs 97, gap-filling and polishing using a fourth conductive layer (not illustrated) may be performed. The third plugs 97 are formed while filling the upper parts of the second openings 92 over the ohmic contact layers 96. The third plug 97 may include a metal-containing layer. The third plug 97 may include materials including tungsten. The third plug 97 may include a tungsten layer or a tungsten compound.

Each of the third plugs 97 has an extension part that partially overlaps with the bit line structure.

After the etch process for forming the third plugs 97, the first spacers 85, the second spacers 87, the capping layers 95, and the bit line hard masks 82 may be self-aligned with the edges of the third plugs 97 and etched to a specific depth. In this case, the amount of the capping layers 95 etched is controlled so that the line-type air gaps 94L are not exposed.

Although not illustrated, the memory element may be formed on each of the third plugs 97 (refer to FIG. 8A).

In accordance with the third embodiment, parasitic capacitance may be reduced because the line-type air gap 94L is formed between the second plug 93 and the bit line 81 and the plug-type air gap 94P is formed between the first plug 80 and the second plug 93. Accordingly, sensing margin can be improved because parasitic capacitance is reduced.

The semiconductor device in accordance with the aforementioned embodiments may be applied to a dynamic random access memory (DRAM), but is not limited thereto. For example, the semiconductor device may be applied to a memory, such as a static random access memory (SRAM), a flash memory, a ferroelectric random access memory (FeRAM), a magnetic random access memory (MRAM), and a phase change random access memory (PRAM).

This technology has an advantage in that parasitic capacitance may be reduced because the air gaps may be formed between the conductive structures.

This technology may improve contact resistance because an area in which the ohmic contact layer may be formed is wide.

This technology may improve resistance of the contact plug by increasing the volume of the metal plug occupied in the contact plug.

This technology may reduce parasitic capacitance because the air gap may be formed between the bit line and the SNC plug and also be formed between the bit line contact plug and the SNC plug. As a result, the operating speed of a memory cell may be improved.

Although various embodiments have been described for illustrative purposes, it will be apparent to those skilled in the art that various changes and modifications may be made without departing from the spirit and scope of the invention as defined in the following claims.

What is claimed is:

1. A semiconductor device, comprising:
   a substrate including a first recessed surface and a second recessed surface;
   an interlayer dielectric layer having a first opening exposing the first recessed surface;
   a first plug formed in the first opening and isolated by a pair of gaps from sidewalls of the first opening;
   a bit line configured to cover the first plug and extended in any one direction over the interlayer dielectric layer;
   a second opening through the interlayer dielectric layer to expose the second recessed surface;
   a second plug formed in the second opening and configured to comprise a lower part adjacent to the first plug and an upper part adjacent to the bit line;
   a first spacer formed between the bit line and the second plug and extending to be placed on both sidewalls of the first plug;
   a second spacer formed between the second plug and the first spacer and extending to be placed on both sidewalls of the first plug;
   a plug type air gap formed in the first opening and formed between the first spacer and the second spacer;
   a line type air gap formed between the first spacer and the second spacer and formed between the bit line and the upper part of the second plug;
   a capping spacer filled in an upper part of the line type air gap and is formed between the first spacer and the second spacer;
   a third plug formed over the second plug and vertically overlap with the capping spacer; and
   a plug isolation layer that includes a first portion adjacent to a side surface of the second plug and a side surface of the third plug and a second portion overlapping the capping spacer in the vertical direction,
   wherein a lower part of the plug type air gap has a bended shape to cover a bottom surface of the second spacer, and
   wherein a lower part of the first spacer has a bended shape to cover the lower part of the plug type air gap.

2. The semiconductor device of claim 1, wherein the line type air gap has a line type extended in parallel to the bit line, and the plug type air gap is separated by the first plug and placed within the first opening,
   wherein the line type air gap and the plug type air gap are coupled to each other.

3. The semiconductor device of claim 1, wherein the lower part of the plug type air gap is sealed by the first spacer and the second spacer.

4. The semiconductor device of claim 1, wherein the first spacer, the second spacer, and the capping spacer comprise silicon nitride.

5. The semiconductor device of claim 1, further comprising:
   an ohmic contact layer between the second plug and the third plug.

6. The semiconductor device of claim 1, wherein the third plug further comprises an extension part overlapped with an upper part of the bit line.

7. The semiconductor device of claim 1, further comprising a memory element formed over the third plug.

8. The semiconductor device of claim 1, further comprising a buried word line buried in the substrate and extended in a direction that intersects the bit line.

9. The semiconductor device of claim 1,
   wherein the bit line and the first plug have the same line width.

10. The semiconductor device of claim 1,
    wherein the second recessed surface has a V-shaped profile.

11. The semiconductor device of claim 10,
    wherein the first recessed surface is located at a lower level than the second recessed surface.

12. The semiconductor device of claim 11,
    wherein a bottom surface of the plug type air gap is located at a lower level than the second recessed surface and is located at higher level than the first recessed surface.

13. The semiconductor device of claim 1,
    wherein the plug type air gap is formed only in the pair of gaps.

14. The semiconductor device of claim 1, wherein the second spacer comprising:
    an upper portion disposed between the bit line and the upper part of the second plug; and
    a lower portion disposed between the first plug and the lower part of the second plug,
    wherein the lower portion of the second spacer is thicker than the upper portion of the second spacer.

15. The semiconductor device of claim 1, wherein the lower part of the plug type air gap is located at a higher level than a bottom surface of the first plug.

* * * * *